United States Patent
Lee et al.

(10) Patent No.: US 11,942,762 B2
(45) Date of Patent: Mar. 26, 2024

(54) SURFACE-EMITTING LASER DEVICE AND LIGHT EMITTING DEVICE INCLUDING THE SAME

(71) Applicant: SUZHOU LEKIN SEMICONDUCTOR CO., LTD., Taicang (CN)

(72) Inventors: Jeong Sik Lee, Seoul (KR); Sang Heon Han, Seoul (KR); Keun Uk Park, Seoul (KR); Yeo Jae Yoon, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 784 days.

(21) Appl. No.: 17/043,144

(22) PCT Filed: Apr. 4, 2019

(86) PCT No.: PCT/KR2019/003999
§ 371 (c)(1),
(2) Date: Sep. 29, 2020

(87) PCT Pub. No.: WO2019/194600
PCT Pub. Date: Oct. 10, 2019

(65) Prior Publication Data
US 2021/0028603 A1    Jan. 28, 2021

(30) Foreign Application Priority Data

Apr. 4, 2018 (KR) .................. 10-2018-0039085
Jun. 27, 2018 (KR) .................. 10-2018-0073795
Oct. 19, 2018 (KR) .................. 10-2018-0125167

(51) Int. Cl.
*H01S 5/183* (2006.01)

(52) U.S. Cl.
CPC ...... *H01S 5/18394* (2013.01); *H01S 5/18311* (2013.01); *H01S 5/18377* (2013.01)

(58) Field of Classification Search
CPC ............. H01S 5/18394; H01S 5/18311; H01S 5/18377; H01S 5/0234; H01S 5/04252;
(Continued)

(56) References Cited

U.S. PATENT DOCUMENTS 5,245,622 A * 9/1993 Jewell ................. H01S 5/18308
372/45.01
5,493,577 A * 2/1996 Choquette ........... H01S 5/18313
372/99

(Continued)

FOREIGN PATENT DOCUMENTS

JP    2002-353568 A    12/2002
JP    2004-356438 A    12/2004
(Continued)

OTHER PUBLICATIONS

International Search Report dated Jul. 19, 2019 issued in Application No. PCT/KR2019/003999.

*Primary Examiner* — Vu A Vu
(74) *Attorney, Agent, or Firm* — Birch, Stewart, Kolasch & Birch, LLP

(57) ABSTRACT

A surface-emitting laser device according to an embodiment comprises: a first electrode; a substrate arranged on the first electrode; a first reflection layer arranged on the substrate; an active region arranged on the first reflection layer and including a cavity; an opening region arranged on the active region and including an aperture and an insulation region; a second reflection layer arranged on the opening region; a second electrode arranged on the second reflection layer; and a delta doping layer arranged in the opening region. The thickness of the insulation region becomes thinner in the (Continued)

direction of the aperture, and the delta doping layer can be arranged at the aperture.

14 Claims, 35 Drawing Sheets

(58) Field of Classification Search
CPC ............. H01S 5/04254; H01S 5/04257; H01S 5/18333; H01S 5/18361; H01S 5/18347; H01S 5/18358; H01S 5/3054; H01S 2301/176; H01S 2301/18; H01S 5/307
USPC .................................................. 372/50.124
See application file for complete search history.

(56) References Cited

U.S. PATENT DOCUMENTS

| | | | | |
|---|---|---|---|---|
| 5,574,738 A * | 11/1996 | Morgan | ................. | H01S 5/183 372/28 |
| 6,618,414 B1 * | 9/2003 | Wasserbauer | ....... | H01S 5/18358 438/22 |
| 6,639,927 B2 * | 10/2003 | Sato | .................... | H01S 5/18305 372/36 |
| 6,751,245 B1 * | 6/2004 | Wasserbauer | ....... | H01S 5/18341 372/96 |
| 6,782,032 B2 | 8/2004 | Kondow et al. | | |
| 6,798,806 B1 * | 9/2004 | Johnson | .............. | H01S 5/18341 372/96 |
| 6,876,687 B2 * | 4/2005 | Zhu | ..................... | H01S 5/18316 372/45.01 |
| 6,898,215 B2 | 5/2005 | Naone et al. | | |
| 6,904,072 B2 * | 6/2005 | Cox | ..................... | H01S 5/18333 372/45.01 |
| 7,020,173 B2 * | 3/2006 | Yamamoto | ........... | H01S 5/18311 372/45.01 |
| 7,061,955 B2 * | 6/2006 | Kim | ................... | H01L 31/03046 257/E31.022 |
| 7,099,363 B2 * | 8/2006 | Otsubo | ................... | B82Y 20/00 372/46.013 |
| 7,564,887 B2 * | 7/2009 | Wang | ................... | H01S 5/18327 372/92 |
| 7,684,453 B2 * | 3/2010 | Watanabe | ........... | H01S 5/04254 372/50.23 |
| 7,856,041 B2 | 12/2010 | Johnson | | |
| 7,881,354 B2 * | 2/2011 | Yoshikawa | ......... | H01S 5/18394 372/44.01 |
| 8,254,424 B2 | 8/2012 | Johnson | | |
| 10,020,638 B2 * | 7/2018 | Yoshida | .............. | H01S 5/02253 |
| 2004/0096996 A1 | 5/2004 | Cheng et al. | | |
| 2004/0208216 A1 | 10/2004 | Naone et al. | | |
| 2004/0213311 A1 | 10/2004 | Johnson et al. | | |
| 2008/0137692 A1 | 6/2008 | Park et al. | | |
| 2009/0201963 A1 | 8/2009 | Yoshikawa et al. | | |
| 2009/0262765 A1 | 10/2009 | Chang et al. | | |
| 2010/0232465 A1 | 9/2010 | Tsukiji et al. | | |
| 2012/0236891 A1 | 9/2012 | Johnson et al. | | |

FOREIGN PATENT DOCUMENTS

| | | |
|---|---|---|
| JP | 5802768 | 11/2015 |
| JP | 2016-46453 A | 4/2018 |
| KR | 10-0475848 B | 3/2005 |
| KR | 10-2009-0087817 | 8/2009 |
| KR | 10-0918400 | 9/2009 |
| KR | 10-2018-0015630 A | 2/2018 |

* cited by examiner

[FIG. 1A]
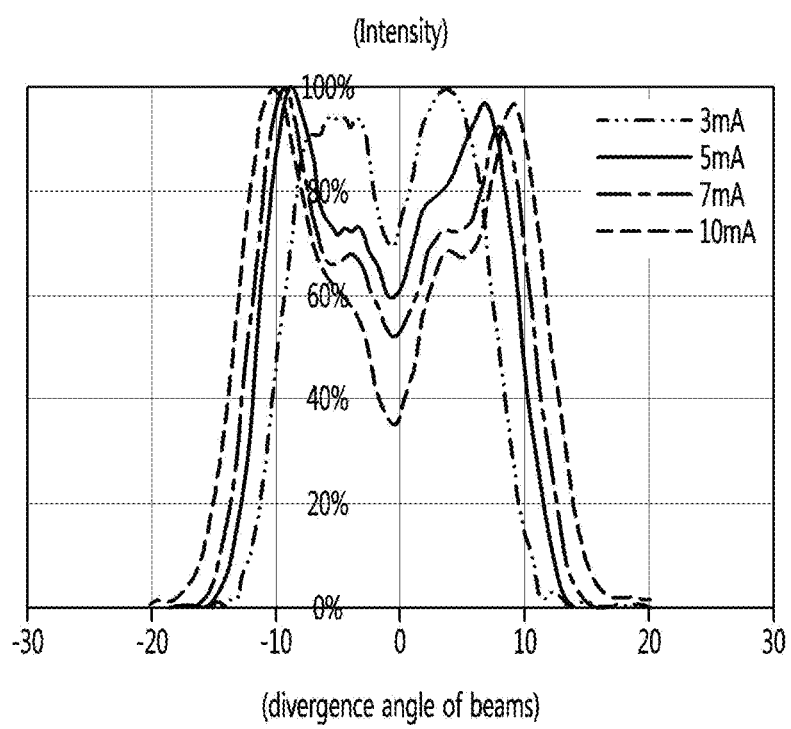

[FIG. 1B]
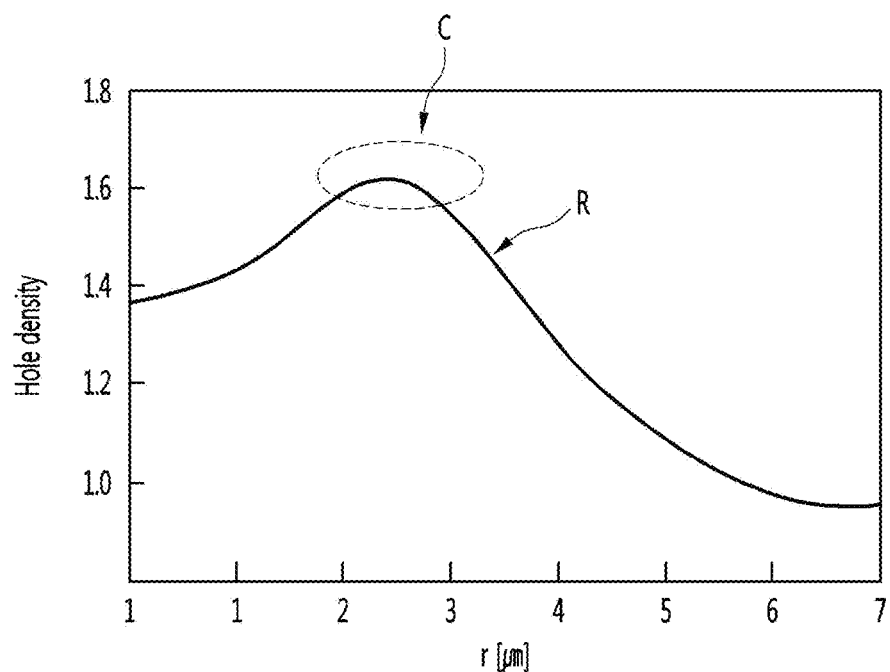
[FIG. 2]
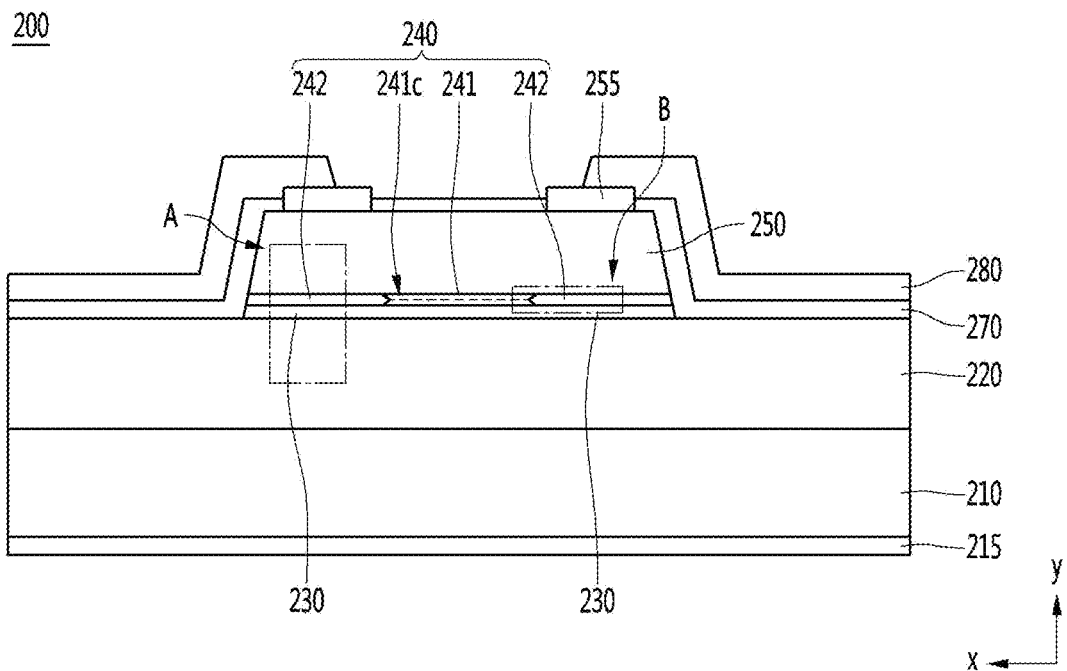

[FIG. 3]
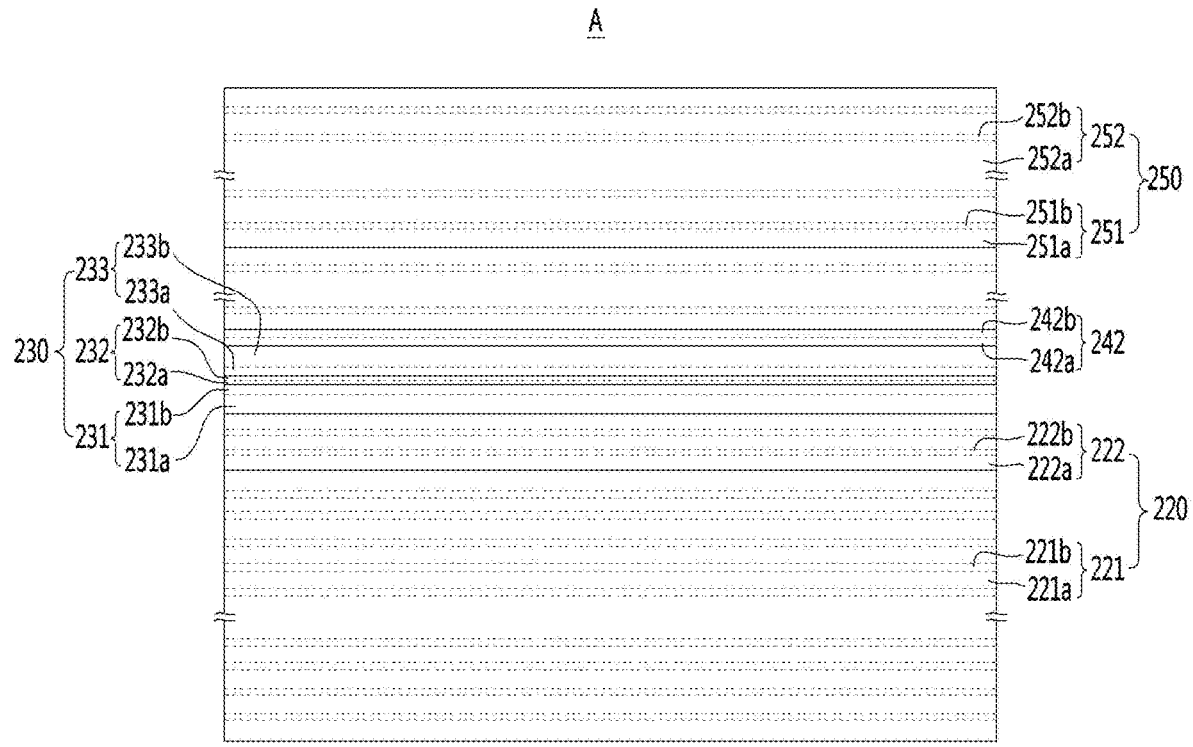
[FIG. 4A]
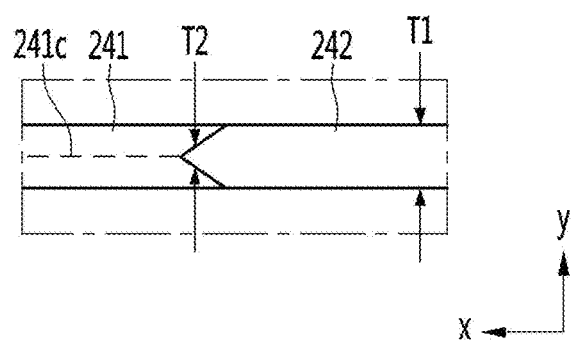

[FIG. 4B]
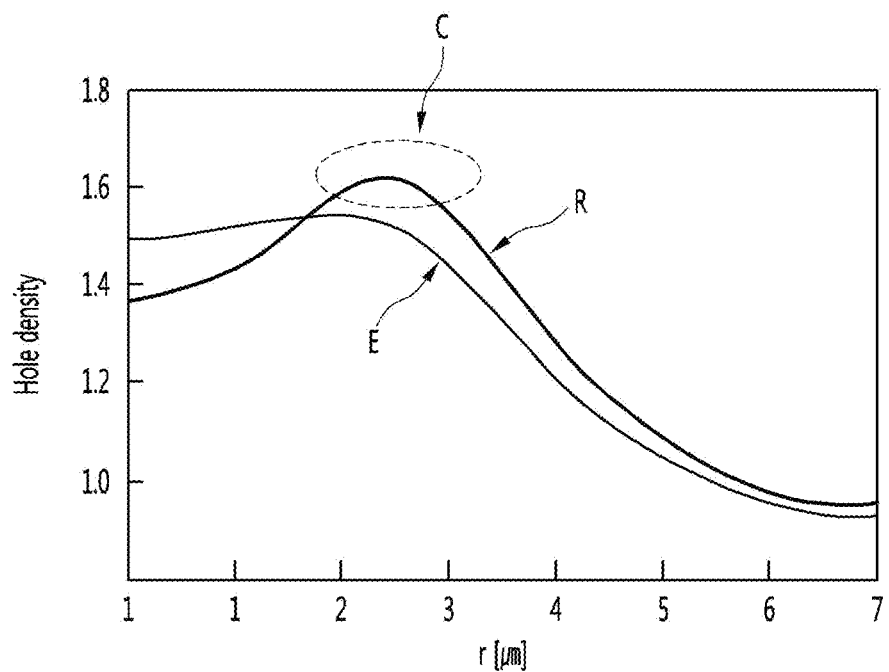
[FIG. 4C]
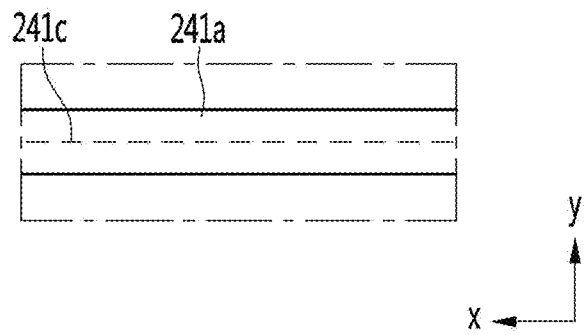

[FIG. 5]
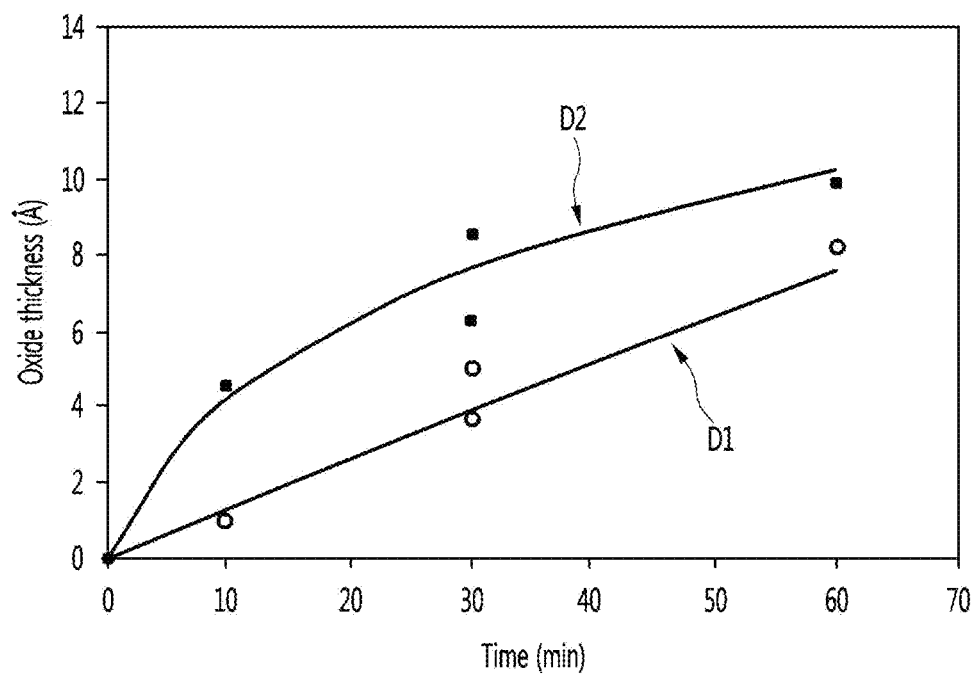

[FIG. 6A]
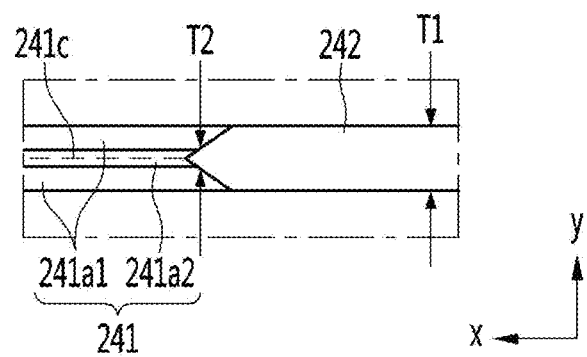
[FIG. 6B]
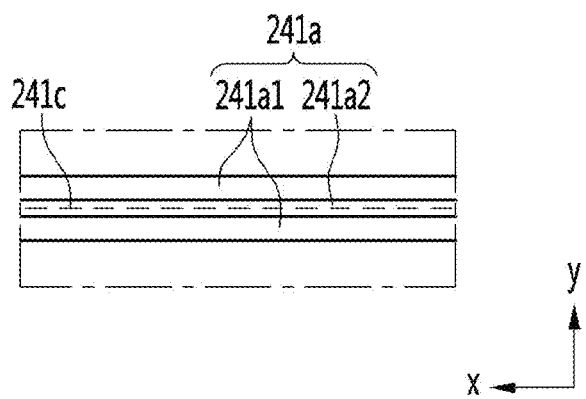
[FIG. 7A]
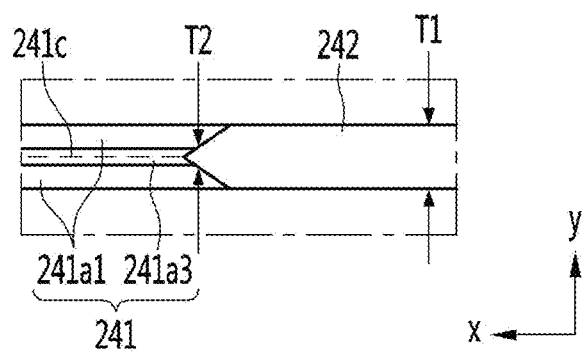

[FIG. 7B]
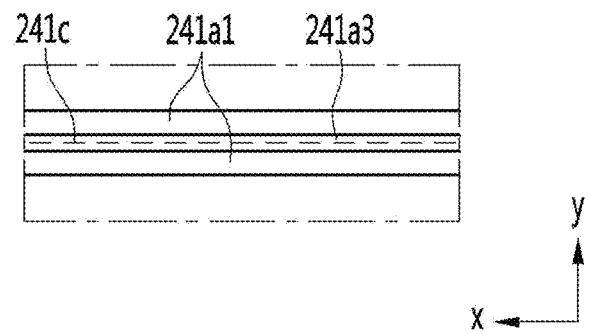
[FIG. 7C]
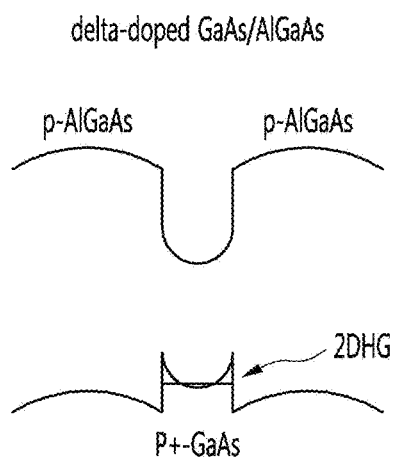
[FIG. 8A]
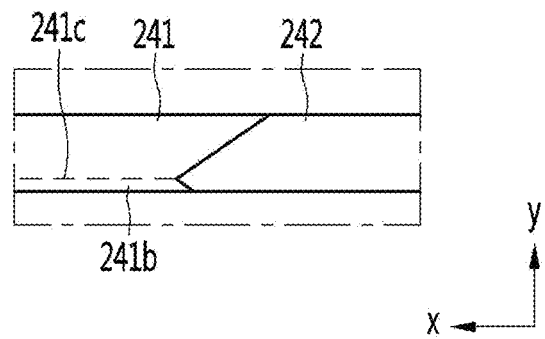

[FIG. 8B]
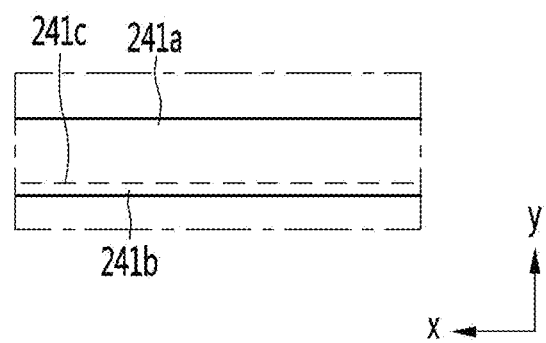
[FIG. 9A]
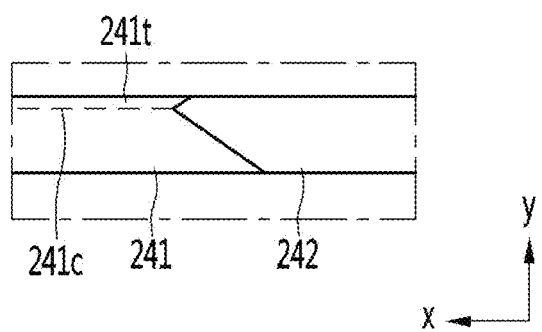
[FIG. 9B]
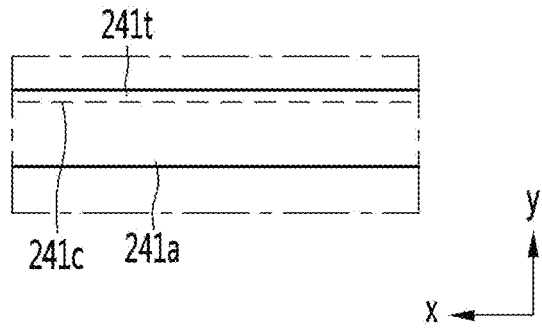

[FIG. 10]
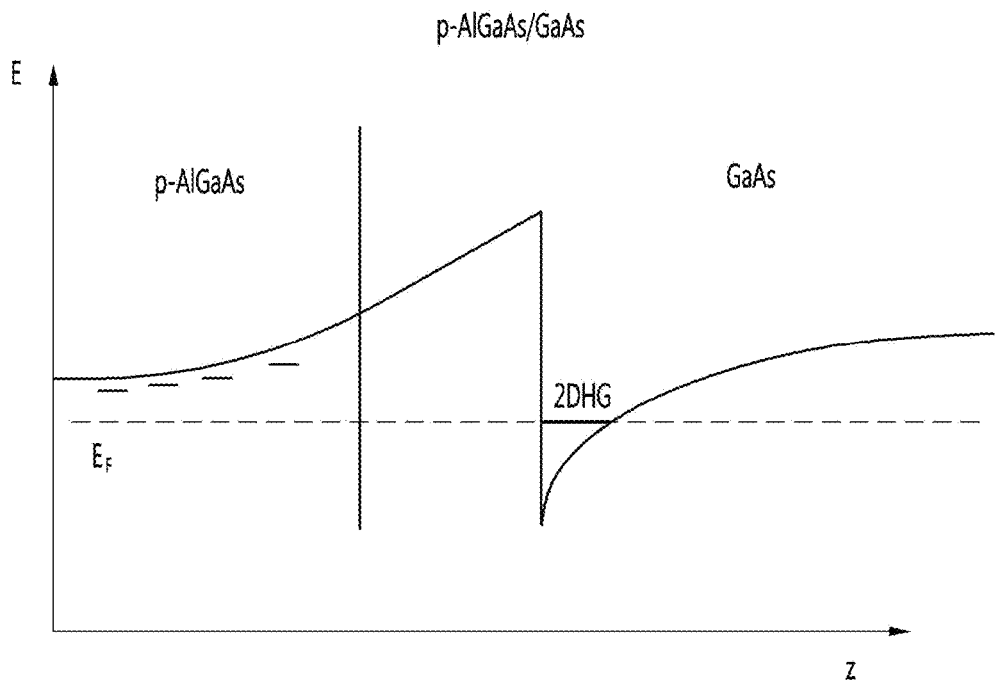
[FIG. 11A]
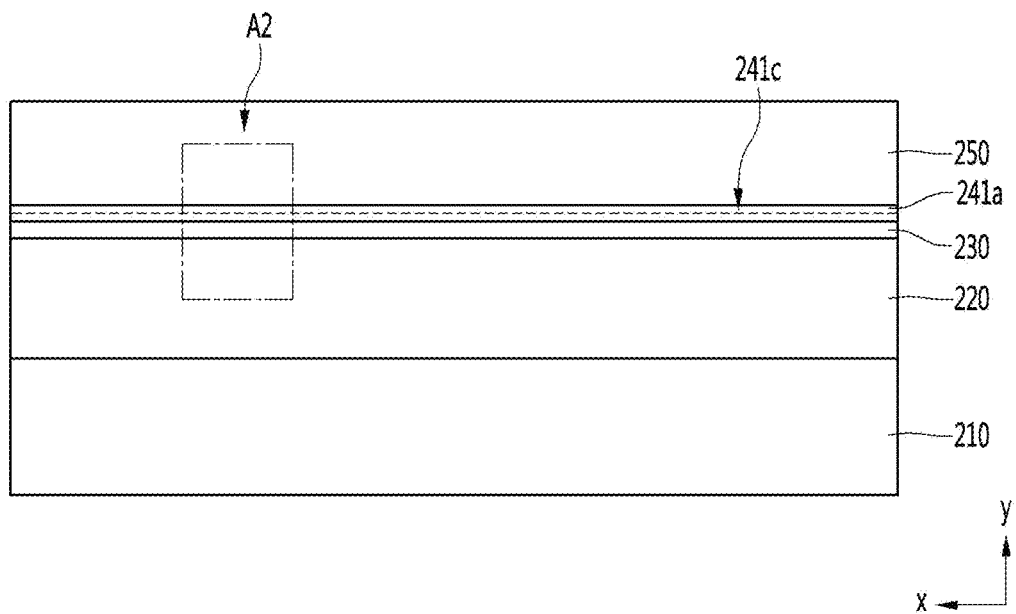

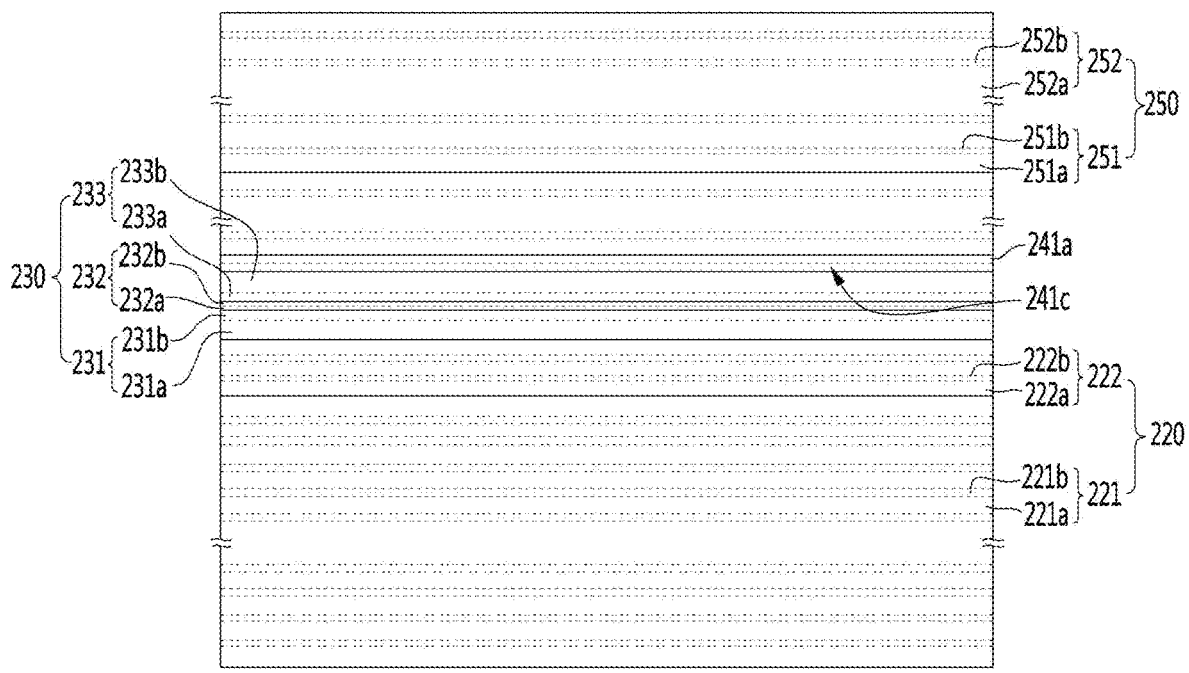
[FIG. 11B]

[FIG. 12]
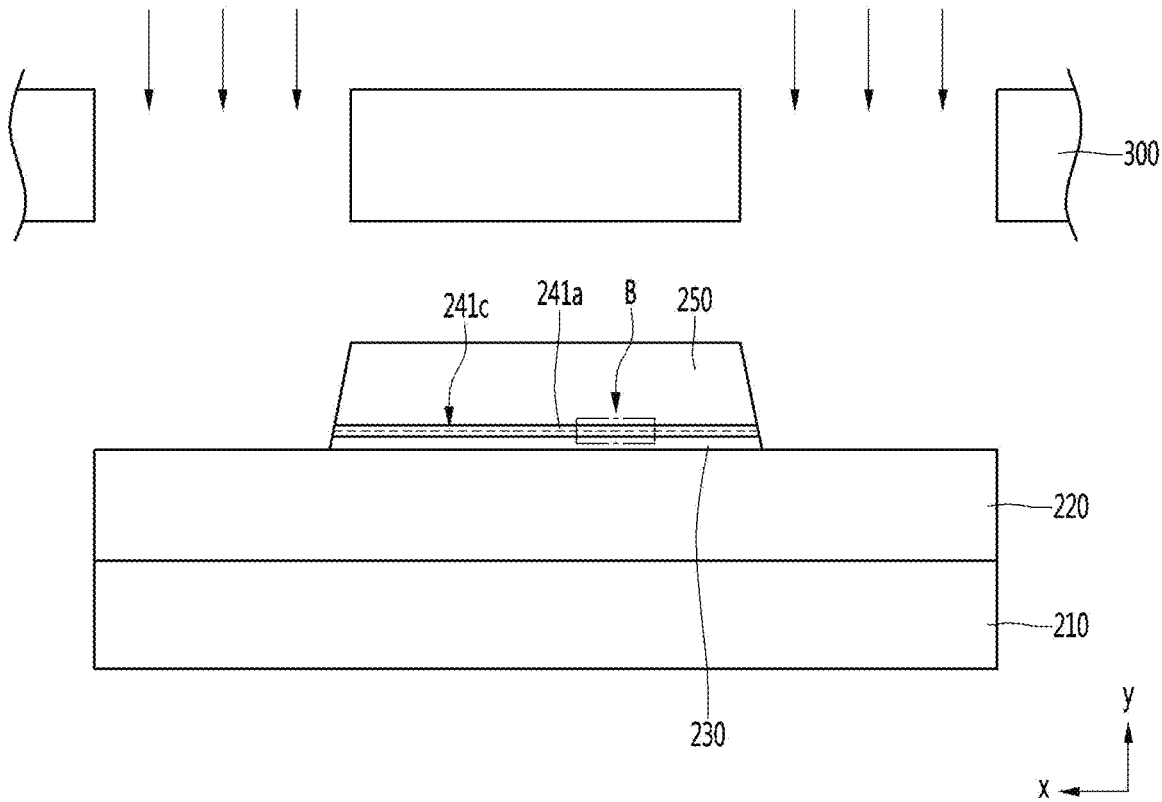
[FIG. 13A]
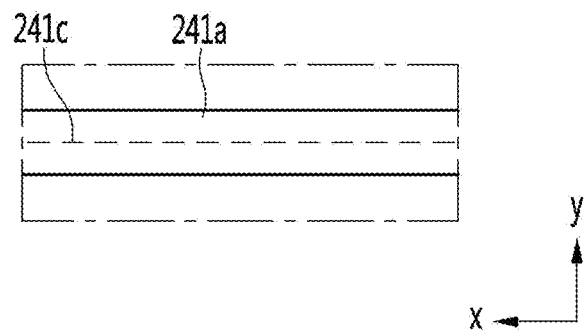

[FIG. 13B]
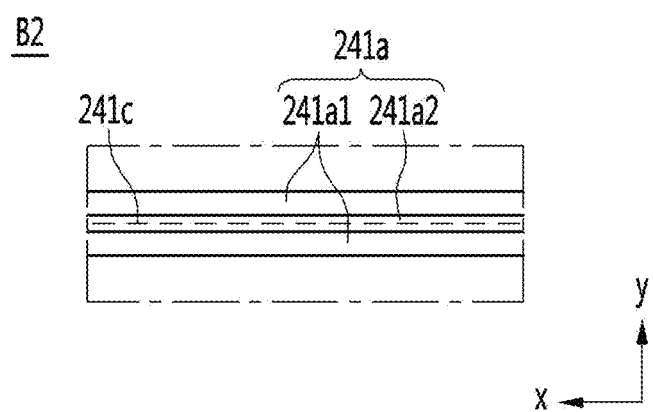
[FIG. 13C]
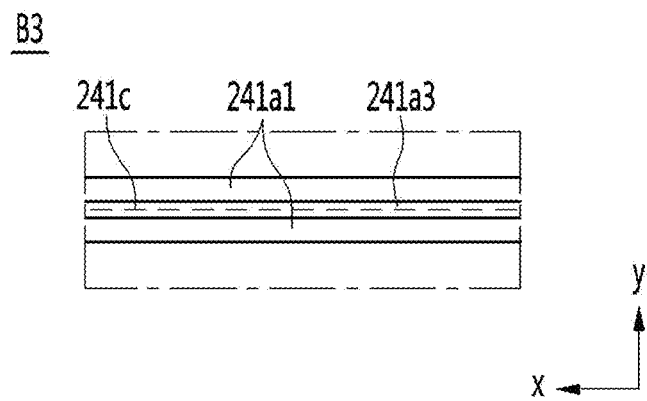

[FIG. 13D]
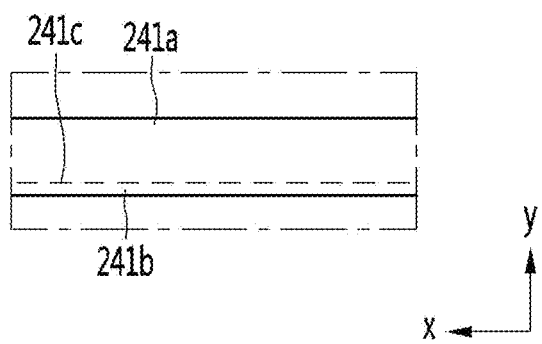
[FIG. 13E]
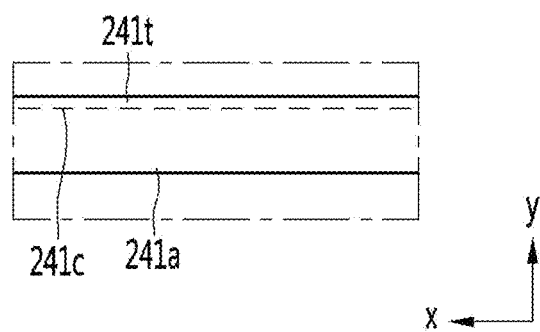

[FIG. 14]
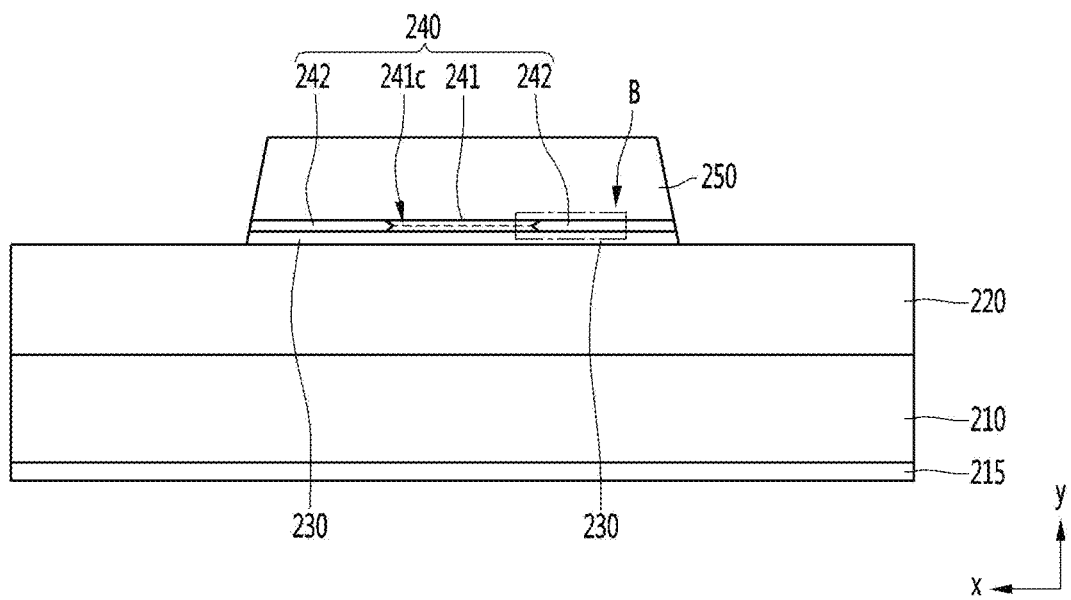
[FIG. 15A]
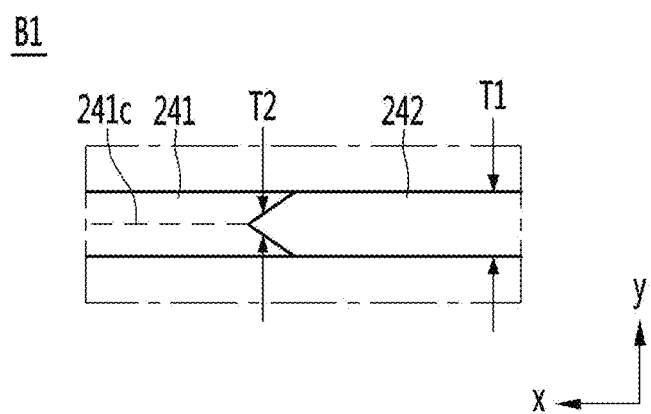

[FIG. 15B]
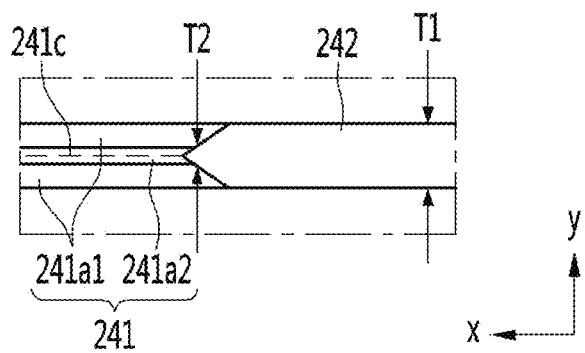
[FIG. 15C]
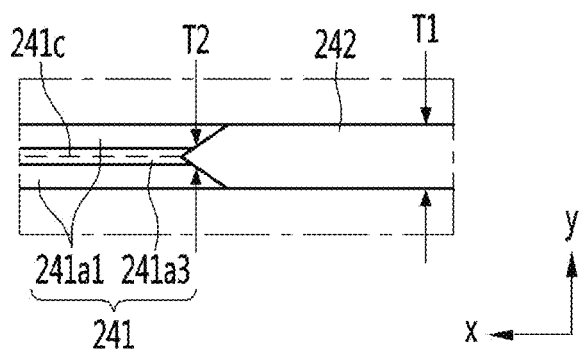

[FIG. 15D]
B4
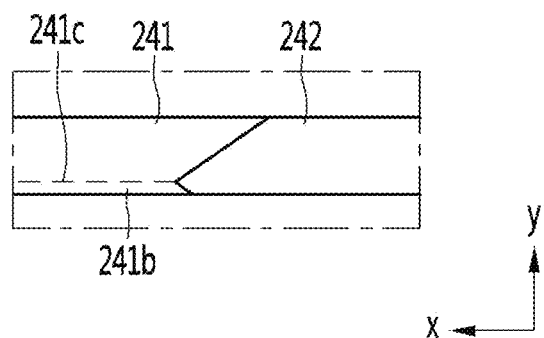
[FIG. 15E]
B5
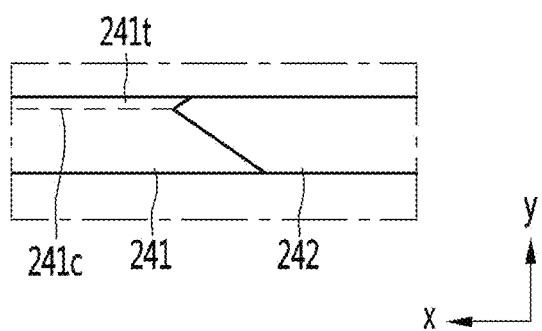

[FIG. 16]
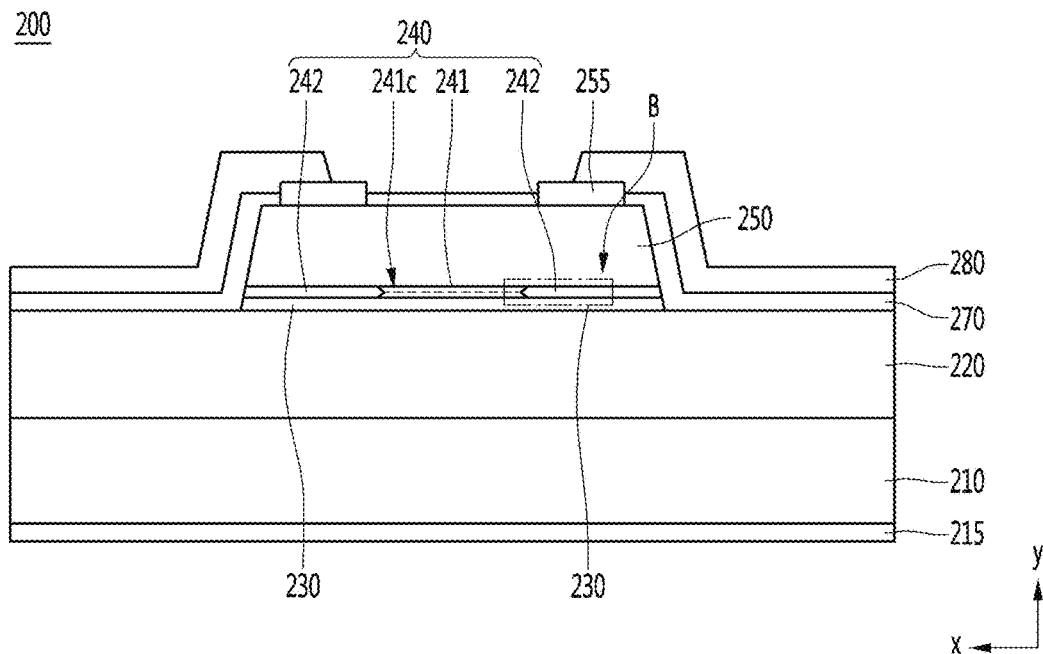
[FIG. 17]
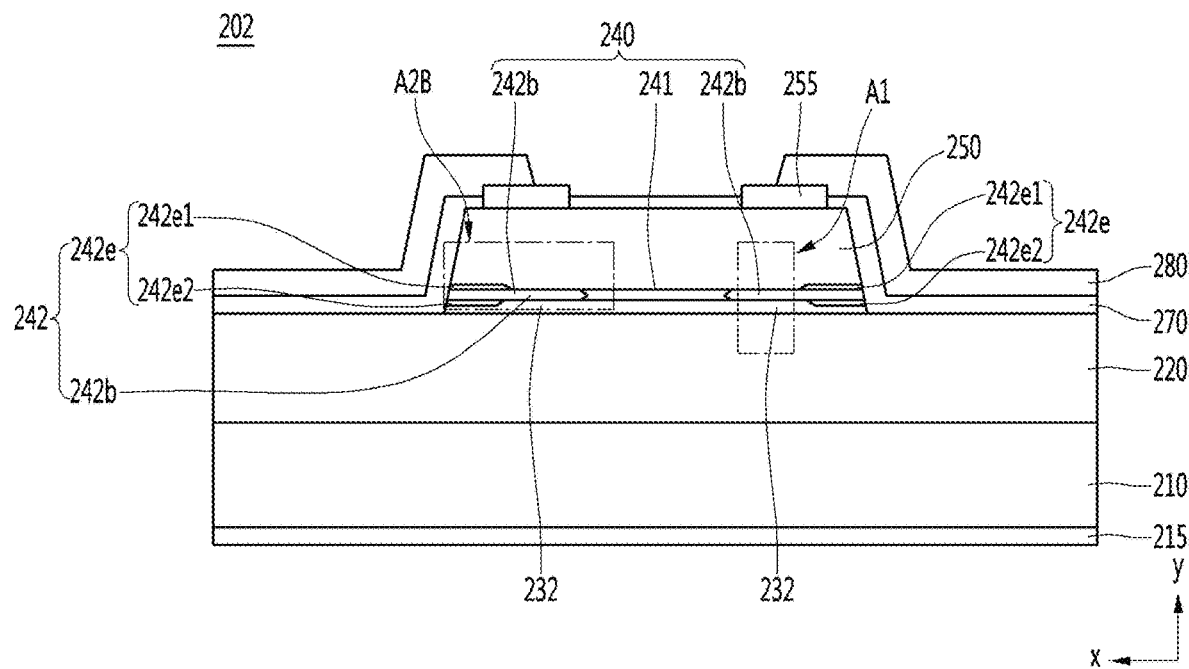

[FIG. 18]
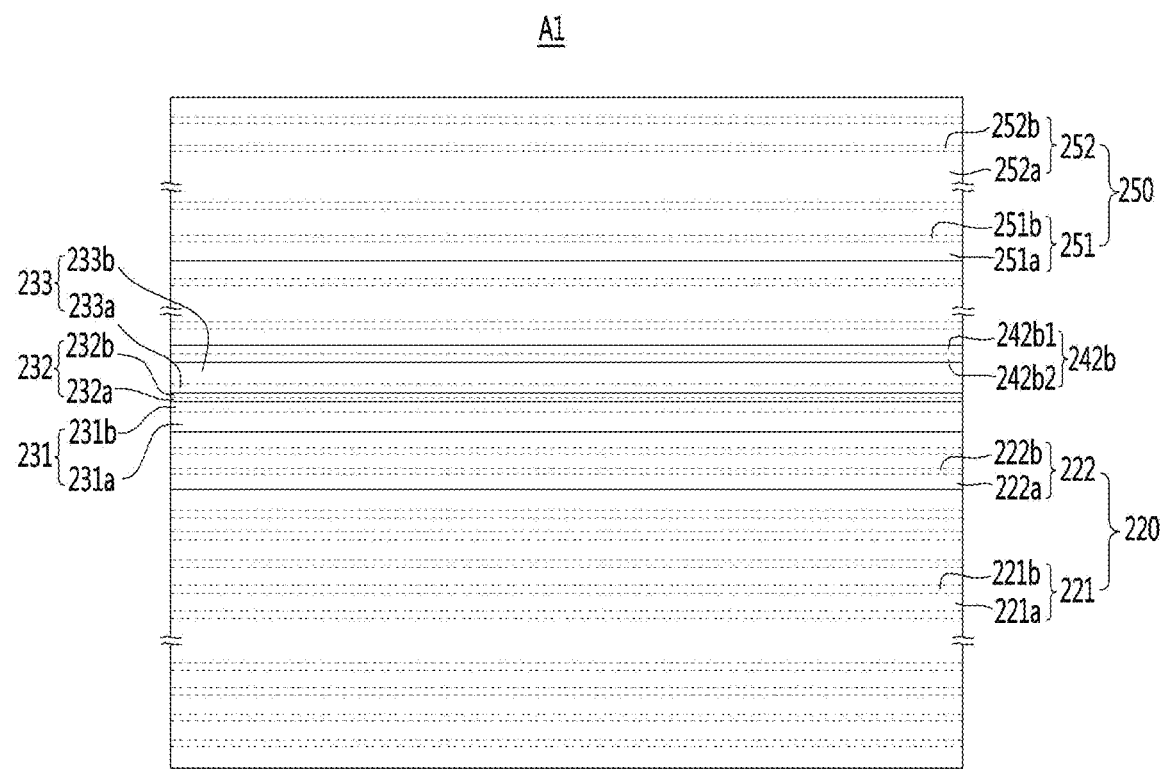

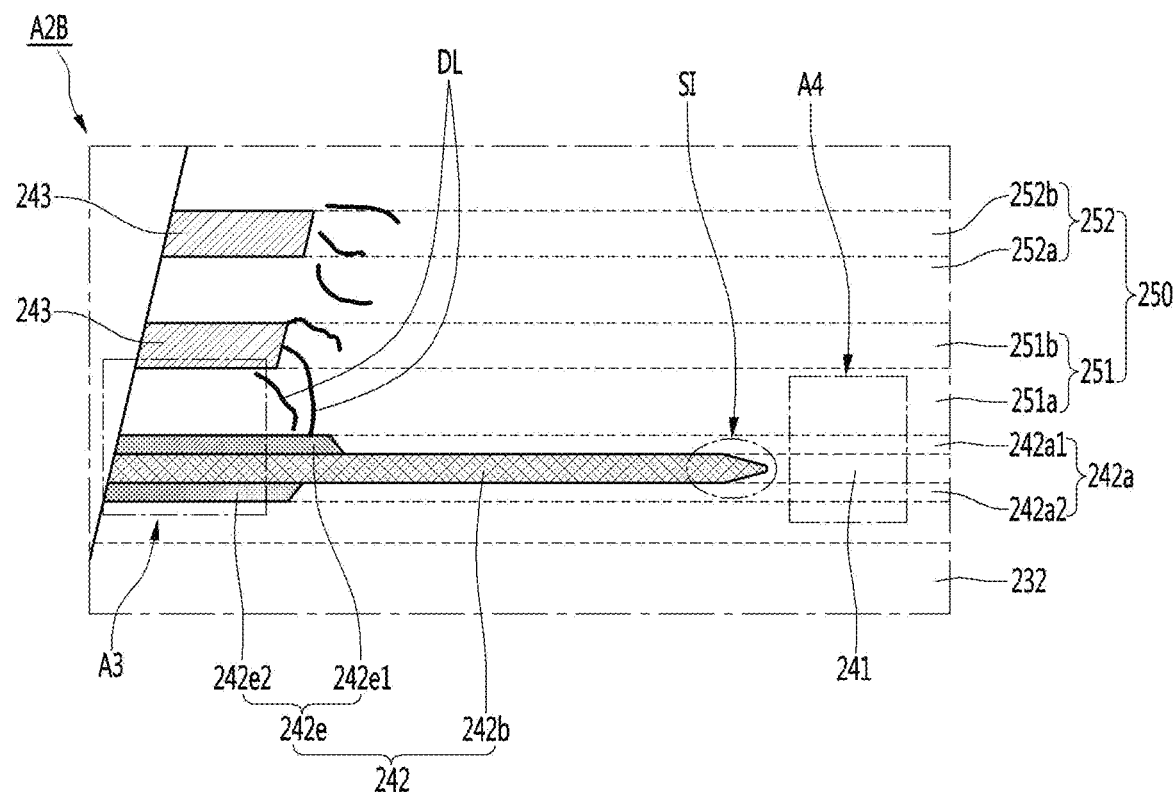

[FIG. 19B]
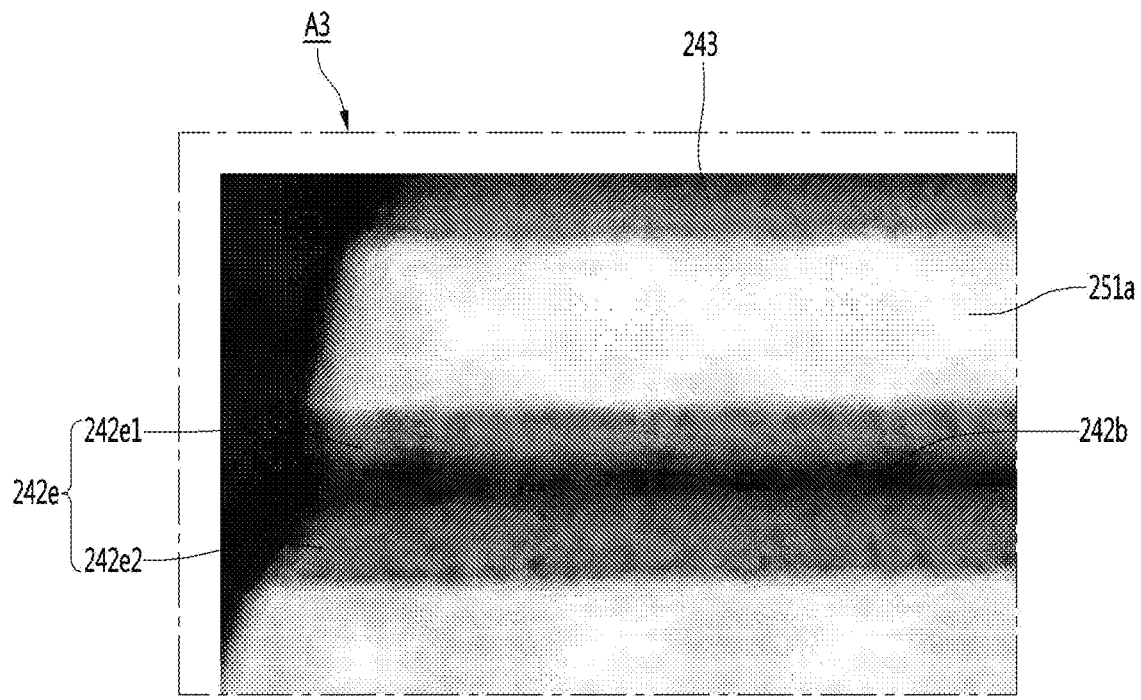
[FIG. 20]
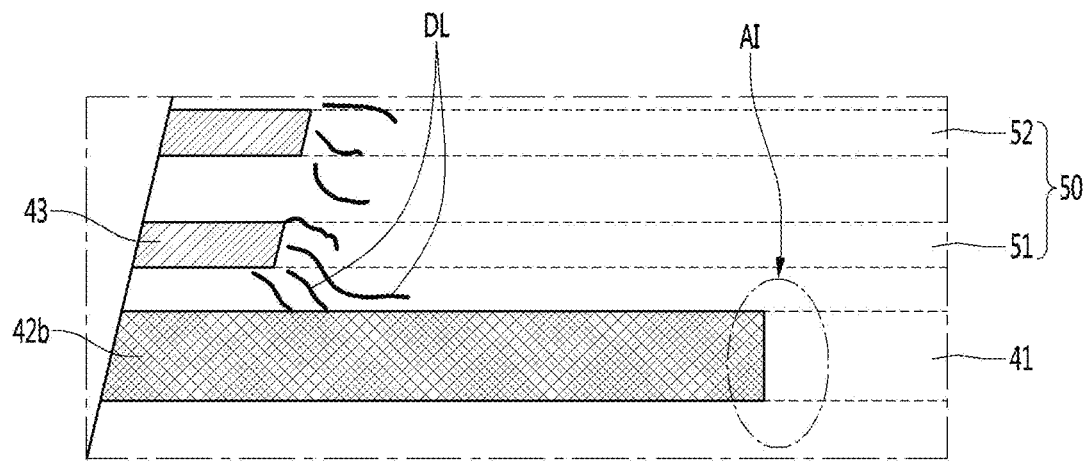

[FIG. 21A]
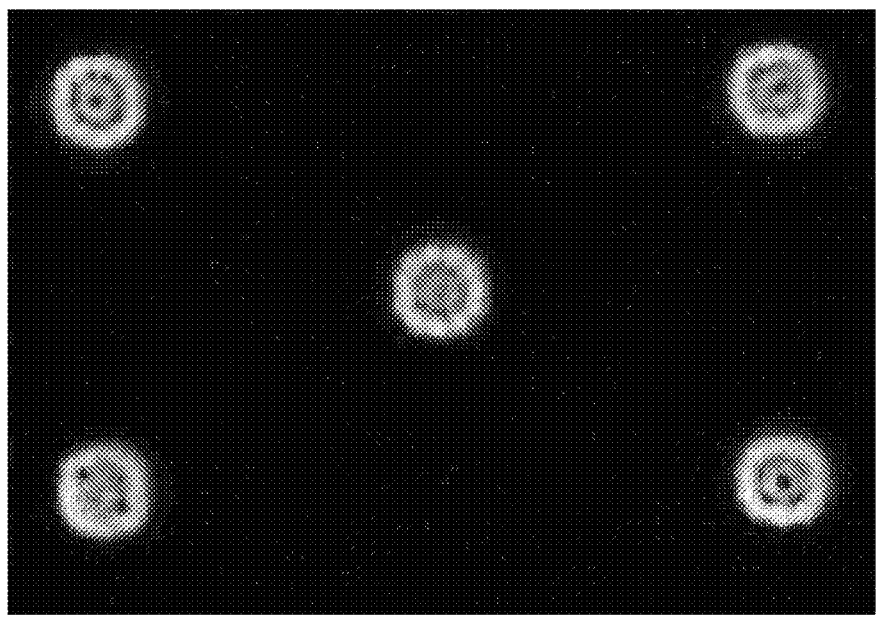

[FIG. 21B]
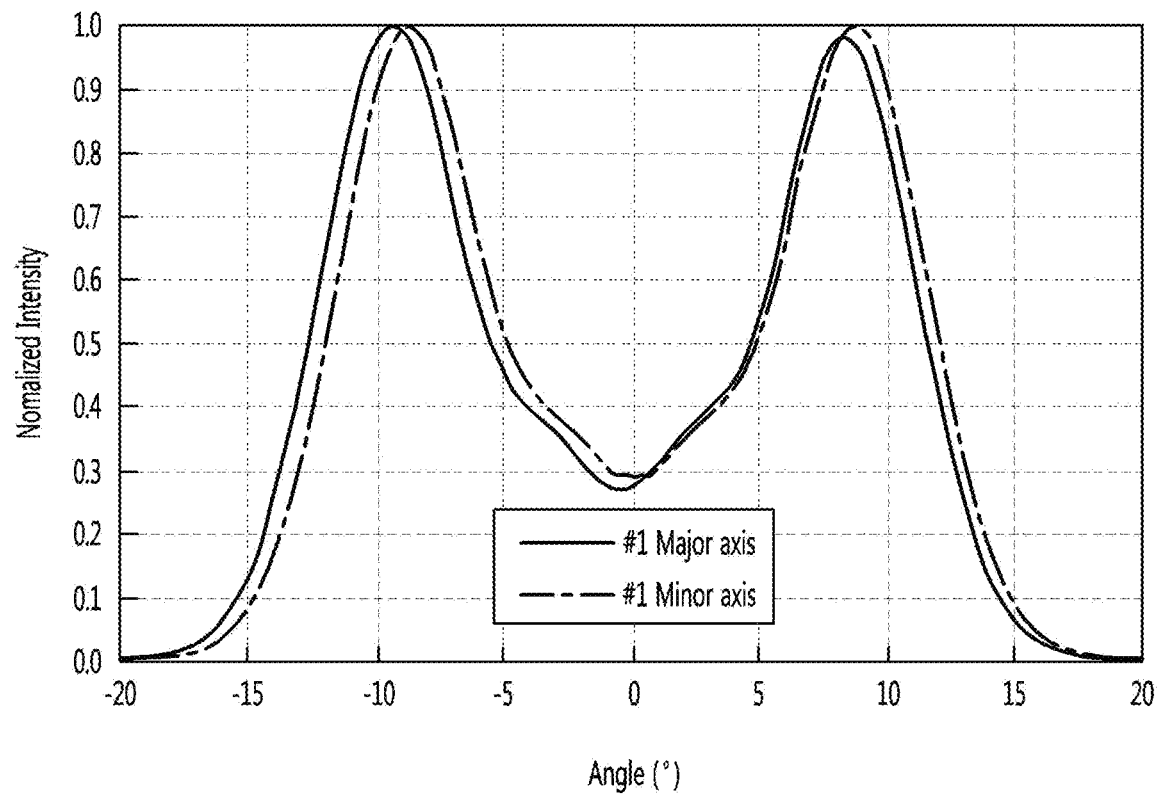

[FIG. 22A]
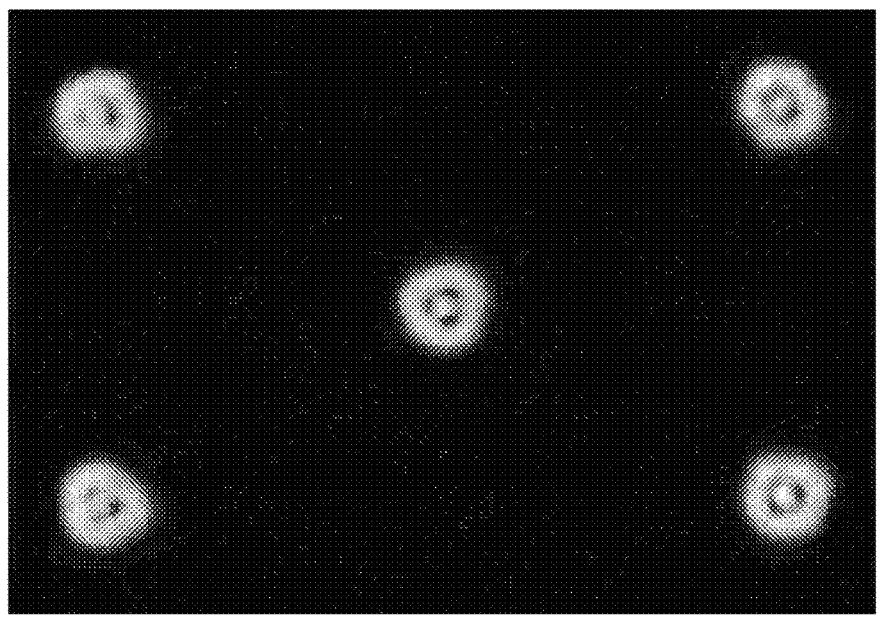

[FIG. 22B]
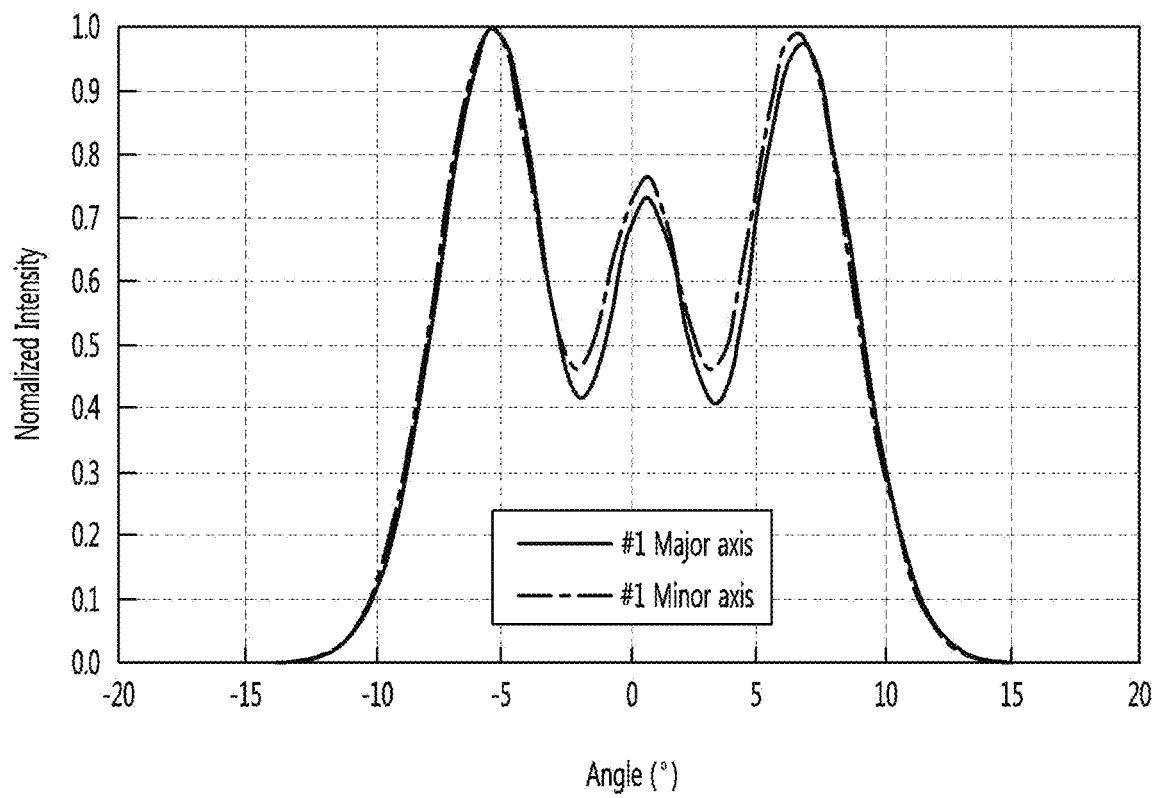

[FIG. 23]
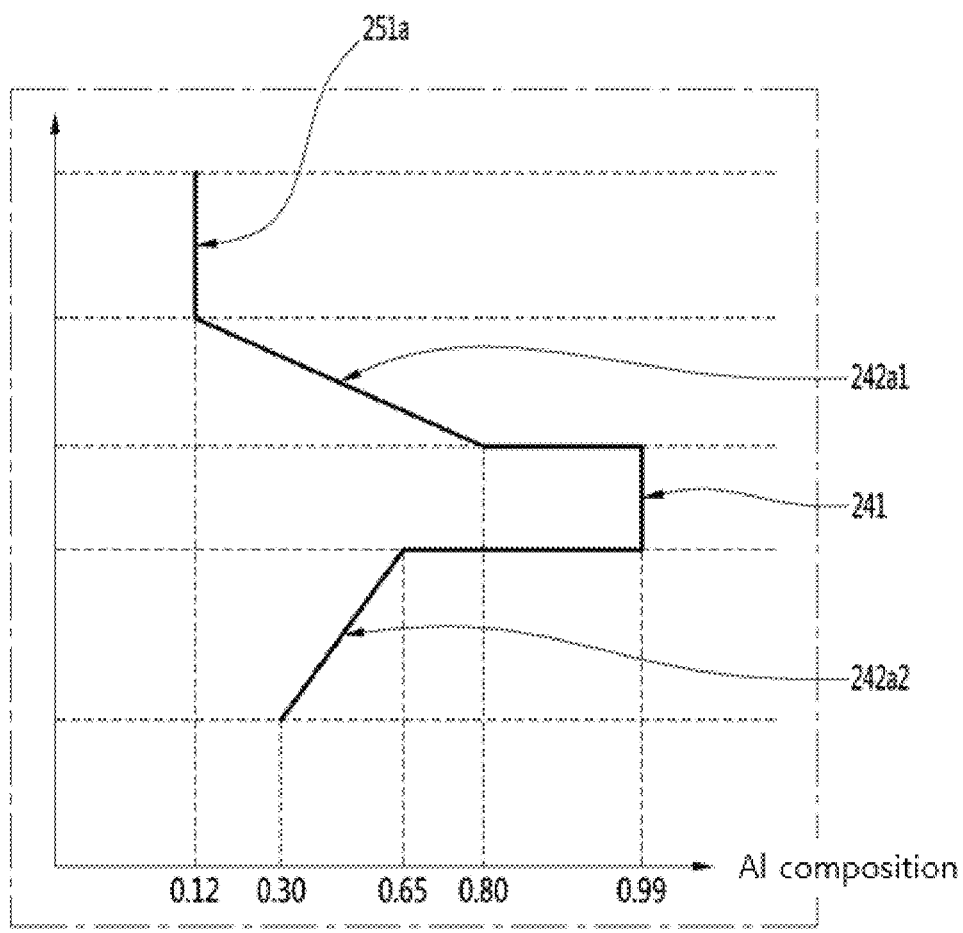

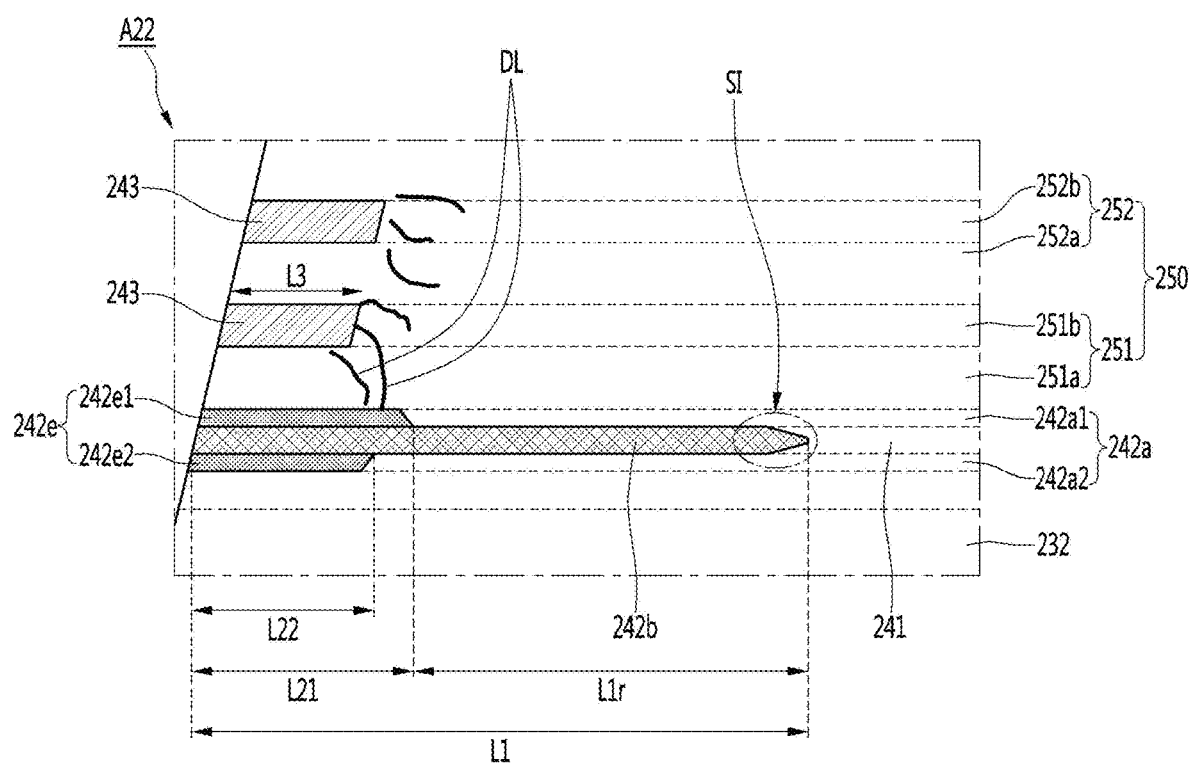
[FIG. 24]

[FIG. 25]
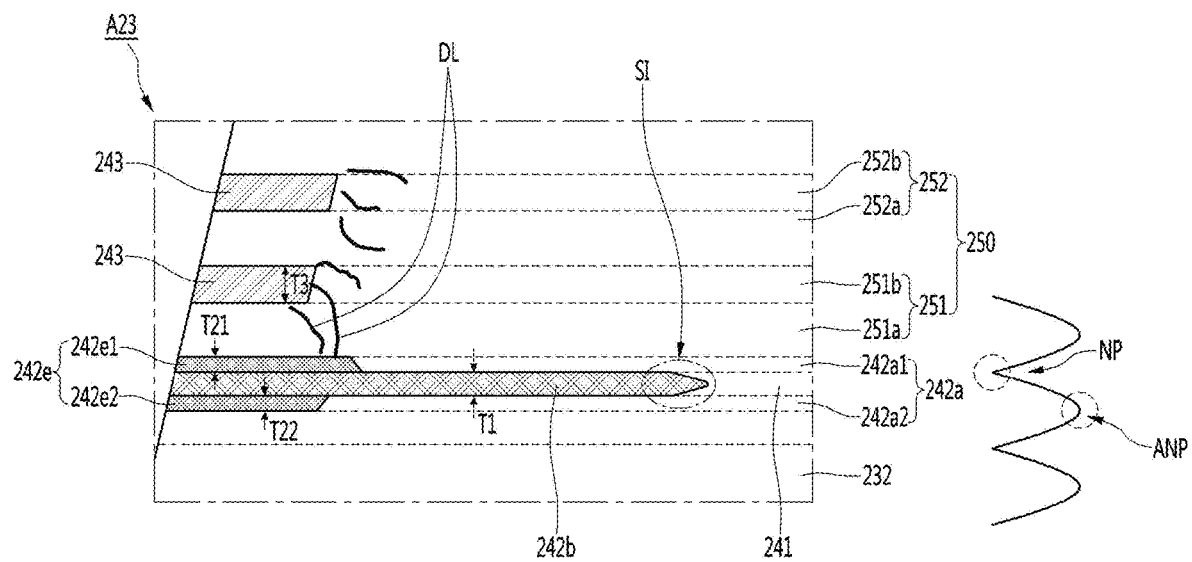
[FIG. 26]
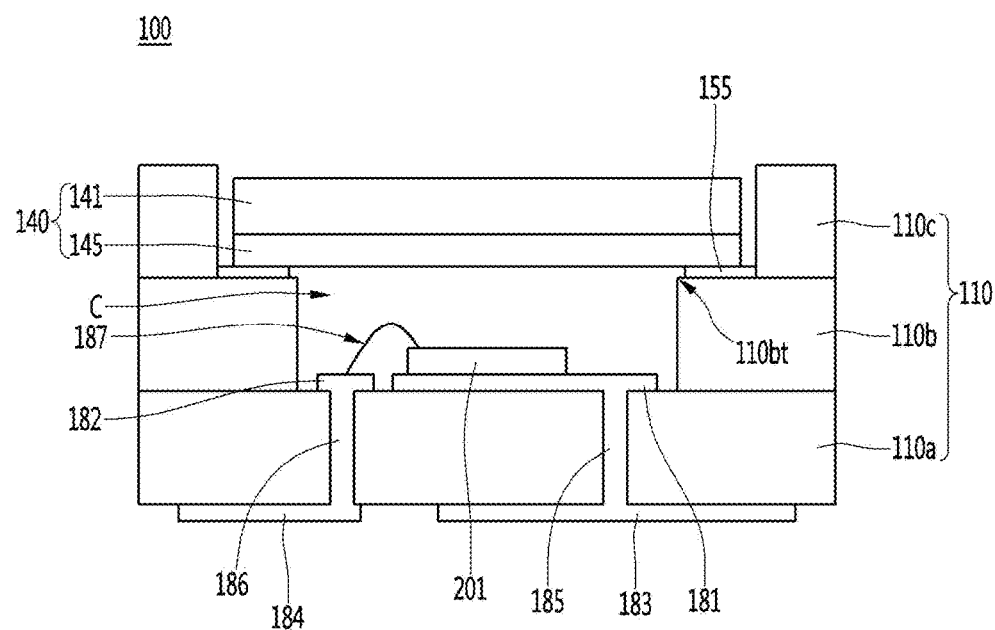

[FIG. 27]
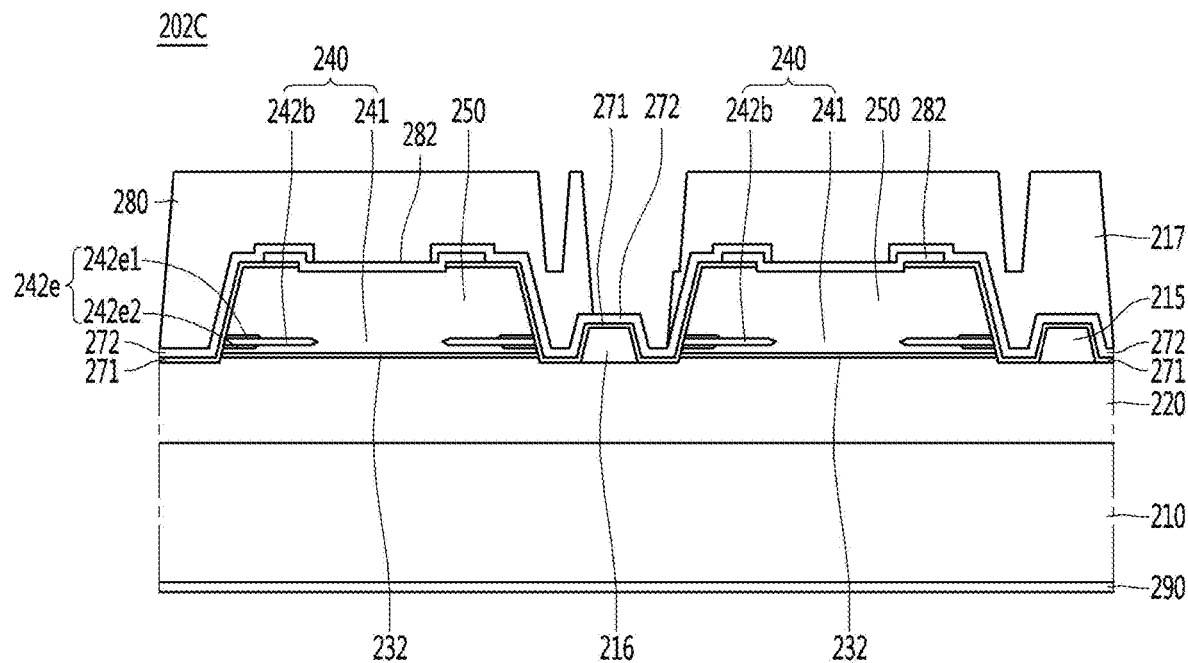
[FIG. 28]
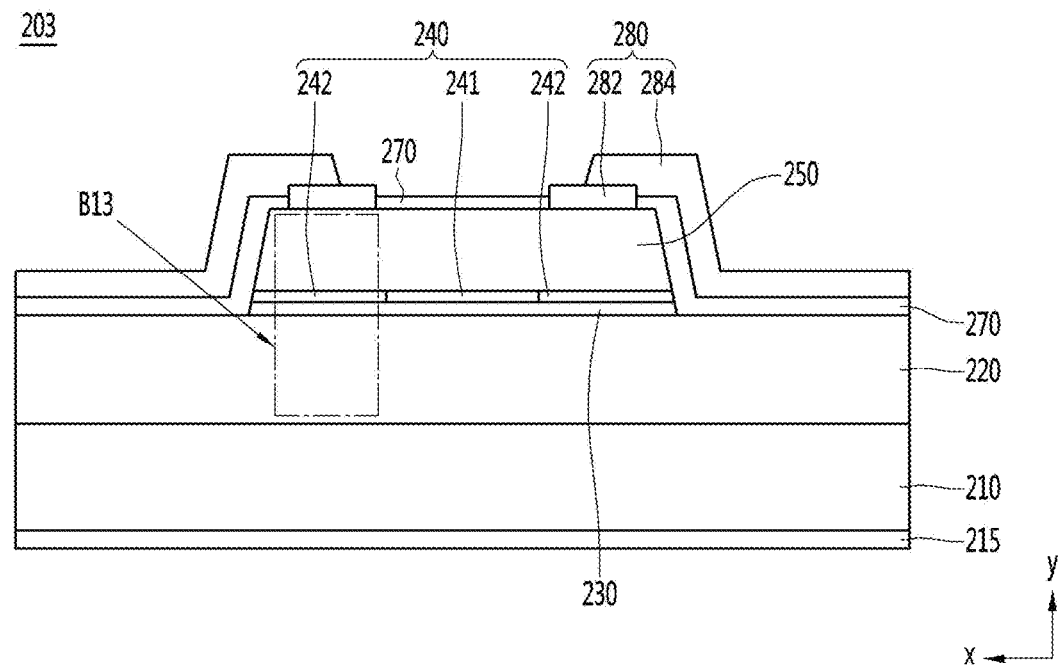

[FIG. 29]
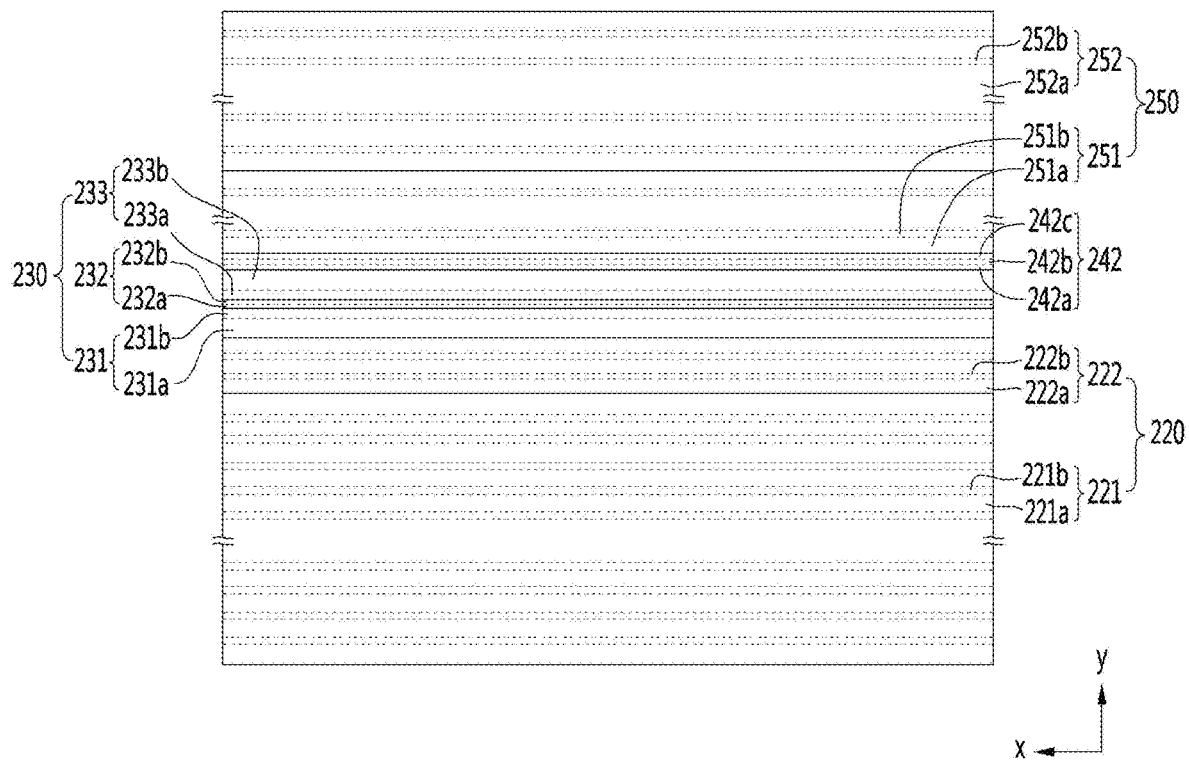

[FIG. 30]
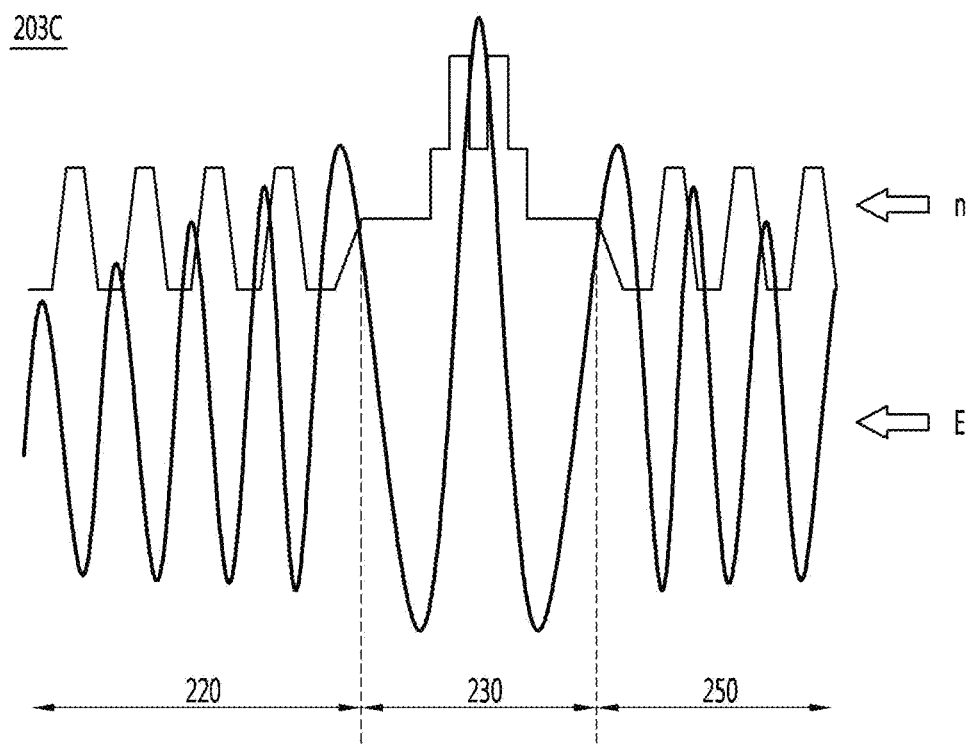
[FIG. 31]
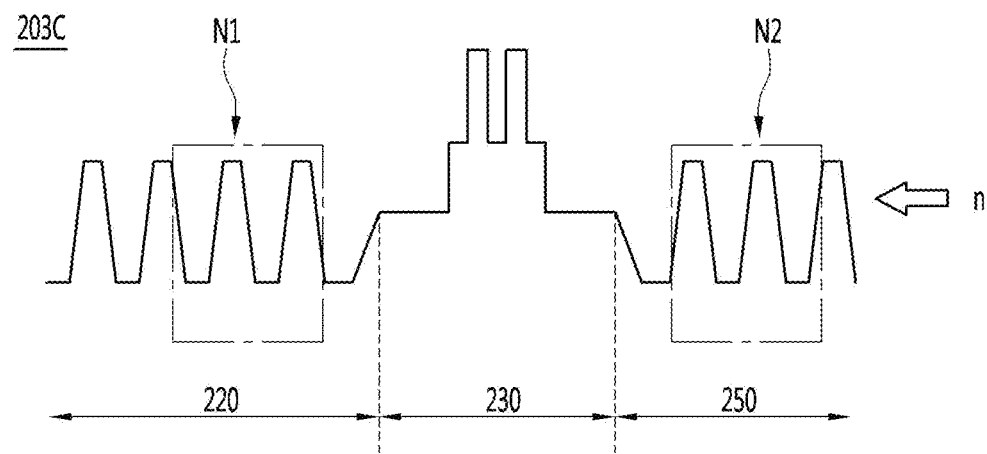

[FIG. 32]
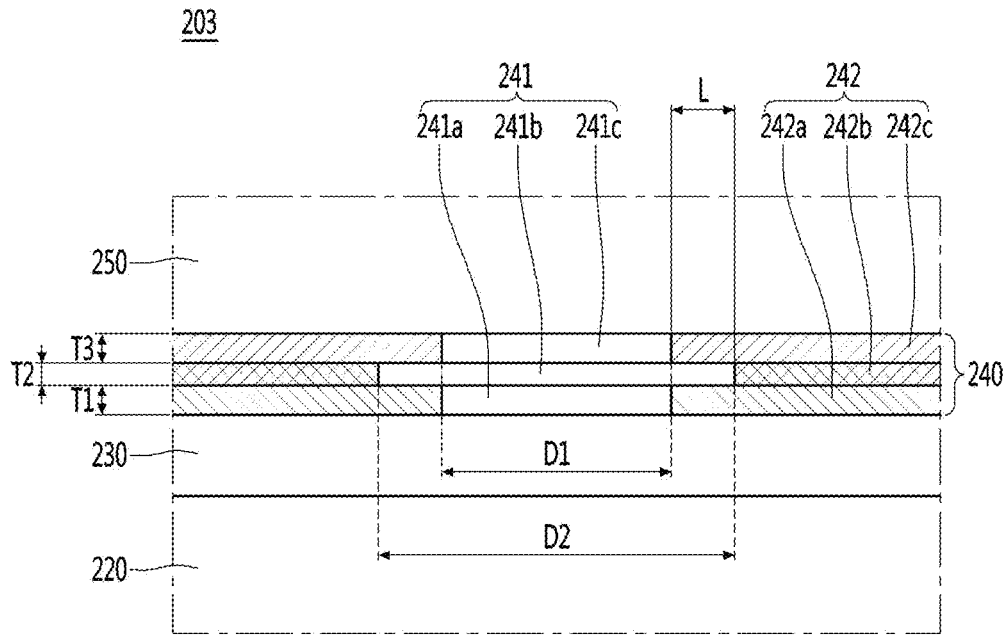
[FIG. 33A]    [FIG. 33B]
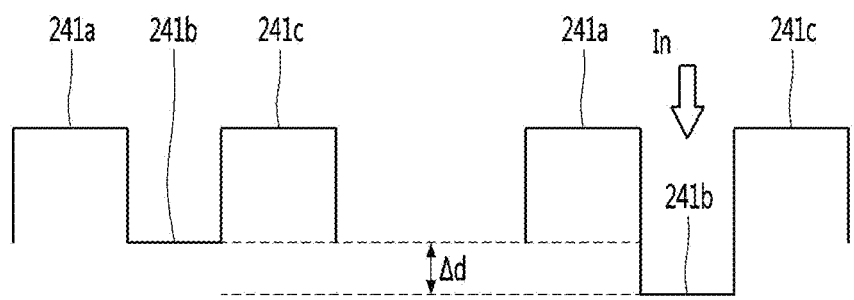

[FIG. 34]
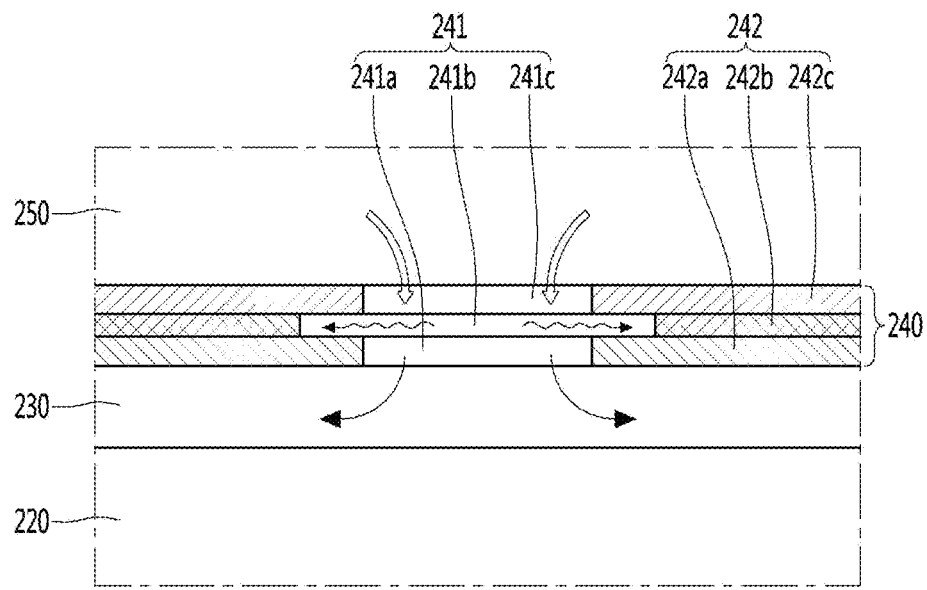
[FIG. 35]
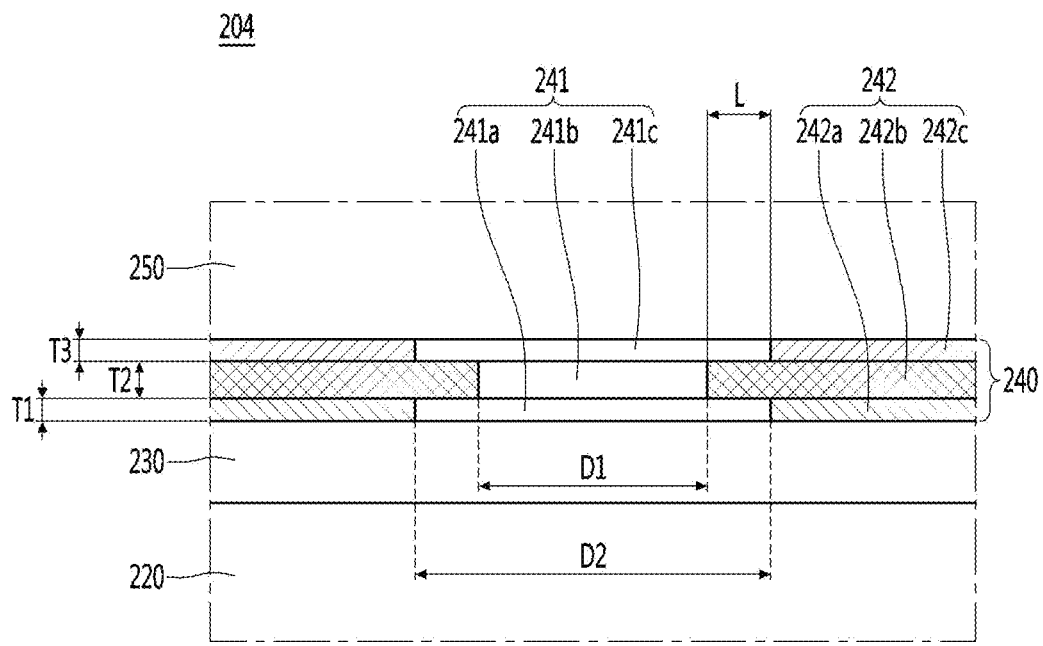

[FIG. 36A]
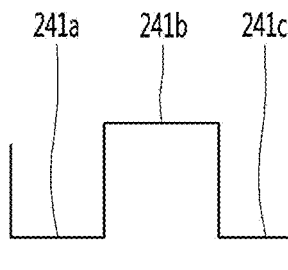
[FIG. 36B]
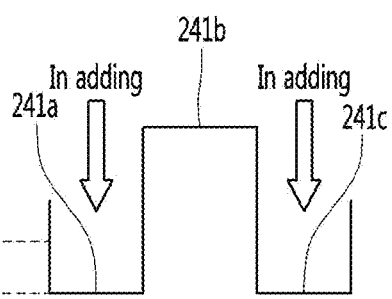
[FIG. 37]
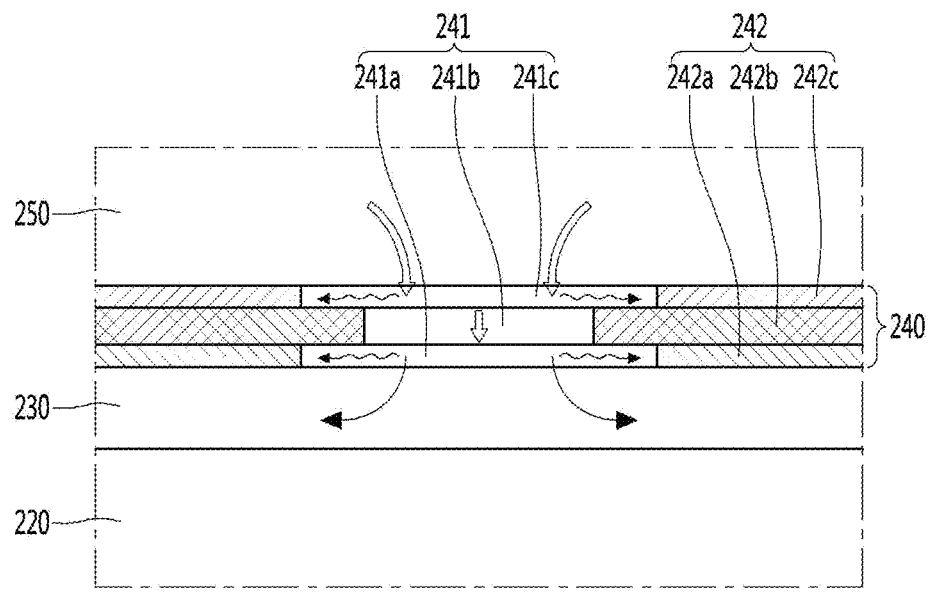

[FIG. 38]
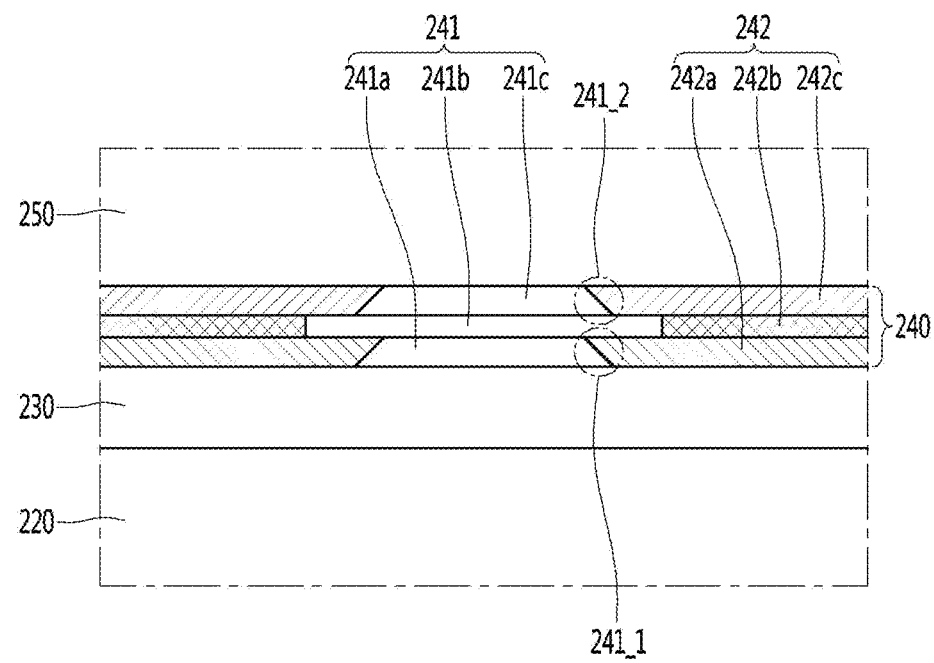
[FIG. 39]
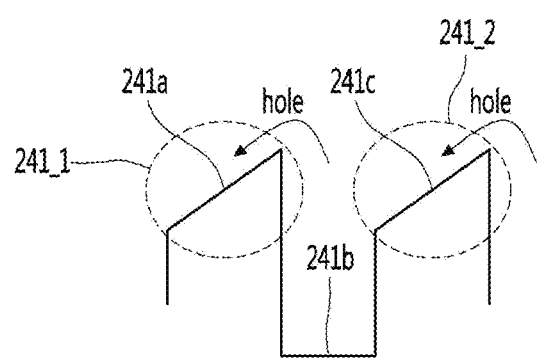

[FIG. 40]
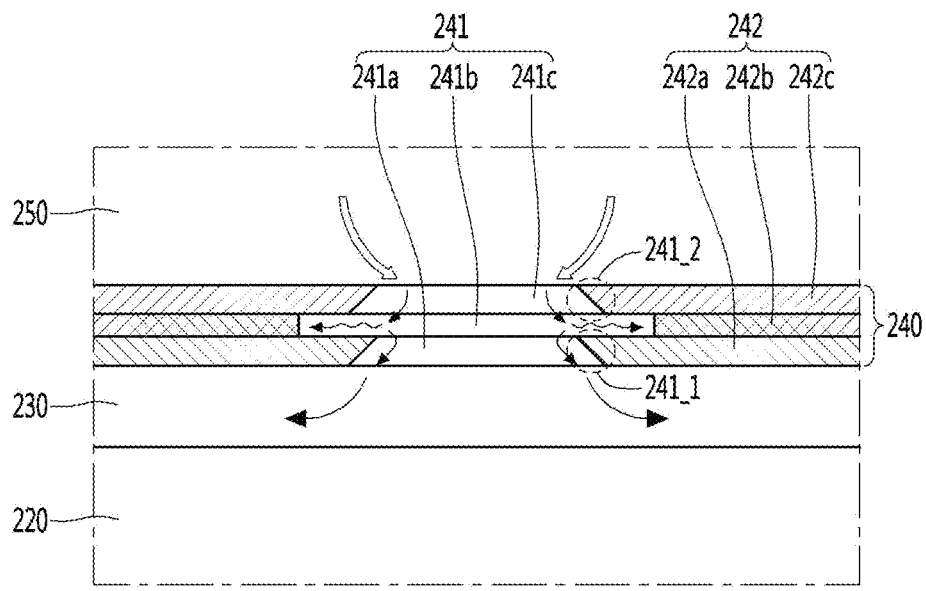
[FIG. 41]
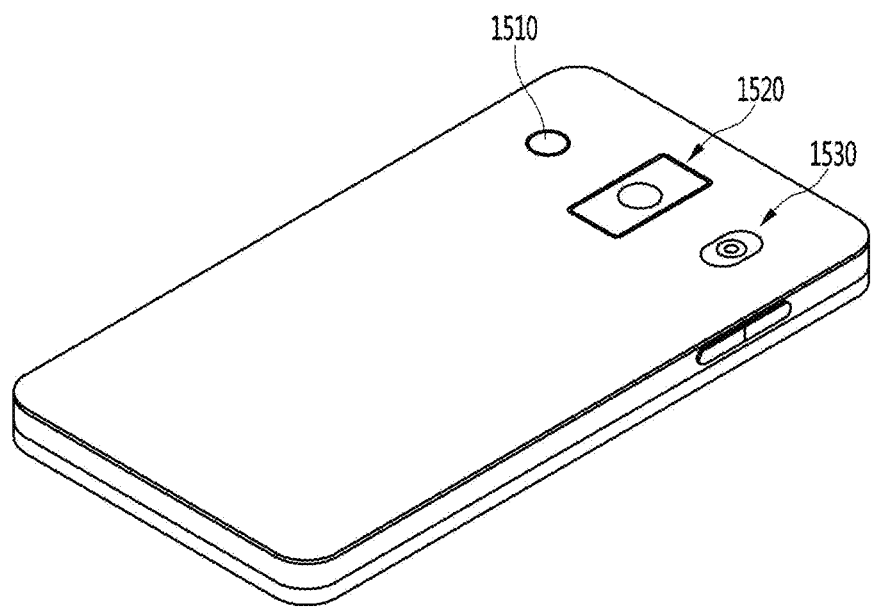

SURFACE-EMITTING LASER DEVICE AND LIGHT EMITTING DEVICE INCLUDING THE SAME

CROSS-REFERENCE TO RELATED PATENT APPLICATIONS

This application is a U.S. National Stage Application under 35 U.S.C. § 371 of PCT Application No. PCT/KR2019/003999, filed Apr. 4, 2019, which claims priority to Korean Patent Application Nos. 10-2018-0039085, filed Apr. 4, 2018, 10-2018-0073795, filed Jun. 27, 2018 and 10-2018-0125167, filed Oct. 19, 2018, whose entire disclosures are hereby incorporated by reference.

TECHNICAL FIELD

Embodiments relate to semiconductor devices, and more particularly, to a surface light emitting laser device and a light emitting device including the same.

RELATED ART

A semiconductor device including a compound such as GaN, AlGaN, etc. has many advantages, such as having a wide and easy-to-adjust band gap energy, and can be used in various ways as a light emitting device, a light receiving device, and various diodes.

In particular, the light emitting device includes a light emitting diode or a laser diode using a group 3-5 or 2-6 compound semiconductor material of the semiconductor. The light emitting device can implement various colors such as red, green, blue, and ultraviolet rays through the development of thin film growth technology and device materials. In addition, the light-emitting device can implement white light with good efficiency by using a fluorescent material or by combining colors. In addition, the light emitting device has advantages of low power consumption, semi-permanent life, fast response speed, safety, and environmental friendliness compared to conventional light sources such as fluorescent lamps and incandescent lamps.

In addition, light-receiving devices such as photodetectors and solar cells can also be manufactured using compound semiconductor materials of Group 3-5 or Group 2-6 of semiconductors. It is possible to use light in various wavelength ranges from gamma rays to radio wavelength range by generating. In addition, it has the advantages of fast response speed, safety, environmental friendliness, and easy adjustment of device materials, so it can be easily used for power control or ultra-high frequency circuits or communication modules.

Therefore, a white light emitting device which can replace a LED backlight, a fluorescent lamp or an incandescent lamp, which replaces a cold cathode tube (CCFL) constituting a backlight of a transmission module of an optical communication means and a liquid crystal display (LCD) display device. Applications are expanding to diode lighting devices, car headlights and traffic lights, and sensors that detect gas or fire.

In addition, applications can be extended to high frequency application circuits, other power control devices, and communication modules. For example, in the conventional semiconductor light source device technology, there is a vertical-cavity surface-emitting laser (VCSEL), which is used for optical communication, optical parallel processing, optical connection, and the like. On the other hand, the laser diode used in such a communication module is designed to operate at a low current.

On the other hand, the response speed was important in the existing data optical communication structure, but as it is recently applied to a high power package (High Power PKG) for a sensor, optical output and voltage efficiency become important characteristics.

For example, a 3D sensing camera is a camera capable of capturing depth information of an object, and has recently been in the spotlight in conjunction with augmented reality. On the other hand, a depth sensor of the camera module is equipped with a separate sensor, it is divided into two types, such as a structured light (SL) method and ToF (Time of Flight) method.

In the structured light (SL) method, a laser of a specific pattern is emitted to a subject, the depth of the pattern is analyzed according to the shape of the subject surface, the depth is calculated, and then synthesized with the photograph taken by the image sensor to obtain a 3D photographing result.

In contrast, the ToF method calculates the depth by measuring the time when the laser is reflected back to the subject, and then synthesizes it with the photograph taken by the image sensor to obtain a 3D photographing result.

As a result, the SL method has an advantage in mass production in that the laser has to be positioned very precisely, while the ToF technology relies on an improved image sensor, and it is possible to employ either method or both in one mobile phone.

For example, a 3D camera called True Depth can be implemented in the SL method on the front of the mobile phone and can be applied in the ToF method on the back.

However, when the VCSEL is applied to a ToF sensor, a structured light sensor, or a LDAF (laser diode autofocus), the VCSEL operates at a high current, thereby causing problems such as reduced light output or increased threshold current.

In other words, the epitaxial structure of the conventional VCSEL (Vertical Cavity Surface Emitting Laser) is important in the structure of the existing data optical communication, but the response speed is important, but when developing the high power PKG for the sensor, the light output and voltage Efficiency is an important characteristic.

In particular, in the sensor VCSEL package, the field-of-view (FOV) is determined by the combination of the divergence angle of beams in the VCSEL chip and the beam angle in the diffuser. It is important to control the divergence angle of the beam in the chip, but there is a problem that the divergence angle of the beam in the VCSEL chip is uncontrolled and increases.

According to the higher mode oscillation data generated when high current is applied in the related art, the dominant mode is oscillated in the aperture which is the diverging region of the beam when low current is applied. However, as the high current is applied, the higher mode gradually starts to oscillate.

FIG. 1A shows the divergence angle of beams data according to an applied current, and the divergence angle of beams increases as the applied current is increased from 3 mA to 10 mA from low to high current.

As described above, in the related art, there is a technical problem that the divergence angle of the beam is unintentionally increased while light emission is increased at the aperture edge due to higher mode oscillation generated when high current is applied.

In addition, according to FIG. 1A, not only increases the divergence angle of the beam when high current is applied, but also the intensity of the entire emitter region is not uniform, and the luminance at the aperture edge increases abnormally. However, there is a technical problem that the brightness of the center is further lowered.

In particular, in the related art, an oxidation layer is disposed to define an aperture, which is the divergence region of the beam, and when the oxide layer has an abrupt interface in the aperture edge region, the divergence angle of the beam is intended. In addition, the stress is increased due to a sudden difference in composition, causing problems in current characteristics and reliability.

FIG. 1B is carrier density data according to the position of the aperture region in the related art R. FIG. In FIG. 1B, the x-axis is the distance r from the aperture center in the direction of the aperture edge, and the y-axis is the carrier, for example, hole density data according to the position.

According to FIG. 1B, current crowding C occurs in which the hole density at the aperture edge increases rapidly as it is applied from a low current to a high current, and the current density at this aperture edge is generated. The higher mode is oscillated and such higher order oscillation increases the divergence angle of beams.

In addition, in the related art, a light diffraction phenomenon occurs at an aperture edge, and the diffraction angle of beams is increased due to the diffraction phenomenon.

In addition, in the related art, the divergence angle may be affected depending on the position of the oxidation layer defining the aperture. Therefore, in the related art, as the position of the oxide layer is disposed between the node and the antinode in the optical field, there is a problem that the beam divergence is widened.

In addition, the conventional surface light emitting laser device has the following problems.

First, the VCSEL structure increases reflectance through a large number of reflection layers, for example, distributed Bragg reflectors (DBRs). For example, DBR increases the reflectivity by alternately arranging $Al_xGaAs$-based materials with different Al concentrations. However, in order to solve a problem in which series resistance occurs in the DBR, an attempt is made to improve the voltage efficiency by increasing the doping concentration of the DBR to lower the resistance. However, when the doping concentration is increased, there is a technical contradiction in which the internal light absorption is generated by the dopant and the light output is lowered.

In addition, the DBR is arranged by alternating AlxGaAs-based materials with different Al concentrations, thereby reducing the electric field by the energy band bending generated at the interface between adjacent layers in the DBR. The electric field acts as a carrier barrier, resulting in a decrease in light output.

Second, optical power and voltage efficiency are important in the development of a high-power package employing a VCSEL device, and there is a limit to improving the optical power and the voltage efficiency simultaneously. For example, the VCSEL device has an active region including an active layer and a cavity, and the active region has a technical problem in that the internal resistance is high and the driving voltage is increased to decrease the voltage efficiency.

Third, in order to improve light output in the related art, optical confinement is required around the active layer, and there is no suitable solution for this in the related art.

Fourthly, when a current is applied to the surface light emitting laser device, a current crowding phenomenon occurs in which the current is concentrated along an aperture edge. Due to the current density phenomenon, the film quality of the aperture, which is the laser emission region, may be damaged. In addition, due to the current density phenomenon, the temperature of the aperture is raised, an optical problem that the divergence angle of the beam passing through the aperture is increased. The effect of affecting the divergence angle of the beam passing through the aperture by the current density phenomenon is called the thermal lens effect.

DISCLOSURE

Technical Problem

Embodiments provide a surface light emitting laser device capable of preventing a current crowding phenomenon at an aperture edge and a light emitting device including the same.

In addition, the embodiment is to provide a surface light emitting laser device capable of alleviating the diffraction of light at the aperture edge and a light emitting device including the same.

In addition, the embodiment is to provide a surface light emitting laser device and a light emitting device including the same that can solve the problem that the divergence angle of the beam is increased.

In addition, the embodiment provides a surface light emitting laser device and a light emitting device including the same that can improve the light output.

In addition, the embodiment is to provide a surface light emitting laser device and a light emitting device including the same that can improve the light concentration efficiency.

In addition, the embodiment is to provide a surface light emitting laser device and a light emitting device including the same that can alleviate the current density to prevent the variation of the divergence angle of the beam.

Technical Solution

The surface emitting laser device according to the embodiment may include a first electrode 215; a substrate 210 disposed on the first electrode 215; a first reflection layer 220 disposed on the substrate 210; an active region 230 disposed on the first reflection layer 220 and including a cavity; an opening region 240 disposed on the active region 230 and including an aperture 241 and an insulating region 242; a second reflection layer 250 disposed on the opening region 240; a second electrode 280 disposed on the second reflection layer 250; and a delta doping layer 241c disposed in the opening region 240.

The thickness of the insulating region 242 may become thinner in the direction of the aperture 241.

The delta doped layer 241c may be disposed on the aperture 241.

The aperture 241 may include an AlGa-based layer 241a, and the delta doped layer 241c may be disposed on the AlGa-based layer 241a of the aperture 241.

The surface emitting laser device according to the embodiment may include a substrate, a first reflection layer disposed on the substrate, an active layer disposed on the first reflection layer, and a second reflection layer disposed on the active layer and including an aperture region. The aperture region may include a first insulating layer and a second insulating layer disposed on the first insulating layer.

The length of the first insulating layer may be longer than the length of the second insulating layer.

The length of the first insulating layer may range from 1.1 times to 2.0 times longer than the length of the second insulating layer.

And a third insulating layer disposed inward from the outside of the second reflection layer by a predetermined distance, wherein the length of the second insulating layer is longer than that of the third insulating layer and may be shorter than the length of the first insulating layer.

The thickness of the second insulating layer may be thinner than the thickness of the first insulating layer.

An AlGa-based transition layer disposed between the active layer and the second reflection layer and having an Al composition graded, wherein the AlGa-based transition layer is a first AlGa-based transition layer disposed in an upper first region of the first insulating layer It may include a layer and a second AlGa series transition layer disposed below the first insulating layer.

The composition of Al in the first AlGa series transition layer may be graded in a first range of 0.12 to 0.80, and the composition of Al in the second AlGa series transition layer may be graded in a second range of 0.30 to 0.65.

The surface emitting laser device according to the embodiment includes a first reflection layer 220, an active layer 232, a first insulating layer 242b, and an aperture 241 on the first reflection layer 220, and the active layer. An aperture region 240 disposed on 232, a second reflection layer 250 on the aperture region 240, and an active layer 232 and the second reflection layer 250. The Al composition may include an AlGa-based transition layer 242 to be graded and a second insulating layer 242e disposed between the active layer 232 and the second reflection layer 250.

The second insulating layer 242e may extend from the end of the first insulating layer 242b in the direction of the aperture 241 and be disposed on the first insulating layer 242b.

The second insulating layer 242e may be an insulating layer in which a part of the AlGa series transition layer is oxidized.

The AlGa series transition layer 242 includes a first AlGa series transition layer 242a1 disposed in an upper first region of the first insulating layer 242b, and the second insulating layer 242e includes the first insulating layer 242e. It may include a second-first insulating layer 242e1 disposed in the second upper region of the insulating layer 242b.

The AlGa series transition layer 242 may further include a second AlGa series transition layer 242a2 disposed under the first insulating layer 242b.

The second insulating layer 242e may further include a second-second insulating layer 242e2 disposed under the first insulating layer 242b.

The second-first length L21 of the second-first insulating layer 242e1 may be shorter than the first length L1 of the first insulating layer 242b.

The second-second length L22 of the second-second insulating layer 242e2 may be shorter than the second-first length L21 of the second-first insulating layer 242e1.

The Second Reflection Layer 250

And a third insulating layer 243 disposed inward from the outer side of the second reflection layer 250 by a predetermined distance, and the second length of the second insulating layer 242e has a length of the third insulating layer 243. It may be longer than the third length L3.

The second-first thickness T21 of the second-first insulating layer 242e1 may be thinner than the first thickness T1 of the first insulating layer 242b.

The first thickness T1 of the first insulating layer 242b may be thinner than the third thickness T3 of the third insulating layer 243.

A composition of Al in the first AlGa series transition layer 242a1 may be graded in a first range of 0.12 to 0.80.

A composition of Al in the second AlGa series transition layer 242a2 may be graded in a second range of 0.30 to 0.65.

The second composition range graded in the second AlGa series transition layer 242a2 may be within a first composition range of Al graded in the first AlGa series transition layer 242a1.

The first insulating layer 242b may be located at a node position of the laser oscillated by the active layer 232.

The second insulating layer 242e may be located at a node position of the laser oscillated by the active layer 232.

In addition, the surface light emitting laser device according to the embodiment includes a substrate, a first reflection layer disposed on the substrate; an active layer disposed on the first reflection layer; an oxide layer disposed on the active layer and including an opening and an insulating region; and a second reflection layer disposed on the oxide layer. The opening may include a first semiconductor region; a second semiconductor region on the first semiconductor region; and a third semiconductor region on the second semiconductor region. The first to third semiconductor regions may include Al, and an Al concentration of the second semiconductor region may be lower than an Al concentration of the first or third semiconductor region.

In addition, the surface light emitting laser device according to the embodiment, the substrate; a first reflection layer disposed on the substrate; an active layer disposed on the first reflection layer; an oxide layer disposed on the active layer and including an opening and an insulating region; and a second reflection layer disposed on the oxide layer. The opening may include a first semiconductor region; a second semiconductor region on the first semiconductor region; and a third semiconductor region on the second semiconductor region. The first to third semiconductor regions may include Al, and the Al concentration of the second semiconductor region may be higher than the Al concentration of the first or third semiconductor region.

In addition, the light emitting device according to the embodiment may include the surface emitting laser device.

Advantageous Effects

The embodiment can provide a surface light emitting laser device and a light emitting device including the same that can solve the problem of increasing the divergence angle of beams by preventing current crowding at the aperture edge to prevent higher mode oscillation.

In addition, the embodiment can provide a surface light emitting laser device and a light emitting device including the same that can prevent a current density at the aperture edge to give a uniform light output in the entire aperture area as the current spreads.

In addition, the embodiment can provide a surface light emitting laser device and a light emitting device including the same that can solve the problem that the diffraction phenomenon of the light at the aperture edge to increase the divergence angle of the beam.

In addition, the embodiment can provide a surface light emitting laser device and a light emitting device including the same that can solve the problem of increasing the divergence angle of the beam at the aperture edge.

For example, as the second insulating layer 242e extends from the end of the first insulating layer 242b toward the aperture 241 and is disposed on the first insulating layer 242b, the first insulating layer 242e is insulated from the first insulating layer 242b. The interface between the first insulating layer 242b at the boundary between the layer 242b and the aperture 241 may be sharp, and the divergence angle may be prevented from being increased by the sharp interface SI.

In addition, the embodiment can provide a surface light emitting laser device and a light emitting device including the same that can improve the reliability by improving the crystal quality at the aperture edge to give a uniform light output in the entire aperture area.

For example, as the second insulating layer 242e extends from the end of the first insulating layer 242b in the direction of the aperture 241 and is disposed on the first insulating layer 242b, the first insulating layer 242e is disposed on the first insulating layer 242b. The crystal quality of the insulating layer 242b can be maintained or improved compared to the conventional one, and in particular, the crystal quality of the aperture 241 can be maintained or improved, which is more uniform in the entire aperture including the center as well as the aperture edge.

In addition, according to the embodiment, the second insulating layer 242e extends from the end of the first insulating layer 242b toward the aperture 241 and is disposed on the first insulating layer 242b. The expansion of the DLs to the first insulating layer 242b, which is an oxide layer defining the aperture 241, is blocked by the current confinement so that the first insulating layer 242b is protected to determine the first insulating layer 242b. The quality can be maintained or improved compared to the conventional one, so that the electrical reliability is improved, and therefore, acceleration in a higher mode even when a high current is applied can be prevented than in the related art.

In an embodiment, the second insulating layer 242e extends a predetermined distance from the end of the first insulating layer 242b toward the aperture 241 and is disposed on the first insulating layer 242b. It is possible to solve the problem of increasing the divergence angle of the beam at the aperture edge, and to improve the reliability by improving the crystal quality of the first insulating layer 242b and the aperture 241 at the aperture edge, thereby there is a complex technical effect that can produce a light output and improve uniformity in the entire aperture area.

In addition, according to at least one of the embodiments, the oxide layer is composed of a plurality of layers, for example, the first to third oxide layer, there is an advantage that the stress of the oxide layer generated when the oxide layer is composed of a single layer is alleviated.

In addition, according to at least one of the embodiments, in the opening including the first to third semiconductor regions, a second semiconductor region having a small band gap is disposed between the first semiconductor region and the third semiconductor region having a large band gap, thereby forming a first semiconductor region. The current concentration in the first to third semiconductor regions can be relaxed and the diffraction effect can be reduced.

Further, according to at least one of the embodiments, the second semiconductor region 241b having a small band gap is contracted by a sandwich structure disposed between the first semiconductor region 241a and the third semiconductor region 241c having a large band gap. The stress is alleviated, and there is an advantage in that deterioration of the laser beam emission characteristics can be prevented due to the bending characteristics of the surface-emitting laser device.

In addition, according to at least one of the embodiments, when In is added to the second semiconductor region including the first to third semiconductor regions to further reduce the band gap, holes generated in the second reflection layer may be formed in the third semiconductor region. It may be moved along the transverse direction in the second semiconductor region via the. Accordingly, the current may not only flow to the light emitting layer via the first semiconductor region along the vertical direction in the second semiconductor region, but may also flow along the transverse direction in the second semiconductor region. That is, since current is distributed in the vertical direction and the lateral direction in the second semiconductor region, the current density phenomenon in which the current is concentrated along the aperture edge can be alleviated.

Further, according to at least one of the embodiments, the first to third oxide layers are provided, the first oxide layer comprises a first semiconductor region and a first insulating region, and the second oxide layer comprises a second semiconductor region and a second insulating region. The third oxide layer may include a third semiconductor region and a third insulating region. In this case, movement of holes generated in the second reflection layer to the second semiconductor region via the third semiconductor region may be suppressed by the second disturbing region of the third insulating region. In addition, movement of holes moved to the second semiconductor region to the light emitting layer through the first semiconductor region may be suppressed by the first interference region of the first insulating region. In addition, holes moved to the second semiconductor region may be dispersed and moved not only in the vertical direction but also in the transverse direction. Accordingly, the movement of holes is suppressed at the openings of the oxide layer, that is, at the edges of the openings including the first to third semiconductor regions, and the holes are dispersed in the vertical direction and the horizontal direction, thereby preventing the current dense phenomenon and changing the divergence angle of the beam and it is not possible to output a precise laser beam.

Further scope of the applicability of the embodiments will become apparent from the detailed description below. However, various changes and modifications within the spirit and scope of the embodiments can be clearly understood by those skilled in the art, and therefore, specific embodiments, such as the detailed description and the preferred embodiments, are to be understood as given by way of example only.

DESCRIPTION OF DRAWINGS

Mode for Invention

FIG. 1A shows divergence angle of beams data according to an applied current in the related art.

FIG. 1B shows carrier density data according to the position of an aperture region in the related art.

FIG. 2 is a cross-sectional view of a surface light emitting laser device according to an embodiment.

FIG. 3 is an enlarged view of a first region A of the surface light emitting laser device according to the embodiment shown in FIG. 2.

FIG. 4A is an enlarged view of the first embodiment of the second region B of the surface light emitting laser device according to the embodiment shown in FIG. 2.

FIG. 4B shows carrier density data according to the position of the aperture region in an embodiment.

FIG. 4C is a manufacturing conceptual diagram of the first embodiment of the second region B shown in FIG. 4A.

FIG. 5 is oxidation degree data according to the doping concentration in the surface light emitting laser device according to the embodiment.

FIG. 6A is an enlarged view of a second embodiment of a second region B of the surface light emitting laser device according to the embodiment shown in FIG. 2.

FIG. 6B is a manufacturing conceptual diagram of the second embodiment of the second region B shown in FIG. 6A.

FIG. 7A is an enlarged view of a third embodiment of a second region B of the surface light emitting laser device according to the embodiment shown in FIG. 2.

FIG. 7B is a manufacturing conceptual diagram of the third embodiment of the second region B shown in FIG. 7A.

FIG. 7C is a conceptual diagram of the 2DHG effect in the second region B of the surface light emitting laser device according to the embodiment shown in FIG. 7A.

FIG. 8A is an enlarged view of a fourth embodiment of a second region B of the surface light emitting laser device according to the embodiment shown in FIG. 2.

FIG. 8B is a manufacturing conceptual diagram of the fourth embodiment of the second region B shown in FIG. 8A.

FIG. 9A is an enlarged view of a fifth embodiment of a second region B of the surface light emitting laser device according to the embodiment shown in FIG. 2.

FIG. 9B is a manufacturing conceptual diagram of the fifth embodiment of the second region B shown in FIG. 9A.

FIG. 10 is a conceptual diagram of a 2DHG effect in the second region B of the surface light emitting laser device according to the embodiment shown in FIGS. 8A and 9A.

FIGS. 11A to 16 are cross-sectional views illustrating a process of manufacturing a semiconductor device according to the embodiment.

FIG. 17 is a cross-sectional view of a surface light emitting laser device according to the embodiment.

FIG. 18 is an enlarged view of the first region A1 of the surface light emitting laser device according to the embodiment shown in FIG. 17.

FIG. 19A is a first enlarged view of a second area A2B of the surface light emitting laser device according to the embodiment shown in FIG. 17.

FIG. 19B is an enlarged photograph of the third region A3 of the second region A2B of the surface light emitting laser device according to the embodiment shown in FIG. 19A.

FIG. 20 is a partially enlarged view of a surface light emitting laser device according to the related art.

FIGS. 21A and 21B illustrate Near field image and Far field spectrum of a surface light emitting laser device according to the related art.

FIGS. 22A and 22B are Near field image and Far field spectrum of the surface light emitting laser device according to the embodiment.

FIG. 23 is an enlarged view illustrating the composition of the fourth region A4 of the surface light emitting laser device according to the embodiment shown in FIG. 19A.

FIG. 24 is a second enlarged view of a second area A2B of the surface light emitting laser device according to the embodiment shown in FIG. 17.

FIG. 25 is a third enlarged view of a second area A2B of the surface light emitting laser device according to the embodiment shown in FIG. 17.

FIG. 26 is a surface light emitting laser package to which the surface light emitting laser device according to the embodiment is applied.

FIG. 27 is a sectional view of a surface light emitting laser device according to another embodiment.

FIG. 28 is a cross-sectional view of the surface light emitting laser device according to the second additional embodiment.

FIG. 29 is a cross-sectional view of the first portion B13 of the surface light emitting laser device according to the embodiment shown in FIG. 28.

FIG. 30 is first distribution data of refractive index and light energy in the surface light emitting laser device according to the second embodiment.

FIG. 31 is second distribution data of refractive indices in the surface light emitting laser device according to the second embodiment.

FIG. 32 is a cross-sectional view of the surface light emitting laser device according to the third embodiment.

FIGS. 33A and 33B show a band gap that varies depending on whether In is added in the third embodiment.

FIG. 34 shows the current density level according to the third embodiment.

FIG. 35 is a sectional view of a surface light emitting laser device according to the fourth embodiment.

FIGS. 36A and 36B show a bandgap that varies depending on whether In is added in the fourth embodiment.

FIG. 37 shows the current density level according to the fourth embodiment.

FIG. 38 is a cross-sectional view of the surface light emitting laser device according to the fifth embodiment.

FIG. 39 shows the flow of holes in the fifth embodiment.

FIG. 40 shows the current density level according to the fifth embodiment.

FIG. 41 is a perspective view of a mobile terminal to which a surface light emitting laser device is applied according to an embodiment.

DETAILED DESCRIPTION

Mode for Invention

Hereinafter, embodiments of the present invention will be described with reference to the accompanying drawings.

In the description of the embodiments, when described as being formed on the "on or under" of each element, the on or under includes both the two elements are in direct contact with each other, or one or more other elements are disposed indirectly between the two elements. In addition, when expressed as "on" or "under", it may include the meaning of the downward direction as well as the upward direction based on one element.

EXAMPLE

FIG. 2 is a cross-sectional view of the surface light emitting laser device 200 according to the embodiment, FIG. 3 is an enlarged view of the first region A of the surface light emitting laser device according to the embodiment shown in FIG. 2, and FIG. 4A. is a first enlarged view of a second region B of the surface light emitting laser device according to the embodiment shown in FIG. 2.

Refereeing to FIG. 2, the surface light emitting laser device 200 according to the embodiment may include a first electrode 215, a substrate 210, a first reflection layer 220, an active region 230, an opening region 240, one or more of the second reflection layer 250 and the second electrode 280 may be included. The opening area 240 may include an aperture 241 and an insulating area 242. The insulating region 242 may be referred to as an oxide layer, and the opening region 240 may be referred to as an oxidation region, but is not limited thereto.

The embodiment may include a delta doping layer 241c disposed between the active region 230 and the second reflection layer 250. For example, the opening region 240 may include an insulating region 242, an aperture 241, and a delta doping layer 241c.

For example, the surface light-emitting laser device 200 according to the embodiment includes a first electrode 215, a substrate 210 disposed on the first electrode 215, and a reflective layer 220 disposed on the substrate 210, and an active region 230 disposed on the first reflective layer 220 and including an active layer 232 (see FIG. 3). In addition, the embodiment includes an opening region 240 disposed on the active region 230 including an aperture 241 and an insulating region 242, and a second reflective layer 250 disposed on the opening region 240, a second electrode 280 disposed on the second reflective layer 250, and a delta doping layer 241c disposed between the active region 230 and the second reflective layer 250. The embodiment may further include a second contact electrode 255 and a passivation layer 270.

Hereinafter, the technical features of the surface light-emitting laser device 200 according to the embodiment will be described with reference to FIG. 2, and the technical effects will be described with reference to FIGS. 3 to 10. In the drawings of the embodiment, the x-axis direction may be a direction parallel to the longitudinal direction of the substrate 210, and the y-axis may be a direction perpendicular to the x-axis.

<Substrate, First Electrode>

Referring to FIG. 2, in an embodiment, the substrate 210 may be a conductive substrate or a non-conductive substrate. As the conductive substrate, a metal having excellent electrical conductivity may be used, and a GaAs substrate, a metal substrate or a silicon (Si) substrate, etc having high thermal conductivity can be used to sufficiently dissipate heat generated when the surface light-emitting laser device 200 is operated.

In the case of using a non-conductive substrate, an AlN substrate, a sapphire ($Al_2O_3$) substrate, or a ceramic substrate may be used.

In an embodiment, the first electrode 215 may be disposed below the substrate 210, and the first electrode 215 may be disposed in a single layer or multiple layers with a conductive material. For example, the first electrode 215 may be a metal and at least one of aluminum (Al), titanium (Ti), chromium (Cr), nickel (Ni), copper (Cu), and gold (Au) to improve the electrical characteristics and to increase the light output as of a single layer or a multi-layer structure.

<First Reflection Layer, Second Reflection Layer>

Referring to FIG. 2, the embodiment may include a first reflection layer 220, an active region 230, an insulating region 242, and a second reflection layer which are 250 disposed on the substrate 210.

FIG. 3 is an enlarged view of the first area A of the surface light emitting laser device according to the embodiment shown in FIG. 2. Hereinafter, the surface light emitting laser device according to the embodiment of the embodiment will be described with reference to FIG. 3.

The first reflection layer 220 may be doped with a first conductivity type. For example, the first conductivity type dopant may include an n type dopant such as Si, Ge, Sn, Se, Te, or the like.

In addition, the first reflection layer 220 may include a gallium-based compound, for example, AlGaAs, but is not limited thereto. The first reflection layer 220 may be a distributed Bragg reflector (DBR). For example, the first reflection layer 220 may have a structure in which a first layer and a second layer made of materials having different refractive indices are alternately stacked at least once.

For example, as shown in FIG. 3, the first reflection layer 220 may include a first group first reflection layer 221 disposed on the substrate 210 and a second group first reflection layer 222 disposed on the first group first reflection layer 221.

The first group first reflection layer 221 and the second group first reflection layer 222 may include a plurality of layers made of a semiconductor material having a compositional formula of $Al_xGa_{(1-x)}As$ (0<x<1). As the Al in each layer increases, the refractive index of each layer may decrease, and as Ga increases, the refractive index of each layer may increase.

In addition, the thickness of each layer may be $\lambda/4n$, $\lambda$ may be a wavelength of light generated in the active region 230, and n may be a refractive index of each layer with respect to light having the aforementioned wavelength. Here, $\lambda$ may be 650 to 980 nanometers (nm), and n may be the refractive index of each layer. The first reflection layer 220 having such a structure may have a reflectance of 99.999% for light in a wavelength region of about 940 nanometers.

The thickness of the layer in each of the first reflection layers 220 may be determined according to the refractive index and the wavelength $\lambda$ of the light emitted from the active region 230.

In addition, as shown in FIG. 3, the first group first reflection layer 221 and the second group first reflection layer 222 may also be formed of a single layer or a plurality of layers.

For example, the first group first reflection layer 221 may include about 30-40 pairs of the first group first-first layer 221a and the first group first-second layer 221b. The first group first-first layer 221a may be formed thicker than the first group first-second layer 221b. For example, the first group first-first layer 221a may be formed at about 40 to 60 nm, and the first group first-second layer 221b may be formed at about 20-30 nm.

In addition, the second group first reflection layer 222 may also include about 5 to 15 pairs of the second group first-first layer 222a and the second group first-second layer 222b. The second group first-first layer 222a may be formed thicker than the second group first-second layer 222b. For example, the second group first-first layer 222a may be formed at about 40 nm to about 60 nm, and the second group first-second layer 222 b may be formed at about 20 nm to about 30 nm.

In addition, as shown in FIG. 3, the second reflection layer 250 may include a gallium-based compound, for example, AlGaAs, and the second reflection layer 250 may be doped with a second conductivity type dopant. The second conductivity type dopant may be a p-type dopant such as Mg, Zn, Ca, Sr, Ba, or the like. Meanwhile, the first reflection layer 220 may be doped with a p-type dopant, and the second reflection layer 250 may be doped with an n-type dopant.

The second reflection layer 250 may also be a distributed Bragg reflector (DBR). For example, the second reflection layer 250 may have a structure in which a plurality of layers made of materials having different refractive indices are alternately stacked at least once.

Each layer of the second reflection layer 250 may include AlGaAs, and in detail, may be formed of a semiconductor material having a compositional formula of $Al_xGa_{(1-x)}As$ (0<x<1). Herein, when Al increases, the refractive index of each layer may decrease, and when Ga increases, the refractive index of each layer may increase. The thickness of each layer of the second reflection layer 250 may be λ/4n, λ may be a wavelength of light emitted from the active layer, and n may be a refractive index of each layer with respect to light having the aforementioned wavelength.

The second reflection layer 250 having such a structure may have a reflectance of 99.9% with respect to light in a wavelength region of about 940 nanometers.

The second reflection layer 250 may be formed by alternately stacking layers, and the number of pairs of layers in the first reflection layer 220 may be greater than the number of pairs of layers in the second reflection layer 250. In this case, as described above, the reflectance of the first reflection layer 220 may be about 99.999%, which may be greater than 99.9% of the reflectance of the second reflection layer 250.

In an embodiment, the second reflection layer 250 may include the first group second reflecting layer 251 adjacent to the active region 230 in the active region 230 and the second group second reflection layer 252 spaced apart from the first group second reflecting layer 251.

As shown in FIG. 3, the first group second reflection layer 251 and the second group second reflection layer 252 may also be formed of a single layer or a plurality of layers, respectively.

For example, the first group second reflection layer 251 may include about 1 to 5 pairs of the first group second-first layer 251a and the first group second-second layer 251b. The first group second-first layer 251a may be formed thicker than the first group second-second layer 251b. For example, the first group second-first layer 251a may be formed at about 40-60 nm, and the first group second-second layer 251b may be formed at about 20-30 nm.

In addition, the second group second reflection layer 252 may also include about 5 to 15 pairs of the second group second-first layer 252a and the second group second-second layer 252b. The second group second-first layer 252a may be formed thicker than the second group second-second layer 252b. For example, the second group second-first layer 252a may be formed at about 40 to 60 nm, and the second group second-second layer 252b may be formed at about 20 to 30 nm.

<Active Area>

Referring to FIG. 3, the active region 230 may be disposed between the first reflection layer 220 and the second reflection layer 250.

The active region 230 may include an active layer 232 and at least one cavity 231 and 233. For example, as shown in FIG. 3, the active region 230 includes an active layer 232, a first cavity 231 disposed below the active layer 232, and a second cavity 233 disposed above the active layer 232. In an embodiment, the active region 230 may include both the first cavity 231 and the second cavity 233, or may include only one of the two.

The active layer 232 may include any one of a single well structure, a multi well structure, a single quantum well structure, a multi quantum well (MQW) structure, a quantum dot structure, and a quantum line structure.

The active layer 232 may include a well layer 232a and a barrier layer 232b using a compound semiconductor material of a group III-V element. The well layer 232a may be formed of a material having an energy band gap smaller than the energy band gap of the barrier layer 232b. The active layer 232 may be formed in a 1 to 3 pair structure such as InGaAs/AlxGaAs, AlGaInP/GaInP, AlGaAs/AlGaAs, AlGaAs/GaAs, GaAs/InGaAs, but is not limited thereto. Dopants may not be doped in the active layer 232.

Next, the first cavity 231 and the second cavity 233 may be formed of an AlyGa$_{(1-y)}$As (0<y<1) material, but is not limited thereto. For example, the first cavity 231 and the second cavity 233 may each include a plurality of layers of AlyGa$_{(1-y)}$As.

For example, the first cavity 231 may include a first-first cavity layer 231a and a first-second cavity layer 231b. The first-first cavity layer 231a may be further spaced apart from the active layer 232 than the first-second cavity layer 231b. The first-first cavity layer 231a may be formed thicker than the first-second cavity layer 231b, but is not limited thereto.

In addition, the second cavity 233 may include a second-first cavity layer 233a and a second-second cavity layer 233b. The second-second cavity layer 233b may be further spaced apart from the active layer 232 than the second-first cavity layer 233a. The second-second cavity layer 233b may be formed thicker than the second-first cavity layer 233a, but is not limited thereto. In this case, the second-second cavity layer 233b may be formed to about 60 to 70 nm, and the first-first cavity layer 231a may be formed to about 40 to 55 nm, but is not limited thereto.

<Opening Area>

Referring back to FIG. 2, in an embodiment, the opening region 240 may include an insulating region 242, an aperture 241, and a delta doping layer 241c.

The insulating region 242 may be formed of an insulating layer, for example, aluminum oxide, to act as a current blocking region, and the aperture 241 may be defined by the insulating region 242.

For example, when the opening region 240 includes aluminum gallium arsenide (AlGaAs), the AlGaAs material at the edge of the opening region 240 reacts with H$_2$O and the edge changes to aluminum oxide (Al$_2$O$_3$), and the insulating region 242 can be formed. In addition, the central region of the opening region that does not react with H$_2$O may be an aperture 241 made of AlGaAs.

According to an embodiment, the light emitted from the active region 230 through the aperture 241 may be emitted to the upper region, and the light transmittance of the aperture 241 may be superior to that of the insulating region 242.

Referring to FIG. 3 again, the insulating region 242 may include a plurality of layers, for example, a first insulating layer 242a and a second insulating layer 242b. The first insulating layer 242a may have a thickness that is the same as or different from that of the second insulating layer 242b.

FIG. 4A is an enlarged view of the first embodiment of the second region B of the surface light emitting laser device according to the embodiment shown in FIG. 2.

One of the technical problems in the embodiment is to provide a surface light emitting laser device capable of preventing current crowding at the aperture edge and a light emitting device including the same.

Another object of the embodiments is to provide a surface light emitting laser device capable of alleviating diffraction of light at an aperture edge, and a light emitting device including the same.

In order to solve this technical problem, the surface light emitting laser device according to the embodiment as shown in FIGS. 2 and 4a includes a delta doping layer 241c disposed between the active region 230 and the second reflection layer 250.

In detail, as illustrated in FIG. 4A, the delta doped layer 241c may be disposed on the aperture 241. The delta doped layer 241c may be a layer doped with a second conductivity type element. For example, the delta doped layer 241c may be doped with any one or more of Be, Mg, C, and Zn, but is not limited thereto. The delta doped layer 241c may be a delta functional doping in the y-axis direction, which is the growth direction of the epitaxial layer, and there may be no difference in the doping concentration in the x-axis direction, which is the plane direction.

FIG. 4B is carrier density data E according to the position of the aperture region in the embodiment. For example, the x-axis of FIG. 4B is data of hole density according to the distance r from the center of the aperture.

In the related art R, a current crowding C occurs in which the hole density at the aperture edge rapidly increases as it is applied from a low current to a high current, and the current density at this aperture edge is generated. The higher mode is oscillated, and this higher order oscillation has a problem of increasing the divergence angle of beams.

According to the embodiment, the current density is concentrated at the aperture edge by distributing the delta doped layer 241c doped with the second conductivity type element to the aperture 241 by the even current diffusion in the aperture 241. By preventing the phenomenon there is a technical effect that can provide a surface light emitting laser device and a light emitting device including the same that can produce a uniform light output in the entire area of the aperture in accordance with the current diffusion. In Example E, the second conductive element is carbon C, and the concentration is about $8 \times 10^{18}$ cm$^{-3}$.

In addition, the embodiment arranges the delta doped layer 241c doped with the second conductivity type element in the aperture 241 so that the current crowding phenomenon in the aperture by current diffusion can be prevented in the aperture 241. Accordingly, there is a technical effect that the embodiment prevents a current crowding phenomenon at the aperture edge to prevent higher mode oscillation, thereby increasing the divergence angle of the beams.

In addition, in the embodiment, a current flowing from the second electrode 280 to the first electrode 215 flows toward the center of the opening region 240 by the delta doped layer 241c doped with a second conductivity type element. Therefore, there is a technical effect to prevent the current density phenomenon at the aperture edge to prevent higher mode oscillation and to increase the divergence angle of the beams.

Next, FIG. 4C is a manufacturing conceptual diagram of the first embodiment of the second region B shown in FIG. 4A.

As shown in FIG. 4C, an AlGa-based layer 241a for forming the opening region 240 is formed on the active region 230, and is doped by a second conductivity type element during the growth of the AlGa-based layer 241a. The delta doped layer 241c may be disposed in the AlGa based layer 241a. The AlGa-based layer 241a may include a material such as $Al_zGa_{(1-z)}As$ (0<z<1), but is not limited thereto.

The delta doped layer 241c may be a delta functional doping with respect to the y-axis direction, which is the growth direction of the AlGa-based layer 241a, and there may be no difference in doping concentration in the x-axis direction, which is the plane direction.

In some embodiments, the delta doped layer 241c may be doped with a second conductivity type element, but is not limited thereto. For example, the delta doped layer 241c may be doped with any one or more of Be, Mg, C, and Zn, but is not limited thereto.

On the other hand, FIG. 5 is the data of the degree of oxidation according to the doping concentration in the surface light emitting laser device according to the embodiment.

Referring to FIG. 5, as the doping concentration increases from the first doping concentration D1 to the second doping concentration D2, oxidation may be promoted to increase the thickness of the oxide layer.

Therefore, according to the embodiment, the oxidized process is performed after the delta doped layer 241c is formed on the AlGa series layer 241a as shown in FIG. 4C, and thus the insulating region 242 is delta-doped with the second conductivity type element. The oxidation rate in the x-axis direction can be controlled, and sharp edges can be realized by selective or predominant oxidation of the delta-doped region as shown in FIG. 4A.

In some embodiments, the delta doped layer, which was present at the insulating layer 242, is difficult to function as a conductive layer due to oxidation. It may be present in an un-oxidated state.

Referring to FIG. 4A, an inner end of the insulating region 242 may overlap the delta doped layer 241c in a first direction (x-axis direction).

In an embodiment, the minimum thickness of the insulating region 242 may be in contact with the delta doped layer 241c. For example, sharp edges due to dominant oxidation of the insulating region 242 may be in contact with the delta doped layer 241c positioned in the aperture 241.

According to the embodiment, as shown in FIG. 4A, while the delta doping layer 241c is present in the aperture 241, the thickness of the insulating region 242 may be formed to be thinner in the direction of the aperture 241. For example, in an embodiment, the first thickness T1 in the outer region of the insulating region 242 may be thicker than the second thickness T2 in the inner region adjacent to the aperture 241.

Accordingly, according to the embodiment, the insulating region 242 may have the second thickness T2 in the inner region adjacent to the aperture 241 to be thinner than the first thickness T1 in the outer region. The problem of increasing the divergence angle of the beams can be solved by alleviating the diffraction of the light.

In an embodiment, the first thickness T1 of the outer region of the insulating region 242 may be about 5 nm to 50 nm. If the thickness of the insulating region 242 is less than 5 nm, problems may occur in current and optical confinement. On the other hand, when the thickness of the insulating region 242 exceeds 50 nm, there is a problem of increasing the driving voltage or increasing the beam divergence angle. In addition, since the thickness of the insulating region 242 is controlled to 10 nm to 30 nm, the effects of current and optical restraint may be further increased, and the problem of increase in the divergence angle of the beam may be minimized.

In an embodiment, the doping concentration of the delta doping layer 241c may be about $1 \times 10^{16}$ to $1 \times 10^{20}$ atoms/cm$^3$. When the oxidation process is performed on the AlGa-based layer 241a through the doping concentration in this range, the delta doping layer as the oxidation proceeds preferentially along 241c, the thickness of the insulating region 242 may be formed to be thinner in the direction of the aperture 241 as shown in FIG. 4A.

The doping concentration of the delta doped layer 241c may be $1 \times 10^{16}$ atoms/cm$^3$ or more, which is a background carrier density, and the deterioration of crystalline quality may occur when the doping concentration of the delta doped layer 241c exceeds its upper limit, $1 \times 10^{20}$ atoms/cm$^3$.

In addition, in the embodiment, the doping concentration of the delta doping layer 241c is preferably controlled at about $1 \times 10^{17}$ to $1 \times 10^{19}$ atoms/cm$^3$, so that the oxidation region is more preferentially oxidized in the delta doping layer 241 c, so that the inner side has a sharp insulating region. By implementing 242, the diffraction phenomenon of light at the edge of the aperture 241 may be remarkably alleviated to prevent an increase in the divergence angle of the beam, and the crystal quality of the AlGa series layer 241a may be further improved.

Also, in an embodiment, the dopant concentration of the delta doped layer 241c may be higher than the dopant concentration doped in another layer. For example, in an embodiment, the dopant concentration of the delta doped layer 241c may be higher than that of the second conductivity type dopant of the second reflection layer 250, so that oxidation proceeds preferentially along the delta doped layer 241c. As a result, the insulating region 242 may be formed to be thinner in the direction of the aperture 241.

In an embodiment, the delta doped layer 241c may be formed in atomic unit thickness, and may be confirmed by an analytical device such as SIMS. According to the embodiment, the oxidation rate of the insulating region 242 is controlled by delta doping of the second conductivity type element to implement sharp edges by selective or predominant oxidation of the delta-doped region. The second thickness T2 in the inner region adjacent to the aperture 241 of insulating region 242 is formed to be thinner than the first thickness T1 in the outer region, thereby alleviating the diffraction of light in the aperture 241 to reduce the beam and the problem of increasing the divergence angle of beams can be solved.

FIG. 6A is an enlarged view of the second embodiment of the second region B of the surface light emitting laser device according to the embodiment shown in FIG. 2.

The second embodiment may adopt the technical features of the first embodiment, and will be described below with reference to the technical features of the second embodiment.

In the second embodiment, the aperture 241 may include a plurality of AlGa-based layers 241a, and may include, for example, a first AlGa-based layer 241a1 and a second AlGa-based layer 241a2. And the Al concentration may be different. The first AlGa-based layer 241a1 and the second AlGa-based layer 241a2 may include different materials.

For example, the first AlGa-based layer 241a1 may include $Al_{z1}Ga_{(1-z1)}As$ (0<Z1<1), and the second AlGa-based layer 241a2 may include $Al_{z2}Ga^{(1-z2)}As$ (0<Z2<1), but is not limited thereto.

For example, the second Al concentration of the second AlGa-based layer 241a2 may be higher than that of the first Al of the first AlGa-based layer 241a1. In addition, the delta doped layer 241c may be disposed on the second AlGa-based layer 241a2 having a high Al concentration.

At this time, the Al concentration of $Al_{z2}Ga_{(1-z2)}N$ (0<Z2<1) of the second AlGa-based layer 241a2 may be graded.

For example, the Al concentration of the second AlGa-based layer 241a2 may have the highest Al concentration at its center, and gradually decreases in the growth direction (y-axis direction) or the opposite direction (-y-axis direction).

A manufacturing method of the second embodiment of the second region B shown in FIG. 6A will be described with reference to FIG. 6B.

In the second embodiment, the AlGa-based layer 241a includes a first AlGa-based layer 241a1 having a first Al concentration and a second AlGa-based layer 241a2 having a second Al concentration higher than the first concentration at the center thereof such that the opening area 240 may be formed.

For example, in the second embodiment, the first AlGa-based layer 241a1 may be a first AlGaAs layer having a first Al concentration, and the second AlGa-based layer 241a2 may be a second AlGaN layer having a second Al concentration.

In addition, the second embodiment may include a delta doping layer 241c in the second AlGa-based layer 241a2.

According to the second embodiment, the second AlGa-based layer 241a2 having a high Al concentration is included in the center, and the oxidation process may be predominantly performed in the second AlGa-based layer 241a2 in the x-axis direction. Accordingly, as shown in FIG. 6A, the insulating region 242 may be formed to be thinner in the direction of the aperture 241. For example, in an embodiment, the first thickness T1 in the outer region of the insulating region 242 may be thicker than the second thickness T2 in the inner region adjacent to the aperture 241.

Further, in the second embodiment, when the second AlGa series layer 241a2 includes $Al_zGa_{(1-z)}N$ (0<z<1), the Al concentration of the $Al_zGa_{(1-z)}N$ (0<z<1) can be graded. For example, the Al concentration may be the highest in the central portion of the second AlGa-based layer 241a2 itself, and the Al concentration may gradually decrease in the -y axis direction opposite to the y axis direction.

According to the embodiment, by providing the second AlGa-based layer 241a2 in which the Al concentration is graded, oxidization is predominantly performed at the center thereof, so that sharper edges can be realized.

In some embodiments, the delta doped layer 241c may be disposed on the second AlGa-based layer 241a2.

Accordingly, as the oxidized process is performed after the delta doped layer 241c is formed on the second AlGa-based layer 241a2 in the second embodiment, the delta doped layer 241c exists in the aperture 241 as shown in FIG. 6A. The thickness of the insulating region 242 may be formed in a sharp edge shape toward the aperture 241.

For example, in an embodiment, the first thickness T1 in the outer region of the insulating region 242 may be thicker than the second thickness T2 in the inner region adjacent to the aperture 241.

According to an embodiment, the first thickness T1 in the outer region of the insulating region 242 may be thicker than the second thickness T2 in the inner region. Accordingly, in the embodiment, the second thickness T2 in the inner region adjacent to the aperture 241 of the insulating region 242 is formed to be thinner than the first thickness T1 in the outer region, so that the light in the aperture 241 is reduced. The problem of increasing the divergence angle of the beams can be solved by alleviating the diffraction phenomenon of the beam.

According to the second embodiment, as Al concentration is graded in the second AlGa-based layer 241a2, oxidation may be predominantly performed at the center thereof, and at the same time, delta doping is performed in the second AlGa-based layer 241a2. The layer 241c may be disposed to implement sharper edges.

Accordingly, according to the second embodiment, the second thickness T2 in the inner region adjacent to the aperture 241 of the insulating region 242 is formed to be thinner than the first thickness T1 in the outer region such that light diffraction may be alleviated to increase the divergence angle of beams in aperture 241.

In addition, in the second embodiment, by disposing the delta-doped layer 241c doped with the second conductivity-type element on the aperture 241, current is concentrated in the aperture by current diffusion in the aperture 241. By preventing crowding, it is possible to prevent oscillation in higher mode at the aperture edge. Accordingly, the second embodiment can provide a surface light emitting laser device capable of solving the problem of increasing the divergence angle of beams and a light emitting device including the same.

Next, FIG. 7A is an enlarged view of the third embodiment of the second region B of the surface light emitting laser device according to the embodiment shown in FIG. 2.

The third embodiment may adopt the technical features of the first and second embodiments, and will be described below with reference to the technical features of the third embodiment.

In the third embodiment, the aperture 241 may include a first AlGa-based layer 241a1 and a GaAs-based layer 241a3.

For example, the first AlGa-based layer 241a1 may include $Al_zGa_{(1-z)}As$ (0<z<1), and the GaAs-based layer 241a3 may include a GaAs layer, but is not limited thereto.

In addition, the third embodiment may include a delta doping layer 241c in the GaAs-based layer 241a3.

A manufacturing method of the third embodiment of the second region B shown in FIG. 7A will be described with reference to FIG. 7B.

According to the third embodiment, in order to form the opening region 240, the first AlGa-based layer 241a1 may be included, and a GaAs-based layer 241a3 may be included at the center thereof.

In this case, a delta doped layer 241c may be disposed on the GaAs-based layer 241a3.

According to the third embodiment, the delta doped layer 241c may be disposed on the GaAs-based layer 241a3.

Accordingly, after the delta doped layer 241c is formed on the GaAs-based layer 241a3 in the third embodiment, as the oxidation process proceeds, the delta doped layer 241c is present in the aperture 241 as shown in FIG. 7A. The thickness of the region 242 may be formed in the shape of a sharp edge in the direction of the aperture 241.

For example, in an embodiment, the first thickness T1 in the outer region of the insulating region 242 may be thicker than the second thickness T2 in the inner region adjacent to the aperture 241.

According to an embodiment, the first thickness T1 in the outer region of the insulating region 242 may be thicker than the second thickness T2 in the inner region. Accordingly, in the embodiment, the second thickness T2 in the inner region adjacent to the aperture 241 of the insulating region 242 is formed to be thinner than the first thickness T1 in the outer region, so that the problem of increasing the divergence angle of the beams can be solved by alleviating the diffraction phenomenon of the beam in the aperture 241.

In addition, the third embodiment arranges the delta-doped layer 241c doped with the second conductivity type element in the aperture 241 so that current is concentrated in the aperture by current diffusion in the aperture 241. The third embodiment can provide a surface light emitting laser device capable of solving the problem of increasing the divergence angle of beams by preventing high mode oscillation at the aperture edge by preventing crowding phenomenon and the same.

FIG. 7C is a conceptual diagram of 2DHG (2D hole gas) effect in the second region B of the surface light emitting laser device according to the embodiment illustrated in FIG. 7A.

According to the third embodiment, as shown in FIG. 7A, a GaAs-based layer 241a3 is disposed between the first AlGa-based layers 241a1, thereby forming 2D dimensional hole gas (2DHG) as shown in FIG. 7C to spread current through current spreading and the third embodiment can significantly improve carrier distribution uniformity in the aperture region.

In addition, according to the third embodiment, the GaAs layer, which is the GaAs series layer 241a3, is disposed between the AlGaAs layers, which are the AlGa series layer 241a, to form 2D dimensional hole gas (2DHG), thereby providing current spreading. It is possible to provide a surface light emitting laser device and a light emitting device including the same capable of preventing current crowding at the aperture and preventing higher mode oscillations at the aperture edge, thereby increasing the divergence angle of beams.

FIG. 8A is a fourth embodiment of a second region B of the surface light emitting laser device according to the embodiment shown in FIG. 2, and FIG. 8B is a manufacturing process diagram of the fifth embodiment shown in FIG. 8A.

The fourth embodiment may adopt the technical features of the first to third embodiments, and will be described below with reference to the technical features of the fourth embodiment.

According to the fourth embodiment, the delta doped layer 241c may be disposed in the lower region 241b of the aperture 241.

Referring to FIG. 8B, an AlGa-based layer 241a for forming the opening region 240 is formed on the active region 230, and the doping of the second conductivity type element during the growth of the AlGa-based layer 241a is performed. The delta doped layer 241c may be disposed in the lower region 241b of the AlGa series layer 241a.

The AlGa-based layer 241a may include a material such as $Al_zGa_{(1-z)}As$ (0<z<1), but is not limited thereto. The delta doped layer 241c may be doped with a second conductivity type element, but is not limited thereto. For example, the delta doped layer 241c may be doped with any one or more of Be, Mg, C, and Zn, but is not limited thereto.

According to the fourth embodiment, the delta doped layer 241c doped with the second conductivity type element is disposed in the lower region 241b of the aperture 241 so that the aperture edge can be spread evenly in the aperture 241. The present invention can provide a surface light emitting laser device and a light emitting device including the same capable of generating a uniform light output in the entire aperture according to current diffusion by preventing a current density phenomenon at the aperture edge.

In addition, according to the fourth embodiment, by disposing the delta-doped layer 241c doped with the second conductivity-type element in the lower region 241b of the aperture 241, current can be diffused in the aperture 241, so that current crowding can be prevented in the aperture. Accordingly, the embodiment may prevent current crowding at the aperture edge to prevent higher mode oscillation. Therefore, the embodiment can provide a surface light emitting laser device a light emitting device including the same capable of solving the problem of increasing the divergence angle of beams.

In addition, according to the fourth embodiment, as shown in FIG. 8A, while the delta doping layer 241c is present in the aperture 241, the thickness of the insulating region 242 may be formed to be thinner in the direction of the aperture 241. For example, in an embodiment, the thickness in the outer region of the insulating region 242 may be thicker than the thickness in the inner region adjacent to the aperture 241.

Accordingly, in the embodiment, the insulating region 242 is formed to have a thickness in the inner region adjacent to the aperture 241 to be thinner than that in the outer region, thereby reducing the diffraction phenomenon of light at the aperture 241 to reduce the divergence angle of the beam. It is possible to solve the problem of increasing the divergence angle of beams.

FIG. 10 is a conceptual view of a 2DHG effect in the second region B of the surface light emitting laser device according to the embodiment shown in FIG. 8A, wherein the delta doping layer 241c can be placed between an AlGa-based layer and a p-AlGaAs layer. For example, the second reflection layer 250 may include a p-AlGaAs layer, the second cavity 233 may include a GaAs layer. And the delta doped layer 241c can be disposed between the second cavity 233 and second reflection layer 250 to spread the current through the 2DHG effect.

According to the embodiment, the oxidization rate of the insulating region 242 may be controlled by delta doping of the second conductivity type element to implement sharp edges by selective or predominant oxidation of the delta doped region. As shown in FIG. 8A, a 2D dimensional hole gas (2DHG) is formed by the growth of a delta doping layer (241c) in the lower region 241b of the aperture 241, and the current spreading through the 2DHG is performed such that carrier distribution uniformity can be improved in the aperture region.

Accordingly, according to the fourth embodiment, the delta doped layer 241c doped with the second conductivity type element is disposed in the lower region 241b of the aperture 241 so that the aperture can be spread evenly in the aperture 241. A surface light emitting laser device and a light emitting device including the same capable of improving current injection efficiency by improving current injection efficiency by preventing current condensation at an edge can be provided.

In addition, in the fourth embodiment, the delta-doped layer 241c doped with the second conductivity-type element is disposed in the lower region 241b of the aperture 241 to diffuse current in the aperture 241 such that a higher mode oscillation at the aperture edge can be prevented. Through this, the embodiment can provide a surface light emitting laser device and a light emitting device including the same capable of solving the problem of increasing the divergence angle of beams.

Next, FIG. 9A is a fifth embodiment of the second region B of the surface light emitting laser device according to the embodiment shown in FIG. 2, and FIG. 9B is a manufacturing process diagram of the fifth embodiment shown in FIG. 9A.

The fifth embodiment may adopt the technical features of the first to fourth embodiments, and will be described below with reference to the technical features of the fifth embodiment.

According to the fifth embodiment, the delta doped layer 241c may be disposed in the upper region 241t of the aperture 241.

Referring to FIG. 9B, an AlGa-based layer 241a for forming the opening region 240 is formed on the active region 230, and the doping of the second conductivity type element during the growth of the AlGa-based layer 241a is performed. The delta doped layer 241c may be disposed in the upper region 241t of the AlGa series layer 241a. The AlGa-based layer 241a may include a material such as $Al_zGa_{(1-z)}As$ ($0<z<1$), but is not limited thereto.

FIG. 10 is a conceptual diagram of a 2DHG effect in the second region B of the surface light emitting laser device according to the embodiment shown in FIG. 9A, wherein the delta doping layer 241c can be placed between an AlGa-based p-AlGaAs layer and a GaAs layer. The delta doped layer 241c may be disposed in the upper region 241t of the AlGa series layer 241a.

For example, the second reflection layer 250 may include a p-AlGaAs layer, the second cavity 233 may include a GaAs layer, and the delta doped layer 241c may be disposed between a second reflection layer 250 and the second cavity 233 to spread the current through the 2DHG effect.

According to the fifth embodiment, the stiff edge may be implemented by selective or predominant oxidation of the delta-doped region by controlling the oxidation rate of the insulating region 242 by delta doping of the second conductivity type element. As shown in FIG. 9A, 2D dimensional hole gas (2DHG) is formed in the upper region 241t of the aperture 241 by the growth of a delta doping layer 241c, and current spreading through the 2DHG is performed. As a result, carrier distribution uniformity may be improved in the aperture region.

Accordingly, according to the fifth embodiment, the delta doped layer 241c doped with the second conductivity type element is disposed in the aperture 241 so that even current spreading in the aperture 241 is performed at the edge of the aperture 241. It is possible to provide a surface light emitting laser device and a light emitting device including the same, which may improve current injection efficiency by preventing current condensation of the light, thereby improving light output and voltage efficiency.

In addition, in the fifth embodiment, an aperture edge is formed by the current diffusion in the aperture 241 by placing the delta doped layer 241c doped with the second conductivity type element in the upper region 241t of the aperture 241 such that a surface light emitting laser device and a light emitting device including the same capable of solving a problem of increasing divergence angle of beams by preventing higher mode oscillation at an edge can be provided.

<Second Contact Electrode, Passivation Layer, Second Electrode>

Referring back to FIG. 2, the surface-emitting laser device 200 according to the embodiment can be mesa etched from the second reflection layer 250 to the insulating region 242 and the active region 230 in the region around the aperture 241. In addition, even a part of the first reflection layer 220 may be mesa etched.

A second contact electrode 255 may be disposed on the second reflective layer 250. A region between the second contact electrodes 255 where the second reflective layer 250 is exposed may correspond to the aperture 241.

The second contact electrode 255 may improve contact characteristics between the second reflection layer 250 and the second electrode 280, which will be described later.

In FIG. 2, a passivation layer 270 may be disposed on the side and top surfaces of the mesa-etched light emitting structure and the top surface of the first reflection layer 220. The passivation layer 270 may also be disposed on the side surface of the surface emission laser device 200 separated by device units to protect and insulate the surface emission laser device 200. The passivation layer 270 may be made of an insulating material, for example, nitride or oxide. For example, the passivation layer 270 may include at least one of polymide, silica ($SiO_2$), or silicon nitride ($Si_3N_4$).

The passivation layer 270 may be thinner than the second contact electrode 255 at the top surface of the light emitting structure, and thus the second contact electrode 255 may be exposed to the upper portion of the passivation layer 270. The second electrode 280 may be disposed in electrical contact with the exposed second contact electrode 255. The second electrode 280 extends above the passivation layer 270 to supply current from the outside.

The second electrode 280 may be made of a conductive material, for example, may be a metal. For example, the second electrode 280 may include at least one of aluminum (Al), titanium (Ti), chromium (Cr), nickel (Ni), copper (Cu), and gold (Au).

The embodiment can provide a surface light emitting laser device and a light emitting device including the same, which can solve the problem of increasing the divergence angle of beams by preventing current crowding at the aperture edge to prevent higher mode oscillation.

Embodiments can provide a surface light emitting laser device and a light emitting device including the same, which can prevent current condensation at the aperture edge to produce a uniform light output in the entire aperture area according to current diffusion.

In addition, the embodiment can provide a surface light emitting laser device and a light emitting device including the same that can solve the problem that the diffraction phenomenon of the light at the aperture edge to increase the divergence angle of the beam.

Hereinafter, a method of manufacturing a surface light emitting laser device according to an embodiment will be described with reference to FIGS. 11A through 16, including the method of each embodiment.

First, as shown in FIG. 11A, a light emitting structure including a first reflection layer 220, an active region 230, and a second reflection layer 250 are formed on a substrate 210.

The substrate 210 may be formed of a material suitable for growth of a semiconductor material or a carrier wafer, may be formed of a material having excellent thermal conductivity, and may include a conductive substrate or an insulating substrate.

For example, when the substrate 210 may be a conductive substrate or a non-conductive substrate. As the conductive substrate, a metal having excellent electrical conductivity may be used, and a GaAs substrate, a metal substrate or a silicon (Si) substrate, etc having high thermal conductivity can be used to sufficiently dissipate heat generated when the surface light-emitting laser device 200 is operated.

In addition, when the substrate 210 is a non-conductive substrate, an AlN substrate, a sapphire ($Al_2O_3$) substrate, or a ceramic substrate may be used.

In addition, in the embodiment, a substrate of the same type as the first reflection layer 220 may be used as the substrate 210. For example, when the substrate 210 is a GaAs substrate of the same type as the first reflection layer 220, the lattice constant coincides with the first reflection layer 210, so that a defect such as lattice mismatch does not occur in the first reflection layer 220.

Next, a first reflection layer 220 may be formed on the substrate 210, and FIG. 11B is an enlarged view of the first-second area A2 of the surface light emitting laser device according to the embodiment shown in FIG. 11A.

Hereinafter, a surface light emitting laser device according to an embodiment will be described with reference to FIGS. 11A and 11B.

The first reflection layer 220 may be grown using a chemical vapor deposition method (CVD) or a molecular beam epitaxy (MBE) or a sputtering or hydroxide vapor phase epitaxy (HVPE).

The first reflection layer 220 may be doped with a first conductivity type. For example, the first conductivity type dopant may include an n type dopant such as Si, Ge, Sn, Se, Te, or the like.

The first reflection layer 220 may include a gallium-based compound, for example, AlGaAs, but is not limited thereto. The first reflection layer 220 may be a distributed Bragg reflector (DBR). For example, the first reflection layer 220 may have a structure in which layers made of materials having different refractive indices are alternately stacked at least once.

For example, as shown in FIG. 11B, the first reflection layer 220 includes the first group first reflection layer 221 disposed on the substrate 210 and the second group first reflection layer 222 disposed on the first group first reflection layer 221.

The first group first reflection layer 221 and the second group first reflection layer 222 may include a plurality of layers made of a semiconductor material having a compositional formula of $Al_xGa_{(1-x)}As$ (0<x<1). In addition, when Al in each layer increases, the refractive index of each layer may decrease, and when Ga increases, the refractive index of each layer may increase.

In addition, as shown in FIG. 11B, the first group first reflection layer 221 and the second group first reflection layer 222 may also be formed of a single layer or a plurality of layers, respectively. For example, the first group first reflection layer 221 may include about 30-40 pairs of the first group first-first layer 221a and the first group first-second layer 221b. In addition, the second group first reflection layer 222 may also include about 5 to 15 pairs of the second group first-first layer 222a and the second group first-second layer 222b.

Next, the active region 230 may be formed on the first reflection layer 220.

As illustrated in FIG. 11B, the active region 230 may include an active layer 232, a first cavity 231 disposed under the active layer 232, and a second cavity 233 disposed above the active layer 232. In an embodiment, the active region 230 may include both the first cavity 231 and the second cavity 233, or may include only one of the two.

The active layer 232 may include a well layer 232a and a barrier layer 232b using a compound semiconductor material of a group III-V element. The active layer 232 may be formed in a 1 to 3 pair structure such as InGaAs/AlxGaAs, AlGaInP/GaInP, AlGaAs/AlGaAs, AlGaAs/GaAs, GaAs/InGaAs, but is not limited thereto. Dopants may not be doped in the active layer 232.

The first cavity 231 and the second cavity 233 may be formed of an $Al_yGa_{(1-y)}As$ (0<y<1) material, but is not limited thereto. For example, the first cavity 231 and the second cavity 233 may each include a plurality of layers of $Al_yGa_{(1-y)}As$.

For example, the first cavity 231 may include a first-first cavity layer 231a and a first-second cavity layer 231b. In addition, the second cavity 233 may include a second-first cavity layer 233a and a second-second cavity layer 233b.

Next, an AlGa series layer 241a for forming the opening region 240 may be formed on the active region 230.

In example embodiments, the delta-doped layer 241c may be disposed in the AlGa-based layer 241a by the doping of the second conductivity type element during the growth of the AlGa-based layer 241a. The AlGa-based layer 241a may include a material such as $Al_zGa_{(1-z)}As$ (0<z<1), but is not limited thereto.

The AlGa-based layer 241a may include a conductive material, and may include the same material as the first reflection layer 220 and the second reflection layer 250, but is not limited thereto.

For example, when the AlGa-based layer 241a includes an AlGaAs-based material, the AlGa-based layer 241a is formed of a semiconductor material having a compositional formula of $Al_xGa_{(1-x)}As$ (0<x<1). For example, it may have a composition formula of $Al_{0.98}Ga_{0.02}As$, but is not limited thereto.

Technical features of the AlGa series layer 241a and the delta doped layer 241c will be described later with reference to FIGS. 13A to 13E.

Next, a second reflection layer 250 may be formed on the AlGa-based layer 241a.

The second reflection layer 250 may include a gallium-based compound, for example AlGaAs. For example, each layer of the second reflection layer 250 may include AlGaAs, and in detail, may be formed of a semiconductor material having a compositional formula of $Al_xGa_{(1-x)}As$ (0<x<1).

The second reflection layer 250 may be doped with a second conductivity type dopant. For example, the second conductivity type dopant may be a p-type dopant such as Mg, Zn, Ca, Sr, or Ba. Meanwhile, the first reflection layer 220 may be doped with a p-type dopant, and the second reflection layer 250 may be doped with an n-type dopant.

The second reflection layer 250 may also be a distributed Bragg reflector (DBR). For example, the second reflection layer 250 may have a structure in which a plurality of layers made of materials having different refractive indices are alternately stacked at least once.

For example, the second reflection layer 250 may include the first group second reflecting layer 251 adjacent to the active region 230 in the active region 230 and the second group second reflection layer 252 spaced apart from the first group second reflecting layer 251.

In addition, the first group second reflecting layer 251 and the second group second reflecting layer 252 may be formed of a single layer or a plurality of layers, respectively. For example, the first group second reflection layer 251 may include about 1 to 5 pairs of the first group second-first layer 251a and the first group second-second layer 251b. In addition, the second group second reflection layer 252 may also include about 5 to 15 pairs of the second group second-first layer 252a and the second group second-second layer 252b.

Next, as shown in FIG. 12, the light emitting structure may be mesa-etched using a predetermined mask 300. In this case, the mesa may be etched from the second reflection layer 250 to the AlGa series layer 241a and the active region 230, and may be mesa etched to a part of the first reflection layer 220. In mesa etching, the AlGa-based layer 241a and the active region 230 may be removed from the second reflection layer 250 in the peripheral region by an inductively coupled plasma (ICP) etching method.

Referring to FIG. 12, in the surface light-emitting laser device according to the embodiment, a second region B represents the AlGa-based layer 241a and the delta doped layer 241c. Embodiments for the second area B are shown in FIGS. 13A to 13E and will be described in detail later.

Next, as shown in FIG. 14, the edge region of the AlGa-based layer may be changed to the insulating region 242, and may be changed to, for example, wet oxidation. As a result, the opening region 240 including the insulating region 242 and the aperture 241 which is a non-oxidation region may be formed.

For example, when oxygen is supplied from the edge region of the AlGa-based layer 241a, AlGaAs of the AlGa-based layer may react with $H_2O$ to form aluminum oxide $(Al_2O_3)$. At this time, by adjusting the reaction time, the center region of the AlGa-based layer does not react with oxygen, and only the edge region reacts with oxygen to form an insulating region 242 of aluminum oxide.

In addition, the embodiment may change the edge region of the AlGa based layer into the insulating region 242 through ion implantation, but is not limited thereto. During ion implantation, photons may be supplied with energy of 300 keV or more.

After the reaction process described above, conductive AlGaAs may be disposed in the central region of the opening region 240, and non-conductive $Al_2O_3$ may be disposed in the edge region. AlGaAs in the central region may be defined as the aperture 241 as a portion where the light emitted from the active region 230 proceeds to the upper region.

In this case, referring to FIG. 14, in the surface light emitting laser device according to the embodiment, the second region B includes the insulating region 242 and the delta doped layer 241c, and each embodiment is shown in FIGS. 15A-15E, which will be described below in conjunction with FIGS. 13A-13E.

First, FIGS. 13A and 15A are conceptual views of the first embodiment B1 of the second region B shown in FIGS. 12 and 14.

As shown in FIG. 13A, an AlGa-based layer 241a for forming the opening region 240 is formed on the active region 230, and is doped by a second conductivity type element during the growth of the AlGa-based layer 241a. The delta doped layer 241c may be disposed in the AlGa based layer 241a. The AlGa-based layer 241a may include a material such as $Al_zGa_{(1-z)}As$ (0<z<1), but is not limited thereto.

The delta doped layer 241c may be a delta functional doping with respect to the y-axis direction, which is the growth direction of the AlGa-based layer 241a, and there may be no difference in doping concentration in the x-axis direction, which is the plane direction.

In some embodiments, the delta doped layer 241c may be doped with a second conductivity type element, but is not limited thereto. For example, the delta doped layer 241c may be doped with any one or more of Be, Mg, C, and Zn, but is not limited thereto.

In the embodiment, as the doping concentration increases, oxidation is promoted and the thickness of the oxide layer is increased. Accordingly, when the oxidation process is performed after the delta-doped layer 241c is formed on the AlGa-based layer 241a as shown in FIG. 13A, the x-axis of the insulating region 242 is performed by delta doping of the second conductivity type element as shown in FIG. 15A such that the oxidation rate in the direction can be controlled. Therefore, in an embodiment, a sharp edge can be implemented by selective or dominant oxidation of the delta-doped region.

As shown in FIG. 15A, an inner end of the insulating region 242 may overlap the delta doped layer 241c in a first direction (x-axis direction). In an embodiment, the minimum thickness of the insulating region 242 may be in contact with the delta doped layer 241c.

According to the first embodiment, as shown in FIG. 15A, while the delta doping layer 241c is present in the aperture 241, the thickness of the insulating region 242 may be made thinner in the direction of the aperture 241. For example, in the first embodiment, the first thickness T1 in the outer region of the insulating region 242 may be thicker than the second thickness T2 in the inner region adjacent to the aperture 241.

Accordingly, according to the first embodiment, the insulating region 242 is formed such that the second thickness T2 in the inner region adjacent to the aperture 241 is thinner than the first thickness T1 in the outer region. In 241, light diffraction may be alleviated to increase the divergence angle of beams.

In the first embodiment, the first thickness T1 of the outer region of the insulating region 242 may be about 5 nm to 50 nm. If the thickness of the insulating region 242 is less than 5 nm, problems may occur in current and optical confinement. On the other hand, when the thickness of the insulating region 242 exceeds 50 nm, there is a problem of increasing the driving voltage or increasing the beam divergence angle. In addition, since the thickness of the insulating region 242 is controlled to 10 nm to 30 nm, the effects of current and optical restraint may be further increased, and the problem of increase in the divergence angle of the beam may be minimized.

In an embodiment, the doping concentration of the delta doping layer 241c may be about $1\times10^{16}$ to $1\times10^{20}$ atoms/cm$^3$. When the oxidation process is performed on the AlGa-based layer 241a through the doping concentration in this range, the delta doping layer as the oxidation proceeds preferentially along 241c, the thickness of the insulating region 242 may be formed to be thinner in the direction of the aperture 241 as shown in FIG. 15A.

The doping concentration of the delta doped layer 241c may be $1\times10^{16}$ atoms/cm$^3$ or more, which is a background carrier density, and the deterioration of crystalline quality may occur when the doping concentration of the delta doped layer 241 c exceeds its upper limit, $1\times10^{20}$ atoms/cm$^3$.

In addition, in the embodiment, the doping concentration of the delta doping layer 241c is preferably controlled at about $1\times10^{17}$ to $1\times10^{19}$ atoms/cm$^3$, so that the oxidation region is more preferentially oxidized in the delta doping layer 241 c, so that the inner side has a sharp insulating region. By implementing 242, the diffraction phenomenon of light at the edge of the aperture 241 may be remarkably alleviated to prevent an increase in the divergence angle of the beam, and the crystal quality of the AlGa series layer 241a may be further improved.

In an embodiment, the delta doped layer 241c may be formed in atomic unit thickness, and may be confirmed by an analytical device such as SIMS.

According to the first embodiment, the oxidization rate of the insulating region 242 is controlled by the delta doping of the second conductivity type element, so that the sharp edge is implemented by the selective or predominant oxidation of the delta-doped region. The second thickness T2 in the inner region adjacent to the aperture 241 of the region 242 is formed to be thinner than the first thickness T1 in the outer region, thereby alleviating the diffraction of light in the aperture 241 and the problem of increasing the divergence angle of beams can be solved.

FIGS. 13B and 15B are conceptual views of the second embodiment B2 of the second region B shown in FIGS. 12 and 14.

The second embodiment may adopt the technical features of the first embodiment, and will be described below with reference to the technical features of the second embodiment.

Referring to FIG. 13B, in order to form the opening region 240 according to the second embodiment, the AlGa-based layer 241a includes a first AlGa-based layer 241a1 having a first Al concentration, and is formed at the center thereof. The second AlGa-based layer 241a2 having a second Al concentration higher than one concentration may be included.

For example, in the second embodiment, the first AlGa-based layer 241a1 may be a first AlGaAs layer having a first Al concentration, and the second AlGa-based layer 241a2 may be a second AlGaN layer having a second Al concentration.

In addition, the second embodiment may include a delta doping layer 241c in the second AlGa-based layer 241a2.

According to the second embodiment, the second AlGa-based layer 241a2 having a high Al concentration is included in the center, and the oxidation process may be predominantly performed in the second AlGa-based layer 241a2 in the x-axis direction. Accordingly, as shown in FIG. 15B, the insulating region 242 may be formed to be thinner in the direction of the aperture 241. For example, in an embodiment, the first thickness T1 in the outer region of the insulating region 242 may be thicker than the second thickness T2 in the inner region adjacent to the aperture 241.

Further, in the second embodiment, when the second AlGa series layer 241a2 includes $Al_zGa_{(1-z)}N$ (0<z<1), the Al concentration of the $Al_zGa_{(1-z)}N$ (0<z<1) can be graded. For example, the Al concentration may be the highest in the central portion of the second AlGa-based layer 241a2 itself, and the Al concentration may gradually decrease in the −y axis direction opposite to the y axis direction.

According to the embodiment, by providing the second AlGa-based layer 241a2 in which the Al concentration is graded, oxidization is predominantly performed at the center thereof, so that sharper edges can be realized.

In addition, according to the second embodiment, the delta doped layer 241c may be disposed on the second AlGa-based layer 241a2.

Accordingly, as the oxidized process is performed after the delta doped layer 241c is formed on the second AlGa-based layer 241a2 in the second embodiment, the delta doped layer 241c exists in the aperture 241 as shown in FIG. 15B. The thickness of the insulating region 242 may be formed in a sharp edge shape toward the aperture 241.

For example, in an embodiment, the first thickness T1 in the outer region of the insulating region 242 may be thicker than the second thickness T2 in the inner region adjacent to the aperture 241.

According to an embodiment, the first thickness T1 in the outer region of the insulating region 242 may be thicker than the second thickness T2 in the inner region. Accordingly, in the embodiment, the second thickness T2 in the inner region adjacent to the aperture 241 of the insulating region 242 is formed to be thinner than the first thickness T1 in the outer region, so that the diffraction phenomenon of the light in the aperture 241 can be reduced. The problem of increasing the divergence angle of the beams can be solved by alleviating the diffraction phenomenon of the beam.

According to the second embodiment, as Al concentration is graded in the second AlGa-based layer 241a2, oxidation may be predominantly performed at the center thereof, and at the same time, delta doping is performed in the second AlGa-based layer 241a2. The layer 241c may be disposed to implement sharper edges.

Accordingly, according to the second embodiment, the second thickness T2 in the inner region adjacent to the aperture 241 of the insulating region 242 is formed to be thinner than the first thickness T1 in the outer region such that light diffraction may be alleviated to increase the divergence angle of beams in aperture 241.

In addition, in the second embodiment, by disposing the delta-doped layer 241c doped with the second conductivity-type element on the aperture 241, current is concentrated in the aperture by current diffusion in the aperture 241. By preventing crowding, it is possible to prevent oscillation in higher mode at the aperture edge. Accordingly, the second embodiment can provide a surface light emitting laser device capable of solving the problem of increasing the divergence angle of beams and a light emitting device including the same.

FIGS. 13C and 15C are conceptual views of the third embodiment B3 of the second region B shown in FIGS. 12 and 14.

The third embodiment may adopt the technical features of the first and second embodiments, and will be described below with reference to the technical features of the third embodiment.

According to the third embodiment, in order to form the opening region 240, the first AlGa-based layer 241a1 may be included, and a GaAs-based layer 241a3 may be included at the center thereof.

According to the third embodiment, the delta doped layer 241c may be disposed on the GaAs-based layer 241a3.

Accordingly, after the delta doped layer 241c is formed on the GaAs-based layer 241a3 in the third embodiment, as the oxidation process proceeds, the delta doped layer 241c exists in the aperture 241 as shown in FIG. 15C. The thickness of the region 242 may be formed in the shape of a sharp edge in the direction of the aperture 241.

For example, in the third embodiment, the first thickness T1 in the outer region of the insulating region 242 may be thicker than the second thickness T2 in the inner region adjacent to the aperture 241.

According to the third embodiment, the first thickness T1 in the outer region of the insulating region 242 may be thicker than the second thickness T2 in the inner region. Accordingly, in the third embodiment, the second thickness T2 in the inner region adjacent to the aperture 241 of the insulating region 242 is formed to be thinner than the first thickness T1 in the outer region, thereby opening the aperture 241. The problem of increasing the divergence angle of the beams can be solved by alleviating the diffraction of the light.

In addition, the third embodiment arranges the delta-doped layer 241c doped with the second conductivity type element in the aperture 241 so that current is concentrated in the aperture 241 by current diffusion in the aperture 241. The third embodiment can provide a surface light emitting laser device capable of solving the problem of increasing the divergence angle of beams by preventing high mode oscillation at the aperture edge by preventing crowding phenomenon and the same.

According to the third embodiment, as shown in FIG. 15C, a GaAs-based layer 241a3 is disposed between the first AlGa-based layers 241a1, thereby forming 2D dimensional hole gas (2DHG) as shown in FIG. 7C to spread current through current spreading and the third embodiment can significantly improve carrier distribution uniformity in the aperture region.

In addition, according to the third embodiment, the GaAs layer, which is the GaAs series layer 241a3, is disposed between the AlGaAs layers, which are the AlGa series layer 241a, to form 2D dimensional hole gas (2DHG), thereby providing current spreading. It is possible to provide a surface light emitting laser device and a light emitting device including the same capable of preventing current crowding at the aperture and preventing higher mode oscillations at the aperture edge, thereby increasing the divergence angle of beams.

FIGS. 13D and 15D are conceptual views of the fourth embodiment B4 of the second region B shown in FIGS. 12 and 14.

The fourth embodiment may adopt the technical features of the first to third embodiments, and will be described below with reference to the technical features of the fourth embodiment.

Referring to FIG. 13D, an AlGa-based layer 241a for forming the opening region 240 is formed on the active region 230, and as shown in FIG. 15D, a second conductivity type is formed during the growth of the AlGa-based layer 241a. The delta doped layer 241c may be disposed in the lower region 241b of the AlGa-based layer 241a by the element doping.

The AlGa-based layer 241a may include a material such as $Al_zGa_{(1-z)}As$ (0<z<1), but is not limited thereto. The delta doped layer 241c may be doped with a second conductivity type element, but is not limited thereto. For example, the delta doped layer 241c may be doped with any one or more of Be, Mg, C, and Zn, but is not limited thereto.

According to the fourth embodiment, the delta doped layer 241c doped with the second conductivity type element is disposed in the lower region 241b of the aperture 241 so that the aperture edge can be spread evenly in the aperture 241. The present invention can provide a surface light emitting laser device and a light emitting device including the same capable of generating a uniform light output in the entire aperture according to current diffusion by preventing a current density phenomenon at the aperture edge.

In addition, in the fifth embodiment, an aperture edge is formed by the current diffusion in the aperture 241 by placing the delta doped layer 241c doped with the second conductivity type element in the upper region 241t of the aperture 241 such that a surface light emitting laser device and a light emitting device including the same capable of solving a problem of increasing divergence angle of beams by preventing higher mode oscillation at an edge can be provided.

In addition, according to the fourth embodiment, as shown in FIG. 15D, while the delta doping layer 241c is present in the aperture 241, the thickness of the insulating region 242 may be formed to be thinner in the direction of the aperture 241. For example, in an embodiment, the thickness in the outer region of the insulating region 242 may be thicker than the thickness in the inner region adjacent to the aperture 241.

Accordingly, according to the embodiment, the insulating region 242 has a thickness in the inner region adjacent to the aperture 241 to be thinner than the thickness in the outer region, thereby alleviating the diffraction of light in the aperture 241 to reduce the beam such that the problem of increasing the divergence angle of beams can be solved.

According to the fourth embodiment, the oxidization rate of the insulating region 242 may be controlled by delta doping of the second conductivity type element to implement sharp edges by selective or predominant oxidation of the delta doped region. As shown in FIG. 15D, a 2D dimensional hole gas (2DHG) is formed in the lower region 241b of the aperture 241 by the growth of a delta doping layer 241c, and current spreading through the 2DHG is performed. As a result, carrier distribution uniformity may be improved in the aperture region.

Accordingly, according to the fourth embodiment, the delta doped layer 241c doped with the second conductivity type element is disposed in the aperture 241 so that even current spreading in the aperture 241 is performed at the edge of the aperture 241. It is possible to provide a surface light emitting laser device and a light emitting device including the same, which can improve current injection efficiency by preventing current condensation of the light, thereby improving light output and voltage efficiency.

In addition, in the fourth embodiment, the aperture doped by the current diffusion in the aperture 241 by disposing the delta doped layer 241c doped with the second conductivity type element in the lower region 241b of the aperture 241. A surface light emitting laser device and a light emitting device including the same capable of solving a problem of increasing divergence angle of beams by preventing higher mode oscillation at an edge can be provided.

FIGS. 13E and 15E are conceptual views of the fifth embodiment B5 of the second region B shown in FIGS. 12 and 14.

The fifth embodiment may adopt the technical features of the first to fourth embodiments, and will be described below with reference to the technical features of the fifth embodiment.

Referring to FIG. 13E, an AlGa-based layer 241a for forming the opening region 240 is formed on the active region 230, and the doping of the second conductivity type element during the growth of the AlGa-based layer 241a is performed. The delta doped layer 241c may be disposed in the upper region 241t of the AlGa series layer 241a. The AlGa-based layer 241a may include a material such as $Al_zGa_{(1-z)}As$ (0<z<1), but is not limited thereto.

The delta doped layer 241c may be disposed between the p-AlGaAs layer and the GaAs layer, which are AlGa series layers. The delta doped layer 241c may be disposed in the upper region 241t of the AlGa series layer 241a.

As shown in FIG. 15E, according to the fifth embodiment, the oxidation rate of the insulating region 242 can be controlled by the delta doping of the second conductivity type element so that sharp edges are selected by selective or predominant oxidation of the delta doped region can be implemented.

Accordingly, as shown in FIG. 9A, 2D dimensional hole gas (2DHG) is formed in the upper region 241t of the aperture 241 by the growth of a delta doping layer 241c, and current spreading through 2DHG is performed and may improve carrier distribution uniformity in the aperture region.

According to the fifth embodiment, the delta-doped layer 241c doped with the second conductivity type element is disposed in the aperture 241 so that the current at the edge of the aperture 241 is evenly spread in the aperture 241. It is possible to provide a surface light emitting laser device and a light emitting device including the same, which can improve current injection efficiency by preventing a compaction phenomenon, thereby improving light output and voltage efficiency.

In addition, in the fifth embodiment, an aperture edge is formed by the current diffusion in the aperture 241 by placing the delta doped layer 241c doped with the second conductivity type element in the upper region 241t of the aperture 241. A surface light emitting laser device and a light emitting device including the same capable of solving a problem of increasing divergence angle of beams by preventing higher mode oscillation at an edge can be provided.

Next, as shown in FIG. 16, the second contact electrode 255 may be disposed on the second reflection layer 250, and the second reflection layer 250 is exposed in an area between the second contact electrodes 255. The exposed region may correspond to the aperture 241 which is the central region of the opening region 240 described above. The second contact electrode 255 may improve contact characteristics between the second reflection layer 250 and the second electrode 255, which will be described later.

Next, the passivation layer 270 disposed on the second contact electrode 255 may have a thickness at the top surface of the light emitting structure to be thinner than the second contact electrode 255, where the second contact electrode 255 may be exposed to the top of the passivation layer. 270.

The passivation layer 270 may include at least one of polymide, silica ($SiO_2$), or silicon nitride ($Si_3N_4$).

Next, a second electrode 280 may be disposed in electrical contact with the exposed second contact electrode 255. The second electrode 280 extends above the passivation layer 270 to supply current from the outside.

The second electrode 255 may be made of a conductive material, for example, may be a metal. For example, the second electrode 255 may include at least one of aluminum (Al), titanium (Ti), chromium (Cr), nickel (Ni), copper (Cu), and gold (Au).

In addition, a first electrode 215 may be disposed under the substrate 210. Before disposing the first electrode 215, a portion of the bottom surface of the substrate 210 may be removed through a predetermined grinding process to improve heat dissipation efficiency.

The first electrode 215 may be made of a conductive material, for example, metal. For example, the first electrode 215 may include at least one of aluminum (Al), titanium (Ti), chromium (Cr), nickel (Ni), copper (Cu), and gold (Au).

The above-described semiconductor device may be a laser diode, and two reflection layers may act as resonators. At this time, electrons and holes are supplied to the active layer from the first reflection layer 220 of the first conductivity type and the second reflection layer 250 of the second conductivity type, and the light emitted from the active region 230 is reflected inside the resonator. When amplified and the threshold current is reached, it can be emitted to the outside through the aperture 241 described above.

The light emitted from the semiconductor device according to the embodiment may be light of a single wavelength and a single phase, and the single wavelength region may vary according to the composition of the first reflection layer 220, the second reflection layer 250, and the active region 230.

First Additional Example

A first additional embodiment will now be described. The additional embodiments described below may adopt the technical features of the embodiments described above, and will now be described based on the main features of the additional embodiments.

FIG. 17 is a cross-sectional view of the surface light emitting laser device 202B according to the embodiment, and FIG. 18 is an enlarged view of the first region A1 of the surface light emitting laser device according to the embodiment shown in FIG. 17.

Referring to FIG. 17, the surface light emitting laser device 202 according to the embodiment may include a first electrode 215, a substrate 210, a first reflection layer 220, an active layer 232, an aperture region 240, an second reflection layer 250 and a second electrode 280. The aperture region 240 may include an aperture 241 and a first insulating layer 242b. The first insulating layer 242b may be referred to as an oxide layer, and the aperture region 240 may be referred to as an oxide region or an opening region, but is not limited thereto.

In addition, the embodiment may include an AlGa-based transition layer 242 and a second insulating layer 242e. The AlGa series transition layer 242 may include a first AlGa series transition layer 242a1 and a second AlGa series transition layer 242a2. The second insulating layer 242e may include a second-first insulating layer 242e1 and a second-second insulating layer 242e2.

For example, referring to FIG. 17, the surface light emitting laser device 202 according to the embodiment includes a first reflection layer 220, an active layer 232 disposed on the first reflection layer 220, an aperture region 240 having a first insulating layer 242b and an aperture 241 disposed on the active layer 232, a second reflection layer 250 disposed on the aperture region 240, and an AlGa series transition layer 242 disposed between the active layer 232 and the second reflection layer 250 and having an Al composition graded, and a second insulating layer 242e disposed between the active layer 232 and the second reflection layer 250. The embodiment may further include a second contact electrode 255 and a passivation layer 270.

Hereinafter, technical features of the surface light emitting laser device 202 according to the embodiment will be described with reference to FIG. 17 and subsequent drawings. In the drawings of the embodiment, the direction of the x-axis may be a direction parallel to the longitudinal direction of the substrate 210, the y-axis may be a direction perpendicular to the x-axis.

FIG. 18 is an enlarged view of the first area A1 of the surface light emitting laser device according to the embodiment shown in FIG. 17.

In an embodiment, the substrate 210, the first electrode 215, the first reflection layer 220, the second reflection layer 250, the active layer 232, the cavities 231 and 233, the contact electrodes 255, and the passivation layer 270 may adopt the technical features of the embodiments described above.

<Aperture Region, AlGa Series Transition Layer and Insulation Region>

Referring to FIG. 17, in an embodiment, the aperture region 240 may include a first insulating layer 242b and an aperture 241. The aperture region 240 may be referred to as an opening region or an oxidation region.

The first insulating layer 242b may be formed of an insulating layer, for example, aluminum oxide, to serve as a current blocking region, and an aperture 241 may be defined by the first insulating layer 242b.

For example, when the aperture region 240 includes aluminum gallium arsenide (AlGaAs), the AlGaAs material at the edge of the aperture region 240 reacts with $H_2O$ and the edge changes to aluminum oxide ($Al_2O_3$), and the first insulating region 242b can be formed. In addition, the central region of the opening region that does not react with $H_2O$ may be an aperture 241 made of AlGaAs.

According to an embodiment, the light emitted from the active layer 232 through the aperture 241 may be emitted to the upper region, and the light transmittance of the aperture 241 may be superior to that of the first insulating layer 242b.

Referring to FIG. 18 again, the first insulating layer 242b may include a plurality of layers, for example, the first-first insulating layer 242b1 and the first-second insulating layer 242b2. The first-first insulating layer 242b1 may have the same thickness as or different from the first-second insulating layer 242b2.

On the other hand, one of the technical problems of the embodiment is to provide a surface light emitting laser device and a light emitting device including the same that can solve the problem of beam divergence angle of beams becoming increased.

In addition, one of the technical problems in the embodiment is to provide a surface light emitting laser device and a light emitting device including the same that can prevent the current crowding phenomenon at the aperture edge.

Hereinafter, technical features of the present invention for solving the technical problem will be described in detail with reference to FIGS. 19A to 25.

FIG. 19A is a first enlarged view of a second area A2B of the surface light emitting laser device according to the embodiment shown in FIG. 17.

Referring to FIG. 19A, the embodiment can include an AlGa-based transition layer 242 disposed on the active layer 232 and graded with an Al composition. In addition, the embodiment may include a second insulating layer 242e disposed between the active layer 232 and the second reflective layer 250. Through this, the embodiment has a technical effect capable of solving the problem of increasing the divergence angle of beams.

In addition, the embodiment includes an AlGa-type transition layer 242 and a second insulating layer 242e to which the Al composition is graded, so it is possible to provide a surface light emitting laser device and a light emitting device including the same capable of improving reliability by improving crystal quality at the aperture edge, thereby providing uniform light output in the entire aperture area.

Specifically, referring to FIG. 19A, the second insulating layer 242e extends from the end of the first insulating layer 242b toward the aperture 241 and is disposed on the first insulating layer 242b. In an embodiment, the second insulating layer 242e may be an insulating layer in which a part of the AlGa series transition layer 242 is oxidized.

In this case, the AlGa series transition layer 242 may include a first AlGa series transition layer 242a1 disposed above the first insulating layer 242b. In addition, the AlGa series transition layer 242 may include a second AlGa series transition layer 242a2 disposed under the first insulating layer 242b.

In addition, in the embodiment, the second insulating layer 242e may include a second-first insulating layer 242e1 disposed above the first insulating layer 242b. The second-1 insulating layer 242e1 may be an insulating layer in which a part of the first AlGa series transition layer 242a1 is oxidized.

In addition, the second insulating layer 242e may further include a second-second insulating layer 242e2 disposed under the first insulating layer 242b. The second-second insulating layer 242e2 may be an insulating layer in which a portion of the second AlGa-based transition layer 242a2 is oxidized.

In addition, in the embodiment, the second reflection layer 250 may include a third insulating layer 243 disposed at an inner side from the outside of the second reflection layer 250 by a predetermined distance. The third insulating layer 243 is an insulating part in which an outer part of the first group second-second layer 251b and an outer part of the second group second-second layer 252b are oxidized in the second reflection layer 250.

FIG. 19B is an enlarged photograph of a third area A3 of the second area A2B of the surface light-emitting laser device according to the embodiment shown in FIG. 19A. The second insulating layer 242e includes a second-first insulating layer 242e1 disposed above the first insulating layer 242b and a second-second insulating layer 242e2 disposed below the first insulating layer 242b. In addition, the second reflective layer 250 may include a third insulating layer 243 disposed at a predetermined distance from the outer to the inner side of the second reflective layer 250.

Referring back to FIG. 19A, in the embodiment, a second AlGa-based transition layer 242a2 and a first AlGa-based transition layer 242a1 are formed before and after the first insulating layer 242b, which is an oxide layer, as an Al grading layer.

Through this, the second-second insulating layer 242e2 and the second-first insulating layer 242e1 may be formed before and after the high Al oxide layer from the MESA etching interface as shown in FIG. 19B. The second-second insulating layer 242e2 and the second-first insulating layer 242e1 may be oxide layers in which a part of the second AlGa-based transition layer 242a2 and the first AlGa-based transition layer 242a1 are oxidized.

FIG. 20 is a partially enlarged view of the surface light emitting laser device according to the related art.

According to the related art, in the case of the DBR layers 51 and 52 having a high A1 composition of 88% or more in the p-DBR, which is the second reflection layer 50, as shown in FIG. 20, the second reflection layer 50 is formed at the mesa (MESA) etching interface. A portion of the outer insulating layer 43 is oxidized, and the outer insulating layer 43 has a defect (DL) due to a thickness of 50 nm or more and stress due to oxidation.

These defects DL may affect the oxidation layer 42b defining the aperture 41, so that cracks may be generated due to oxidation layer damage.

In particular, in order to reduce the beam divergence, a thin oxidation layer 42b should be formed. There is a technical contradiction in that the thinner the oxide layer 42b, the greater the damage caused by the defect DL.

Accordingly, in the related art, when the oxide layer 42b is formed thick, an abrupt interface AI may occur in the boundary region with the aperture 41. Such an abrupt oxide layer interface AI has a problem of increasing the divergence angle than the design value.

For example, FIGS. 21A and 21B illustrate a near field image and a far field spectrum of a surface light emitting laser device according to the related art.

Referring to FIG. 21A, as the defects give damage to the oxidation layer 42b, the crystal quality of the oxide layer 42b defining the aperture 41 is degraded by current confinement, thereby reducing electrical reliability. There is a problem that the higher mode is further induced when a high current is applied.

Referring to FIG. 21B, as the oxide layer 42b includes an abrupt interface AI in the related art, the divergence angle of beams increases to about 29°.

FIGS. 22A and 22B are near field images and far field spectrums of the surface light emitting laser device according to the embodiment.

Referring to FIGS. 22A and 19A, a second insulating layer 242e extends from the end of the first insulating layer 242b toward the aperture 241 and is formed on the first insulating layer 242b. As second insulating layer 242e is disposed, the defects DL are blocked from being extended to the first insulating layer 242b, which is an oxide layer defining the aperture 241, by the current confinement, thereby protecting the first insulating layer 242b. The crystal quality of the layer 242b can be maintained or improved compared to the conventional one, so that the electrical reliability is improved, such that it is possible to stop accelerating to a higher mode even when a high current is applied.

Also, referring to FIGS. 22A and 19A, the second insulating layer 242e extends from the end of the first insulating layer 242b in the direction of the aperture 241 so as to be on the first insulating layer 242b. The thickness of the first insulating layer on the inner side may be thinner than the outside according to the degree of oxygen supply during the oxidation process by supplying oxygen inward from the mesa etching interface as it is disposed on the first insulating layer. The interface between the first insulating layer 242b at the boundary between 242b and the aperture 241 may be sharp. According to the embodiment, the divergence angle may be prevented from being increased by such a rough interface SI of the first insulating layer 242b. For example, referring to FIG. 22A, as the first insulating layer 242b includes a sharp interface SI, a divergence angle of beams may be controlled to about 21°.

In addition, referring to FIG. 22B, as the second insulating layer 242e extends from the end of the first insulating layer 242b toward the aperture 241 and is disposed on the first insulating layer 242b. In addition, the crystal quality of the first insulating layer 242b can be maintained or improved compared to the existing one, and in particular, the crystal quality of the aperture 241 can be maintained or improved. In the present invention, a surface light emitting laser device capable of producing a uniform light output and a light emitting device including the same can be provided.

FIG. 23 is an enlarged view illustrating the composition of the fourth region A4 of the surface light emitting laser device according to the embodiment shown in FIG. 19A, and FIG. 24 is a second enlarged view A22 of the second area A2B of the surface light emitting laser device according to the embodiment shown in FIG. 17.

In an embodiment, the second insulating layer 242e extends a predetermined distance from the end of the first insulating layer 242b toward the aperture 241 and is disposed on the first insulating layer 242b. It is possible to solve the problem of increasing the divergence angle of the beam at the aperture edge, and to improve the reliability by improving the crystal quality of the first insulating layer 242b and the aperture 241 at the aperture edge such that there is a complex technical effect that can produce a light output by improving uniformity in the entire aperture area.

In an embodiment, the length of the second insulating layer 242e may be controlled according to the Al composition of the AlGa series transition layer 242. The AlGa series transition layer 242 may have an $Al_xGa_{1-x}As$ composition.

First, referring to FIG. 23, the composition of Al in the first AlGa series transition layer 242a1 may be graded in the range of 0.01 to 0.99. For example, the composition of Al in the first AlGa series transition layer 242a1 may be graded in a first range (12% to 80%) of 0.12 to 0.80. For example, the composition of Al in the first AlGa series transition layer 242a1 may be reduced in the first range of 0.80 to 0.12 in the direction of the first group second-first layer 251a in the active layer 232.

In addition, the composition of Al in the second AlGa series transition layer 242a2 may be graded in the range of 0.01 to 0.99. For example, the composition of Al in the second AlGa series transition layer 242a2 may be graded in a second range of 0.30 to 0.65. For example, the composition of Al in the second AlGa series transition layer 242a2 may be graded in the second range of 0.30 to 0.65 in the direction of the first group second-first layer 251a in the active layer 232.

Accordingly, in the embodiment, the second composition range graded in the second AlGa series transition layer 242a2 may be within the first composition range of Al graded in the first AlGa series transition layer 242a1.

According to an embodiment, the composition of Al in the aperture 241 region may be about 0.99, but is not limited thereto. The composition of Al in the first group second-first layer 251a may be 0.12, but is not limited thereto. no.

Accordingly, referring to FIG. 24, the second-first length L21 of the second-first insulating layer 242e1 may be controlled to be shorter than the first length L1 of the first insulating layer 242b. The second-second length L22 of the second-second insulating layer 242e2 may be controlled to be shorter than the second-first length L21 of the second-first insulating layer 242e1.

In addition, the second-first length L21 of the second-first insulating layer 242e1 may be controlled to be less than or equal to the remained length L1r of the first length L1 of the first insulating layer 242b.

For example, the second-first length L21 of the second-first insulating layer 242e1 is 0.1 to 1 times of the remained length L1r of the first length L1 of the first insulating layer 242b.

In addition, the second-first length L21 of the second-first insulating layer 242e1 may be longer than the third length L3 of the third insulating layer 243. For example, second lengths L21 and L22 of the second insulating layer 242e may be greater than five times or less than a third length L3 of the third insulating layer 243.

The second-first length L21 of the second-first insulating layer 242e1 may be 0.5 to 10 μm, but is not limited thereto.

In an embodiment, the second-first insulating layer 242e1 extends from the end of the first insulating layer 242b in the direction of the aperture 241 by a second-first length L21 so that the second-first insulating layer 242e1 is disposed on the first insulating layer 242b. Accordingly, by effectively blocking defects (DL), the crystal quality of the first insulating layer 242b and the aperture 241 at the aperture edge is improved, and reliability also is improved to produce a uniform light output over the entire aperture area. In addition, the embodiment can solve the problem of increasing the divergence angle of the beam at the aperture edge by controlling the first insulating layer 242b to a sharp interface (SI) at the interface between the first insulating layer 242b and the aperture 241.

In an embodiment, when the second-first length L21 of the second-first insulating layer 242e1 is longer than the remained length L1r of the first insulating layer 242b, the beam divergence may be increased. If the second-first length L21 of the second-first insulating layer 242e1 is shorter than the third length L3 of the third insulating layer 243, the protection function from the defect DL may be weakened.

Next, FIG. 25 is a third enlarged view A23 of the second area A2B of the surface light emitting laser device according to the embodiment shown in FIG. 17.

In an embodiment, the second-first thickness T21 of the second-first insulating layer 242e1 may be thinner than the first thickness T1 of the first insulating layer 242b. The second-second thickness T22 of the second-second insulating layer 242e2 may be thinner than the first thickness T1 of the first insulating layer 242b. The first thickness T1 of the first insulating layer 242b may be about 5 nm to about 50 nm, but is not limited thereto.

In addition, the first thickness T1 of the first insulating layer 242b may be thinner than the third thickness T3 of the third insulating layer 243.

In an embodiment, the first insulating layer 242b may be positioned at the node position NP of the laser oscillated by the active layer 232 to reduce the beam divergence.

In addition, the second insulating layer 242e may be positioned at the node position of the laser oscillated by the active layer 232 to reduce the beam divergence.

In an embodiment, when the second-second thickness T22 of the second-second insulating layer 242e2 is thicker than the second-first thickness T21 of the second-first insulating layer 242e1, the insulating region 242 is closer to the optical node position (NP), which has a technical effect of reducing beam divergence.

In addition, when the second-first thickness T21 of the second-first insulating layer 242e1 is thicker than the second-second thickness T22 of the second-second insulating layer 242e2, there is an effect of protecting the insulating layer 242b from defects DL.

Accordingly, the second-first thickness T21 of the second-first insulating layer 242e1 may be controlled to be 0.2 to 3 times than the second-second thickness T22 of the second-second insulating layer 242e2.

The thickness of the second insulating layer 242e may range from 1 nm to 150 nm, but is not limited thereto.

In an embodiment, the first insulating layer 242b or the second insulating layer 242e may be located between about 100 nm to about 250 nm from the top of the active layer 232.

The embodiment can provide a surface light emitting laser device and a light emitting device including the same, which can solve the problem of increasing the divergence angle of a beam at an aperture edge.

For example, as the second insulating layer 242e extends from the end of the first insulating layer 242b toward the aperture 241 and is disposed on the first insulating layer 242b, the first insulating layer 242e is insulated from the first insulating layer 242b. The interface between the first insulating layer 242b at the boundary between the layer 242b and the aperture 241 may be sharp, and the divergence angle may be prevented from being increased by the sharp interface SI.

In addition, the embodiment can provide a surface light emitting laser device and a light emitting device including the same that can improve the reliability by improving the crystal quality at the aperture edge to give a uniform light output in the entire aperture area.

Also, for example, as the second insulating layer 242e extends from the end of the first insulating layer 242b toward the aperture 241 and is disposed on the first insulating layer 242b, the crystal quality of the insulating layer 242b can be maintained or improved compared to the existing one, and in particular, the crystal quality of the aperture 241 can be maintained or improved, so that not only the aperture edge but also the entire aperture including the center can be uniform.

In addition, the embodiment may solve the problem of increasing the divergence angle of beams by preventing current crowding at the aperture edge to prevent higher mode oscillation.

For example, as the second insulating layer 242e extends from the end of the first insulating layer 242b toward the aperture 241 and is disposed on the first insulating layer 242b, the expansion of the defects DL to the first insulating layer 242b, which is an oxide layer defining the aperture 241, can be blocked by the current confinement so that the first insulating layer 242b is protected. The quality can be maintained or improved compared to the conventional one, so that the electrical reliability is improved, and therefore, acceleration in a higher mode even when a high current is applied can be prevented than in the related art.

In an embodiment, the second insulating layer 242e extends a predetermined distance from the end of the first insulating layer 242b toward the aperture 241 and is disposed on the first insulating layer 242b. It is possible to solve the problem of increasing the divergence angle of the beam at the aperture edge, and to improve the reliability by improving the crystal quality of the first insulating layer 242b and the aperture 241 at the aperture edge, thereby improving uniformity in the entire aperture area and producing an excellent light output.

<Package>

Next, FIG. 26 is a surface light emitting laser package to which the surface light emitting laser device according to the embodiment is applied.

Referring to FIG. 26, the surface light emitting laser package 100 according to the embodiment may include a housing 110, a surface light emitting laser device 201, and a diffusion unit 140. For example, the surface emitting laser package 100 according to the embodiment includes a housing 110 having a cavity C, a surface light emitting laser device 201, a housing 110 disposed in the cavity C and a diffusion unit 140 disposed on the housing 110.

The surface light emitting laser device 201 may be applied to the surface light emitting laser device 202B according to the above-described embodiment.

The housing 110 of the embodiment may comprise a single or a plurality of bodies. For example, the housing 110 may include a first body 110a, a second body 110b, and a third body 110c. The second body 110b may be disposed on the first body 110a, and the third body 110c may be disposed on the second body 110b.

Next, the embodiment may include a first electrode part 181 and a second electrode part 182. The first electrode part 181 and the second electrode part 182 may be disposed in the housing 110. In detail, the first electrode 181 and the second electrode 182 may be spaced apart from each other on the upper surface of the first body 110a. The surface light emitting laser device 201 may be electrically connected to the second electrode part 182 by a predetermined wire 187.

In addition, the embodiment may include a third electrode part 183 and a fourth electrode part 184 spaced apart from the lower side of the first body 110a, and also a fifth electrode part 185 and a sixth electrode part 186 penetrating the first body 110a.

In an embodiment, the housing 110 may include a seating part 110bt in which the diffusion part 140 is disposed. For example, a portion of the upper surface of the second body 110b may function as a seating portion 110bt. The embodiment may include an adhesive member 155 disposed between the seating portion 110bt and the diffusion portion 140 of the housing 110.

Next, in the embodiment, the diffusion part 140 may include a glass layer 141 having a first thickness and a polymer layer 145 having a second thickness and disposed on the glass layer 141. Although the polymer layer 145 is illustrated below the glass layer 141 in FIG. 26, the polymer layer 145 may be disposed above the glass layer 141 in the manufacturing process by a printing process. The polymer layer 145 may include a pattern including a curved surface, and the pattern may be regular or irregular. In addition, the pattern may be absent in the contact portion of the adhesive member 155, and may be formed in a relatively flat surface than the pattern.

<Flip Chip Type Surface Emitting Laser Device>

Next, FIG. 27 is another sectional view of the surface emitting laser device 202C according to the embodiment.

The surface light emitting laser device according to the embodiment can be applied to the flip chip type surface light emitting laser device shown in FIG. 27.

In addition to the vertical type, the surface emitting laser device according to the embodiment may be a flip chip type in which the first electrode 215 and the second electrode 282 face the same direction as shown in FIG. 27.

For example, the flip chip type surface emitting laser device 202C illustrated in FIG. 27 may include a first electrode part 215 and 217, a substrate 210, a first reflection layer 220, an active layer 232, and an aperture region 240, the second reflection layer 250, the second electrode parts 280 and 282, the first passivation layer 271, the second passivation layer 272, and the anti-reflection layer 290. In this case, the reflectance of the second reflecting layer 250 may be designed to be higher than that of the first reflecting layer 220.

In addition, the flip chip type surface emitting laser device is disposed between the active layer 232 and the second reflection layer 250, and an AlGa-based transition layer (not shown) and an active layer 232 and the second layer, which are graded Al composition. The second insulating layer 242e may be disposed between the reflection layers 250.

In this case, the first electrode portions 215 and 217 may include a first electrode 215 and a first pad electrode 217. The first electrode 215 may be electrically connected to the first reflective layer 220 exposed through a predetermined mesa process, and the first pad electrode 217 may be electrically connected to the first electrode 215.

The first electrode parts 215 and 217 may be made of a conductive material, for example, metal. For example, the first electrode 215 may include at least one of aluminum (Al), titanium (Ti), chromium (Cr), nickel (Ni), copper (Cu), and gold (Au). The first electrode 215 and the first pad electrode 217 may include the same metal or different metals.

When the first reflection layer 220 is an n-type reflection layer, the first electrode 215 may be an electrode for the n-type reflection layer.

The second electrode parts 280 and 282 may include a second electrode 282 and a second pad electrode 280, and the second electrode 282 is electrically connected to the second reflection layer 250. The second pad electrode 280 may be electrically connected to the second electrode 282.

When the second reflection layer 250 is a p-type reflection layer, the second electrode 282 may be a p-type electrode.

The second electrode according to the above-described embodiment may be equally applied to the second electrode 282 of the flip chip surface light emitting laser device.

The first insulating layer 271 and the second insulating layer 272 may be made of an insulating material, for example, may be formed of nitride or oxide, for example, polyimide, silica ($SiO_2$), or it may include at least one of silicon nitride ($Si_3N_4$).

Second Additional Embodiment

Accordingly, a surface light emitting laser device according to a second additional embodiment will be described.

The second additional embodiment may adopt the technical features of the above-described embodiments and the first additional embodiments, and will be described below with reference to the main features of the second additional embodiment. In addition, the first to fifth embodiments described below are descriptions of technical features different from those described above.

FIG. 28 is a cross-sectional view of the surface light emitting laser device according to the second additional embodiment.

Referring to FIG. 28, in a second additional embodiment, the surface light emitting laser device 203 may include a first electrode 215, a substrate 210, a first reflection layer 220, a light emitting layer 230, an oxide layer 240, a second reflection layer 250, a passivation layer 270, and a second electrode 280.

The oxide layer 240 may include an opening 241 and an insulating region 242. The opening 241 may be a passage area through which current flows. The insulating region 242 may be a blocking region that blocks the flow of current. The insulating region 242 may be referred to as an oxide layer or an oxide layer.

The oxide layer 240 may be referred to as a current confinement layer because it restricts the flow or density of the current to emit a more coherent laser beam.

The second electrode 280 may include a contact electrode 282 and a pad electrode 284.

FIG. 29 is an enlarged cross-sectional view of the first portion B13 of the surface light emitting laser device according to the embodiment shown in FIG. 28.

Hereinafter, technical features of the surface light emitting laser device 203 according to the embodiment will be described with reference to FIGS. 28 and 29. In the drawings of the embodiment, the direction of the x-axis may be a direction parallel to the longitudinal direction of the substrate 210, the y-axis may be a direction perpendicular to the x-axis.

In a second additional embodiment, the substrate 210, the first electrode 215, the first reflection layer 220, the second reflection layer 250, the active layer 232, the cavities 231 and 233, the second contact electrode 255, and the passivation layer 270 may adopt the technical features of the embodiments described above.

<Oxide Layer>

The surface light emitting laser device according to the embodiment may provide the oxide layer 240. The oxide layer 240 may include an insulating region 242 and an opening 241. The insulating region 242 may surround the opening 241. For example, the opening 241 may be disposed on the first area (center area) of the light emitting layer 230, and the insulating area 242 may be disposed on the second area (edge area) of the light emitting layer 230. The second region may surround the first region.

The opening 241 may be a passage area through which current flows. The insulating region 242 may be a blocking region that blocks the flow of current. The insulating region 242 may be referred to as an oxide layer or an oxide layer.

The amount of current supplied from the second electrode 280 to the light emitting layer 230, that is, the current density may be determined by the size of the opening 241. The size of the opening 241 may be determined by the insulating region 242. As the size of the insulating region 242 increases, the size of the opening 241 decreases, and accordingly, the current density supplied to the light emitting layer 230 may increase. In addition, the opening 241 may be a passage through which the beam generated in the light emitting layer 230 travels in an upward direction, that is, in a direction of the second reflection layer 250. That is, the divergence angle of the beam of the light emitting layer 230 may vary according to the size of the opening 241.

The insulating region 242 may be formed of an insulating layer, for example, aluminum oxide ($Al_2O_3$). For example, when the oxide layer 240 includes aluminum gallium arsenide (AlGaAs), AlGaAs of the oxide layer 240 reacts with $H_2O$ to change its edge into aluminum oxide ($Al_2O_3$) to form an insulating region 242. The central region that does not react with $H_2O$ may be an opening 241 including AlGaAs.

According to the embodiment, the light emitted from the light emitting layer 230 through the opening 241 may be emitted to the upper region, and the light transmittance of the opening 241 may be excellent compared to the insulating region 242.

Referring to FIG. 29, the insulation region 242 may include a plurality of layers. For example, the insulation region 242 may be formed on the first insulation region 242a and the first insulation region 242a. The second insulating region 242b and the third insulating region 242c may be disposed between the second insulating region 242b. One insulating region of the first to third insulating regions 242a, 242b, and 242c may have the same thickness or different thickness as the other insulating region. The first to third insulating regions 242a, 242b, and 242c may include at least an oxidation material. The first to third insulating regions 242a, 242b, and 242c may include at least a group 3-5 or a group 2-6 compound semiconductor material.

A technical effect of the surface light emitting laser device 203C according to the embodiment will be described in detail with reference to FIGS. 30 and 31.

FIG. 30 is first distribution data of refractive index and light energy in the surface light emitting laser device 203C according to the embodiment.

According to the embodiment, the distribution E of the light energy emitted from the surface light emitting laser device has a maximum value around the light emitting layer 230, as shown in FIG. 30, and the predetermined distance increases from the light emitting layer 230 and can be reduced by the period. Meanwhile, in the embodiment, the light energy distribution E is not limited to the distribution data shown in FIG. 30, and the light energy distribution in each layer may be different from that shown in FIG. 30 by the composition, thickness, etc. of each layer.

Referring to FIG. 30, the surface light emitting laser device 203C according to the second embodiment may include the first reflection layer 220, the second reflection layer 250, and the light emitting layer 230 be disposed between the first reflection layer 220 and the second reflection layer 250. In this case, in the surface light emitting laser device 203C according to the second embodiment, refractive index n of the material of each of the first reflection layer 220, the light emitting layer 230, and the second reflection layer 250 may be the same as shown in the refractive index n is shown in FIG. 30, but is not limited to.

One of the technical problems of the embodiment is to provide a surface light emitting laser device capable of improving the light output by minimizing the influence of the carrier barrier caused by the generation of an electric field in the reflection layer.

Referring to FIG. 30, the light energy distribution E according to the position of the surface light emitting laser device 203C according to the embodiment may be recognized. As described above, the light energy distribution (E) is relatively spaced apart from the light emitting layer 230 can be lowered. The second embodiment controls the concentration of the first conductivity type dopant in the first group first reflection layer 221 to be higher than the dopant concentration in the second group first reflection layer 222 in consideration of the light energy distribution (E).

For example, as shown in FIG. 29, in the embodiment, the first reflection layer 220 includes a first group first reflection layer 221 and a second group first reflection layer 222 on the first group first reflection layer 221. The second group first reflection layer 222 can be disposed closer to the light emitting layer 230.

In this case, the light energy of the second group first reflection layer 222 disposed adjacent to the light emitting layer 230 is higher than the light energy of the first group first reflection layer 221.

The embodiment controls the concentration of the first conductivity type dopant in the second group first reflection layer 222 to be lower than the dopant concentration in the first group first reflection layer 221 in consideration of the light energy distribution E, The first conductivity type dopant may be relatively doped in the region of the first group first reflection layer 221 where the light energy is relatively low. Accordingly, in the second group first reflection layer 222, the light absorption by the dopant is minimized to improve the light output, and in the first group first reflection layer 221, the voltage efficiency is improved by improving the resistance by the relatively high dopant. There is a peculiar technical effect that can provide a surface light emitting laser device capable of improving light output and voltage efficiency at the same time.

For example, the concentration of the first conductivity type dopant in the first group first reflection layer 221 may be about 2.00E18 and the concentration of the second group first reflection layer 222 may be about 1.00E18, but is not limited thereto.

In addition, in the embodiment, the second reflection layer 250 may be formed to include the first group second reflection layer 251 disposed adjacent to the light emitting layer 230 and the second group second reflection layer 252 be spaced apart from light emitting layer 230.

In this case, the light energy of the first group second reflection layer 251 disposed adjacent to the light emitting layer 230 is higher than the light energy of the second group second reflection layer 252.

Accordingly, the embodiment can control the concentration of the second conductivity type dopant in the first group second reflection layer 251 to be lower than the dopant concentration in the second group second reflection layer 252 in consideration of the light energy distribution, The second conductivity type dopant may be relatively doped in the region of the second group second reflection layer 252 where the light energy is relatively low. Accordingly, in the first group second reflection layer 251, the light absorption by the dopant is minimized to improve the light output, and in the second group second reflection layer 252, the voltage efficiency is improved by the resistance improvement by the dopant. There is a specific technical effect that can provide a surface light emitting laser device and a light emitting device including the same that can improve the light output and voltage efficiency at the same time.

In the embodiment, in consideration of the light energy distribution (E), the doping concentration can be lowered in the region where the light energy is high, and the doping concentration is controlled in the region where the light energy is low. It is possible to provide a surface light emitting laser device and a light emitting device including the same that can minimize the light output to improve the light output.

Next, one of the technical problems of the embodiment is to provide a surface light emitting laser device capable of improving the light output by minimizing the influence of the carrier barrier caused by the generation of an electric field in the reflection layer.

Referring back to FIG. 30, in the surface light emitting laser device according to the embodiment, the distribution of light energy (E) according to the position can be recognized. As the relative distance from the light emitting layer 230 is relatively reduced, the light energy distribution is lowered. In consideration of the energy distribution, the concentration of the first conductivity type dopant in the first group second reflection layer 251 may be controlled to be lower than that of the dopant concentration in the second group second reflection layer 252.

For example, the concentration of the first conductivity type dopant in the first group second reflection layer 251 may be about 7.00E17 to 1.50E18 and the concentration of the first conductivity type dopant in the second group second reflection layer 252 may be about 1.00E18 to 3.00E18. In an embodiment, the concentration unit 1.00E18 may mean $1.00 \times 10^{18}$ (atoms/cm$^3$). In an embodiment, the p-type dopant may be C (Carbon), but is not limited thereto.

Accordingly, the embodiment controls the concentration of the second conductivity type dopant in the second group second reflection layer 252 to be higher than the concentration of the dopant in the first group second reflection layer 251 and has a relatively high light energy. By relatively low doping the second conductivity type dopant in the region of the group second reflection layer 251, the first group second reflection layer 251 minimizes light absorption by the dopant, thereby improving light output and making the second group agent. In the second reflection layer 252, a surface light emitting laser device capable of simultaneously improving light output and voltage efficiency by improving voltage efficiency by improving resistance by a relatively high dopant.

Next, FIG. 32 is a cross-sectional view of the surface light emitting laser device 203 according to the embodiment, FIG. 33 shows a band gap that varies depending on whether In is added or not in the embodiment, and FIG. 34 shows the current density according to the embodiment.

FIG. 32 is an enlarged view of the opening 241 and the insulating region 242 of the surface light emitting laser device illustrated in FIG. 28.

The embodiment may be the same as the above-described embodiment except for the opening 241 and the insulating region 242.

Referring to FIG. 32, the surface light emitting laser device 203 according to the embodiment may provide an oxide layer 240. The oxide layer 240 may include an insulating region 242 and an opening 241. The insulating region 242 may surround the opening 241. For example, the opening 241 may be disposed on the first area (center area) of the light emitting layer 230, and the insulating area 242 may be disposed on the second area (edge area) of the light emitting layer 230. The second region may surround the first region.

The opening 241 may be a passage area through which current flows. The insulating region 242 may be a blocking region that blocks the flow of current. The amount of current supplied from the second electrode 280 to the light emitting layer 230, that is, the current density may be determined by the size of the opening 241. Since the size of the oxide layer 240 is fixed, the size of the opening 241 may be determined by the size of the insulating region 242. That is, as the size of the insulating region 242 increases, the size of the opening 241 decreases, and accordingly, the current density supplied to the light emitting layer 230 may increase. In addition, the opening 241 may be a passage through which the beam generated in the light emitting layer 230 travels in an upward direction, that is, in a direction of the second reflection layer 250. That is, the divergence angle of the beam of the light emitting layer 230 may vary according to the size of the opening 241.

Opening 241 may include a semiconductor material, such as a Group 3-5 or Group 2-6 compound semiconductor material.

The insulating region 242 may be referred to as an oxide layer or an oxidation layer. The insulating region 242 may include an oxidizing material. The insulating region 242 may be formed of an insulating layer, for example, aluminum oxide ($Al_2O_3$).

The insulating region 242 may be formed by oxidizing the opening 241. For example, when the oxide layer 240 includes aluminum gallium arsenide (AlGaAs), the edge of the oxide layer 240 is changed to aluminum oxide ($Al_2O_3$) through an oxidation process in which AlGaAs of the oxide layer 240 reacts with $H_2O$. It may be formed as an insulating region 242. In addition, a central region that does not react with $H_2O$ may be formed as an opening 241 including AlGaAs. During the oxidation process, $H_2O$ and AlGaAs penetrated through the side of the oxide layer 240 may be oxidized and converted into aluminum oxide ($Al_2O_3$). Therefore, the penetration depth of $H_2O$ varies depending on the thickness of the oxide layer 240, the type or composition of the oxide layer 240, and thus, the size of the insulating region 242 changed to aluminum oxide ($Al_2O_3$) may vary.

According to the embodiment, the light emitted from the light emitting layer 230 may be emitted to the upper region through the opening 241, and the light transmittance of the opening 241 may be excellent compared to the insulating region 242.

The opening 241 may include a plurality of layers. For example, the opening 241 may include a first semiconductor region 241a, a second semiconductor region 241b and a second semiconductor region disposed on the first semiconductor region 241a. It may include a third semiconductor region 241c disposed on the 241b. The first semiconductor region 241a may be in contact with the top surface of the light emitting layer 230, and the third semiconductor region 241c may be in contact with the bottom surface of the second reflection layer 250, but the embodiment is not limited thereto.

The insulating region 242 may include a plurality of layers. For example, the insulating region 242 may include a first insulating region 242a and a second insulating region 242b disposed on the first insulating region 242a, and a third insulating region 24c disposed between the second insulating region 242b. The first insulating region 242a may be in contact with the top surface of the light emitting layer 230, and the third insulating region 242c may be in contact with the bottom surface of the second reflection layer 250, but is not limited thereto.

The first insulating region 242a of the insulating region 242 may surround the first semiconductor region 241a of the opening 241. The second insulating region 242b of the insulating region 242 may surround the second semiconductor region 241b of the opening 241. The third insulating region 242c of the insulating region 242 may surround the third semiconductor region 241c of the opening 241.

For example, the first insulating region 242a and the first semiconductor region 241a are referred to as a first oxide layer, the second insulating region 242b and the second semiconductor region 241b are referred to as a second oxide layer, and the third insulating region 242c and the third semiconductor region 241c may be referred to as a third oxide layer. Accordingly, the oxide layer 240 may include a first oxide layer, a second oxide layer disposed on the first oxide layer, and a third oxide layer disposed on the second oxide layer. The embodiment is not limited thereto, and a plurality of oxide layers 240 may be provided.

For example, a first semiconductor layer including, for example, a first semiconductor material is formed on the entire region of the first oxide layer, and an edge region of the first semiconductor layer is oxidized through an oxidation process to be defined as the first insulating region 242a and is oxidized. An unoxidized center region may be defined as the first semiconductor region 241a. For example, a second semiconductor layer including, for example, a second semiconductor material is formed on the entire region of the second oxide layer, and an edge region of the second semiconductor layer is oxidized through an oxidation process to be defined as the second insulating region 242b and is oxidized. An unoxidized center region may be defined as the second semiconductor region 241b. For example, a third semiconductor layer including, for example, a third semiconductor material is formed over the entire region of the third oxide layer, and an edge region of the third semiconductor layer is oxidized through an oxidation process to define the third insulating region 242c and to oxidize it. An unoxidized center region may be defined as the third semiconductor region 241c.

According to the embodiment, the oxide layer 240 is composed of a plurality of layers, for example, the first to third oxide layer, so that the stress of the oxide layer generated when the oxide layer is composed of a single layer can be alleviated.

In the first semiconductor region 241a, the second semiconductor region 241b, and the third semiconductor region 241c, the thickness, the concentration, or the size may be the same.

In example embodiments, each of the first to third semiconductor regions 241a, 241b, and 241c may have the same thickness.

In example embodiments, the thickness of the second semiconductor region 241b may be smaller than the thickness of the first semiconductor region 241a or the thickness of the third semiconductor region 241c. For example, the ratio of the thicknesses of the first to third semiconductor regions 241a, 241b, and 241c may be 1:0.3:1 to 1:1:1. For example, the thickness of each of the first semiconductor region 241a and the third semiconductor region 241c may be about 10 nm, and the thickness of the second semiconductor region 241b may be about 3 nm to about 10 nm.

The thickness of the first semiconductor region 241a may be larger or smaller than the thickness of the third semiconductor region 241c.

As described above, the first semiconductor layer is partially oxidized to form the first semiconductor region 241a and the first insulating region 242a, and the second semiconductor layer is partially oxidized to form the second semiconductor region 241b and the second insulating region 242b, and the third semiconductor layer may be partially oxidized to form the third semiconductor region 241c and the third insulating region 242c. Therefore, the thickness of the first insulating region 242a is the same as the thickness of the first semiconductor region 241a, the thickness of the second insulating region 242b is the same as the thickness of the second semiconductor region 241b, and the third thickness of the insulating region 242c may be the same as the thickness of the third semiconductor region 241c.

In example embodiments, concentrations of the first to third semiconductor regions 241a, 241b, and 241c may be different. In detail, the Al concentration of each of the first to third semiconductor regions 241a, 241b, and 241c may be different. For example, the Al concentration of the second semiconductor region 241b is lower than that of each of the first semiconductor region 241a and the third semiconductor region 241c, and the Al concentration of the first semiconductor region 241a may be higher than the Al concentration of the third semiconductor region 241c.

For example, when each of the first to third semiconductor regions 241a, 241b, and 241c includes AlGaAs, the Al concentration of each of the first semiconductor region 241a and the third semiconductor region 241c is 0.9 or more and 0.99 or less. The Al concentration of the second semiconductor region 241b may be 0.8 or more and 0.9 or less.

In detail, the Al concentration of the first semiconductor region 241a may be 0.99, the Al concentration of the second semiconductor region 241b may be 0.84, and the Al concentration of the third semiconductor region 241c may be 0.98.

In general, the higher the Al concentration, the easier the $H_2O$ to penetrate from the side surfaces of the first to third semiconductor layers.

In FIG. 32, since the Al concentrations of the first semiconductor region 241a and the third semiconductor region 241c are the same, and the penetration depth of $H_2O$ is the same, each size of the first insulating region 242a and the third insulating region 242c may be the same. As described above, when the Al concentration (0.99) of the first semiconductor region 241a is higher than the Al concentration (0.98) of the third semiconductor region 241c, the size of the first semiconductor region 241a may be larger than the size of the third semiconductor region 241c. The size may be referred to as the width.

Since the size of each of the first to third insulating regions 242a, 242b, and 242c is determined by the Al concentration of each of the first to third semiconductor regions 241a, 241b, and 241c, as shown in FIG. 32. Each of the first insulating region 242a and the third insulating region 242c having a high concentration may be larger than the size of the second insulating region 242b having a low Al concentration.

The diameter of each of the first to third semiconductor regions 241a, 241b, and 241c may be determined by the size of each of the first to third insulating regions 242a, 242b, and 242c.

Since the size of each of the first insulating region 242a and the third insulating region 242c having a high Al concentration is large, the first semiconductor region 241a and the third insulating layer disposed on the same layer as the first insulating region 242a are provided. The diameter D1 of each of the third semiconductor regions 241c disposed on the same layer as the region 242c is small. Since the size of the second insulating region 242b having a low Al concentration is small, the diameter D2 of the second semiconductor region 241b disposed on the same layer as the second insulating region 242b is large. Therefore, the diameter D2 of the second semiconductor region 241b may be larger than the diameter D1 of each of the first semiconductor region 241a and the third semiconductor region 241c.

From the perspective of the first to third semiconductor regions 241a, 241b, and 241c, the second semiconductor region 241b extends outward from an end of the first semiconductor region 241a or the third semiconductor region 241c may protrude. The protruding region of the second semiconductor region 241b may not vertically overlap the first semiconductor region 241a or the third semiconductor region 241c. The protruding regions of the second semiconductor regions 241b may vertically overlap with portions of the first or third insulating regions 242a and 242c.

From the perspective of the first to third insulating regions 242a, 242b, and 242c, the first insulating region 242a or the third insulating region 242c may move inward from the inner end of the second insulating region 242b and can protrude along. Accordingly, the protruding regions of each of the first and third insulating regions 242a and 242c overlap each other perpendicularly, and the protruding regions of each of the first and third insulating regions 242a and 242c are formed of the second semiconductor region 241b. The protruding region of the first insulating region 242a or the third insulating region 242c may not overlap with the second insulating region 242b.

The outer surfaces of the first to third insulating regions 242a, 242b and 242c may be vertically aligned, and the inner surfaces of the first to third insulating regions 242a, 242b and 242c may not vertically coincide. Side surfaces of the first to third semiconductor regions 241a, 241b, and 241c may not vertically coincide with each other. The side surface of the first semiconductor region 241a is in contact with the inner surface of the first insulating region 242a, and the side surface of the second semiconductor region 241b is in contact with the inner surface of the second insulating region 242b. Side surfaces of the semiconductor region 241c may contact inner surfaces of the third insulating region 242c.

As shown in FIG. 34, when a current flows into the second reflection layer 250, the light emitting layer 230, and the first reflection layer 220, the diameter D2 of the second semiconductor region 241b is determined by the first semiconductor region. Since it is larger than the diameter D2 of the first semiconductor region 241a or the third semiconductor region 241c, the diameter D2 is larger than the diameter D1 of the third semiconductor region 241c after the current passes through the third semiconductor region 241c. Part of the current flows in the first semiconductor region 241a along the vertical direction, and the other part of the current flows in the in-plane direction of the second semiconductor region 241b and can flow along the outward direction. As a result, the current density can be suppressed by preventing the current from dense in the opening 241.

As shown in FIG. 33A, the band gaps of the first to third semiconductor regions 241a, 241b, and 241c may be different. The band gap may vary depending on the Al concentration included in the first to third semiconductor regions 241a, 241b, and 241c.

For example, as the Al concentration increases, the band gap may increase. As described above, since the Al concentration of the second semiconductor region 241b is smaller than the Al concentration of the first semiconductor region 241a or the Al concentration of the third semiconductor region 241c, the band of the second semiconductor region 241b may be smaller than the band gap of the first semiconductor region 241a or the band gap of the third semiconductor region 241c.

Accordingly, the second semiconductor region 241b having a small band gap is disposed between the first semiconductor region 241a and the third semiconductor region 241c having a large band gap, thereby forming the first to third semiconductor regions of the oxide layer 240. Current concentration at 241a, 241b and 241c can be relaxed and the diffraction effect can be reduced. In addition, the shrinkage stress is alleviated by such a sandwich structure. The sandwich structure is that the second semiconductor region 241b having a small band gap is disposed between the first semiconductor region 241a and the third semiconductor region 241c having a large band gap. The deterioration of the laser beam emission characteristics can be prevented due to the bending characteristics of the surface-emitting laser device.

As shown in FIG. 33B, In (indium) may be added to the second semiconductor region 241b to make the band gap relatively smaller. As In is added, the band gap may be reduced. An In concentration added to the second semiconductor region 241b may be 0.05 or more and 0.18 or less, but is not limited thereto. For example, the In concentration added to the second semiconductor region 241b may be 0.1.

As shown in FIG. 33B, In is added to the second semiconductor region 241b as compared with the case where In is not added to the second semiconductor region 241b as shown in FIG. 33A, the bandgap can be made smaller by a predetermined width Δ.

Therefore, when In is added to the second semiconductor region 241b to further reduce the band gap, as illustrated in FIG. 34, the first carrier, that is, the hole generated in the second reflection layer 250, is formed in the third semiconductor region. The second semiconductor region 241b may move along the transverse direction via 241c. Accordingly, the current may not only flow to the light emitting layer 230 via the first semiconductor region 241a along the vertical direction in the second semiconductor region 241b but may also flow along the transverse direction in the second semiconductor region 241b. That is, since the current is distributed in the vertical direction and the lateral direction in the second semiconductor region 241b, the current density phenomenon in which the current is concentrated along the aperture edge can be alleviated.

Next, FIG. 35 is a cross-sectional view of the surface light emitting laser device according to the fourth embodiment, FIG. 36 shows a band gap which varies depending on whether In is added or not in the fourth embodiment, and FIG. 37 shows the fourth embodiment according to the fourth embodiment showing the current density.

FIG. 35 is an enlarged view of the opening 241 and the insulating region 242 of the surface light emitting laser device illustrated in FIG. 28.

The fourth embodiment may be the same as the first to third embodiments except for the opening 241 and the insulating region 242. In particular, in the fourth embodiment, the thicknesses, concentrations, or sizes of the first to third semiconductor regions 241a, 241b, and 241c and the first to third insulating regions 242a, 242b, and 242c of the oxide layer 240 may differ from those of the third embodiment.

In the fourth embodiment, components having the same structure, shape, and/or function as those in the first to third embodiments are denoted by the same reference numerals and detailed description thereof will be omitted. Technical matters omitted in the following description can be easily understood from the above-described first to third embodiments.

Referring to FIG. 35, the surface light emitting laser device 204 according to the fourth embodiment may provide an oxide layer 240. The oxide layer 240 may include an insulating region 242 and an opening 241.

The oxide layer 240 may be composed of a plurality of layers. That is, the insulating region 242 may be composed of a plurality of insulating regions, and the opening 241 may be composed of a plurality of semiconductor regions.

For example, the oxide layer 240 may include first to third oxide layers. The first oxide layer may be disposed on the light emitting layer 230, the second oxide layer may be disposed on the first oxide layer, and the third oxide layer may be disposed on the second oxide layer. The first oxide layer may be in contact with the top surface of the light emitting layer 230, but is not limited thereto. The third oxide layer may be in contact with the bottom surface of the second reflection layer 250, but is not limited thereto.

The opening 241 may include a first semiconductor region 241a, a second semiconductor region 241b, and a third semiconductor region 241c. The insulation region 242 may include a first insulation region 242a, a second insulation region 242b, and a third insulation region 242c.

The first semiconductor region 241a and the first insulating region 242a may be disposed on the same layer to be defined as a first oxide layer. The second semiconductor region 241b and the second insulating region 242b may be disposed on the same layer to be defined as a second oxide layer. The third semiconductor region 241c and the third insulating region 242c may be disposed on the same layer to be defined as a third oxide layer.

According to the fourth embodiment, since the oxide layer 240 is composed of a plurality of layers, for example, the first to third oxide layers, the shrinkage stress of the oxide layer generated when the oxide layer is composed of a single layer can be alleviated.

In the first semiconductor region 241a, the second semiconductor region 241b, and the third semiconductor region 241c, the thickness, the concentration, or the size may or may not be the same.

According to the fourth embodiment, each of the first to third semiconductor regions 241a, 241b, and 241c may have the same thickness.

According to the fourth embodiment, the thickness of the first semiconductor region 241a or the thickness of the third semiconductor region 241c may be smaller than the thickness of the second semiconductor region 241b. For example, the ratio of the thicknesses of the first to third semiconductor regions 241a, 241b, and 241c may be 0.3:1:0.3 to 1:1:1. For example, the thickness of each of the second semiconductor regions 241b may be 10 nm, and the thickness of the first semiconductor region 241a or the third semiconductor region 241c may be about 3 nm to about 10 nm.

According to the fourth embodiment, the concentration of each of the first to third semiconductor regions 241a, 241b, and 241c may be different. For example, the Al concentration of the second semiconductor region 241b is higher than the Al concentration of each of the first semiconductor region 241a and the third semiconductor region 241c, and the Al concentration of the first semiconductor region 241a is the third semiconductor region. It may be the same as or different from the Al concentration of third semiconductor region 241c.

For example, when each of the first to third semiconductor regions 241a, 241b, and 241c includes AlGaAs, the Al concentration of each of the first semiconductor region 241a and the third semiconductor region 241c is 0.8 or more and less than 0.9, The Al concentration of the second semiconductor region 241b may be 0.9 or more and 0.99 or less.

In detail, the Al concentration of the first semiconductor region 241a may be 0.84, the Al concentration of the second semiconductor region 241b may be 0.99, and the Al concentration of the third semiconductor region 241c may be 0.84.

In general, the higher the Al concentration, the easier the $H_2O$ to penetrate from the side surfaces of the first to third semiconductor layers.

In FIG. 35, since the Al concentrations of the first semiconductor region 241a and the third semiconductor region 241c are the same, and the penetration depth of $H_2O$ is the same, each size of the first insulating region 242a and the third insulating region formed as a result of oxidation may be the same. As described above, when the Al concentration (0.99) of the second semiconductor region 241b is higher than the Al concentration (0.84) of each of the first and third semiconductor regions 241a and 241c, the second semiconductor region 241b may be larger than the size of each of the first and third semiconductor regions 241a and 241c.

When the outer surfaces of the first to third insulating regions 242a, 242b, and 242c vertically coincide with each other, the inner surface of the second semiconductor region 241b may be formed in each of the first and third semiconductor regions 241a and 241c. The second semiconductor region 241b may protrude in the inward direction from the side.

Since the size of each of the first to third insulating regions 242a, 242b, and 242c is determined by the Al concentration of each of the first to third semiconductor regions 241a, 241b, and 241c, as shown in FIG. 35. Each size of the second insulating region 242b having a high concentration may be larger than that of the first or third insulating regions 242a and 242c having a low Al concentration.

The diameter of each of the first to third semiconductor regions 241a, 241b, and 241c may be determined by the size of each of the first to third insulating regions 242a, 242b, and 242c.

Since the size of each of the second insulating regions 242b having a high Al concentration is large, the diameter D1 of the second semiconductor region 241b is small. Since the size of the first or third insulating regions 242a and 242c having a low Al concentration is small, the diameter D2 of the first or semiconductor regions 241a and 241c is large. Therefore, the diameter D2 of the first or semiconductor regions 241a and 241c may be larger than the diameter D1 of the second semiconductor region 241b.

From the perspective of the first to third semiconductor regions 241a, 241b and 241c, the first or third semiconductor regions 241a and 241c may protrude in an outward direction from an end of the second semiconductor region 241b. Therefore, the protruding region of the first semiconductor region 241a and the protruding region of the third semiconductor region 241c overlap vertically, and the protruding region of the first or third semiconductor regions 241a and 241c may not overlap vertically with the second semiconductor region 241b. The protruding regions of the first or semiconductor regions 241a and 241c may vertically overlap with a portion of the second insulating region 242b.

In view of the first to third insulating regions 242a, 242b, and 242c, the second insulating region 242b may protrude along an inner direction from an inner end of the first or third insulating regions 242a and 242c. The protruding regions of the second insulating regions 242b may not vertically overlap with the first or third insulating regions 242a and 242c. The protruding regions of the second insulating regions 242b may overlap the protruding regions of the first or semiconductor regions 241a and 241c.

The side surface of the first semiconductor region 241a is in contact with the inner surface of the first insulating region 242a, and the side surface of the second semiconductor region 241b is in contact with the inner surface of the second insulating region 242b. Side surfaces of the semiconductor region 241c may contact inner surfaces of the third insulating region 242c.

As shown in FIG. 36A, the band gaps of the first to third semiconductor regions 241a, 241b, and 241c may be different. The band gap may vary depending on the Al concentration included in the first to third semiconductor regions 241a, 241b, and 241c.

For example, as the Al concentration increases, the band gap may increase. As described above, since the Al concentration of the first or semiconductor regions 241a and 241c is smaller than the Al concentration of the second semiconductor region 241b, the band gap of the Al concentration of the first or semiconductor regions 241a and 241c may be smaller than the band gap of the second semiconductor region 241b.

Therefore, the first or the semiconductor regions 241a and 241c having a small band gap are disposed between the second semiconductor regions 241b having a large band gap, whereby the first to third semiconductor regions of the oxide layer 240 are formed. The current concentration at third semiconductor region 241c can be relaxed and the diffraction effect can be reduced. In addition, the shrinkage stress is alleviated by such a sandwich structure in which the first or the semiconductor regions 241a and 241c having a small band gap are disposed between the second semiconductor regions 241b with a large band gap and thereby deterioration of the laser beam emission characteristic can be prevented due to the bending characteristic.

As shown in FIG. 36B, in order to make the band gap relatively smaller, In may be added to the first or semiconductor regions 241a and 241c, for example. As In is added, the band gap may be reduced. The In concentration added to the first or semiconductor regions 241a and 241c may be 0.05 or more and 0.18 or less, but is not limited thereto. For example, the In concentration added to the first or semiconductor regions 241a and 241c may be 0.1.

As shown in FIG. 36B, the first or third semiconductor regions 241a and 241c are compared with the case where In is not added to the first or third semiconductor regions 241a and 241c as shown in FIG. 36A. By adding In, the bandgap can be made smaller by a predetermined width Δ.

Therefore, when In is added to the first or third semiconductor regions 241a and 241c so that the band gap becomes smaller, as shown in FIG. 37, holes generated in the second reflection layer 250 are transferred to the third semiconductor region 241c and may be moved along the lateral direction in the first semiconductor region 241a. Accordingly, the current may not only flow to the light emitting layer 230 along the vertical direction, but may also flow along the transverse direction in the first or semiconductor regions 241a and 241c. That is, since current is distributed in the vertical direction and the transverse direction in the first or third semiconductor regions 241a and 241c, the current density phenomenon in which the current is concentrated along the aperture edge can be alleviated.

Next, FIG. 38 is a cross-sectional view of the surface light emitting laser device according to the fifth embodiment, FIG. 39 shows the flow of holes in the fifth embodiment, and FIG. 40 shows the degree of current density according to the fifth embodiment.

FIG. 38 is an enlarged view of the opening 241 and the insulating region 242 of the surface light emitting laser device illustrated in FIG. 28.

The fifth embodiment may be the same as the first to fourth embodiments except for the opening 241 and the insulating region 242. In particular, the shapes of the first to third semiconductor regions 241a, 241b and 241c and the first to third insulating regions 242a, 242b and 242c of the oxide layer 240 are different from those of the third embodiment in the fifth embodiment.

In the fifth embodiment, components having the same structure, shape, and/or function as those in the first to third embodiments are denoted by the same reference numerals and detailed description thereof will be omitted. Technical matters omitted in the following description can be easily understood from the above-described first to fourth embodiments.

Referring to FIG. 38, the surface light emitting laser device 205 according to the fifth embodiment may provide an oxide layer 240. The oxide layer 240 may include an insulating region 242 and an opening 241.

The oxide layer 240 may be composed of a plurality of layers. That is, the insulating region 242 may be composed of a plurality of insulating regions, and the opening 241 may be composed of a plurality of semiconductor regions.

For example, the oxide layer 240 may include first to third oxide layers. The first oxide layer may be disposed on the light emitting layer 230, the second oxide layer may be disposed on the first oxide layer, and the third oxide layer may be disposed on the second oxide layer. The first oxide layer may be in contact with the top surface of the light emitting layer 230, but is not limited thereto. The third oxide layer may be in contact with the bottom surface of the second reflection layer 250, but is not limited thereto.

According to the fifth embodiment, the Al concentration of the second semiconductor region 241b is lower than the Al concentration of each of the first semiconductor region 241a and the third semiconductor region 241c, and the Al concentration of the first semiconductor region 241a may be higher than the Al concentration of the third semiconductor region 241c.

For example, when each of the first to third semiconductor regions 241a, 241b, and 241c includes AlGaAs, the Al concentration of each of the first semiconductor region 241a and the third semiconductor region 241c is 0.9 or more and 0.99 or less. The Al concentration of the second semiconductor region 241b may be 0.8 or more and 0.9 or less.

The higher the Al concentration, the deeper the penetration depth of $H_2O$. Therefore, the size of the first or third semiconductor regions 241a and 241c having a high Al concentration may be smaller than that of the second semiconductor region 241b having a low Al concentration.

Since the size of each of the first to third insulating regions 242a, 242b, and 242c is determined by the Al concentration of each of the first to third semiconductor regions 241a, 241b, and 241c, the first or third Al concentration is high. Each of the third insulating regions 242a and 242c may have a size larger than that of the second insulating region 242b having a low Al concentration.

The diameter of each of the first to third semiconductor regions 241a, 241b, and 241c may be determined by the size of each of the first to third insulating regions 242a, 242b, and 242c.

The diameter of the second semiconductor region 241b may be larger than the diameter of each of the first semiconductor region 241a and the third semiconductor region 241c.

From the perspective of the first to third semiconductor regions 241a, 241b, and 241c, the second semiconductor region 241b extends outward from an end of the first semiconductor region 241a or the third semiconductor region 241c and may protrude. Therefore, the protruding region of the second semiconductor region 241b may not overlap with the first semiconductor region 241a or the third semiconductor region 241c.

From the perspective of the first to third insulating regions 242a, 242b, and 242c, the first insulating region 242a or the third insulating region 242c may move inward from the inner end of the second insulating region 242b and can protrude along. Accordingly, the protruding region of the first insulating region 242a and the protruding region of the third insulating region 242c vertically overlap each other, and the protruding region of the first insulating region 242a or the third insulating region 242c is formed in a first direction.

Meanwhile, according to the fifth embodiment, the first oxide layer and/or the third oxide layer may include an Al concentration varying in grading. For example, the Al concentration of the first oxide layer may increase linearly or nonlinearly in the direction of the second reflection layer 250 in the first light emitting layer 230. For example, the Al concentration of the third oxide layer may increase linearly or nonlinearly toward the second reflection layer 250 in the light emitting layer 230.

When the oxidation process of the first to third oxide layers having such an Al concentration distribution is performed, as the Al concentration increases in the first or third oxide layer, the first insulating region 242a is formed in the first oxide layer. And the inner end of the third insulating region 242c formed from the third oxide layer are obstructed regions first interference area 241_1 and second interference area 241_2 that protrude gradually inward from the light emitting layer 230 toward the second reflection layer 250. That is, the shape of the first oxide layer gradually protrudes inward from the light emitting layer 230 toward the second reflection layer 250 in the inner region of the first insulating region 242a in contact with the first semiconductor region 241a. It may have a first disturbance area 241_1. The third oxide layer has a shape that gradually protrudes inwardly toward the inner side of the third insulating region 242c in contact with the third semiconductor region 241c toward the second reflection layer 250 from the light emitting layer 230.

Referring to FIGS. 39 and 40, holes generated in the second reflection layer 250 are formed through the third semiconductor region 241c by the second interference region 242_2 of the third insulating region 242c. In addition, the holes moved to the second semiconductor region 241b are suppressed from moving to the light emitting layer 230 via the first semiconductor region 241a by the first interference region 242_1 of the first insulating region 242a. In addition, holes moved to the second semiconductor region 241b may be dispersed and moved in the horizontal direction as well as in the vertical direction. As such, since the movement of holes is suppressed at the edge of the opening 241 of the oxide layer 240 and the holes are dispersed in the vertical direction and the transverse direction, current density is prevented and the divergence angle of the beam does not change, so the output of the precise laser beam is achieved.

Meanwhile, the interference regions 241_1 and 241_2 according to the fifth embodiment may also be formed in the second semiconductor region 241b described in the fourth embodiment (FIGS. 35 to 37). To this end, in the fourth embodiment, an inner end of the second insulating region 242b surrounding the second semiconductor region 241b gradually obstructs the inner side toward the second reflection layer 250 from the light emitting layer 230.

INDUSTRIAL APPLICABILITY

FIG. 41 is a perspective view of a mobile terminal to which a surface light emitting laser device is applied according to an embodiment.

As illustrated in FIG. 41, the mobile terminal 1500 of the embodiment may include a camera module 1520, a flash module 1530, and an auto focusing device 1510 provided at a rear surface thereof. Here, the auto focus device 1510 may include one of packages of the surface light emitting laser device according to the above-described embodiment as a light emitting unit.

The flash module 1530 may include a light emitting device that emits light therein. The flash module 1530 may be operated by camera operation of a mobile terminal or control of a user.

The camera module 1520 may include an image capturing function and an auto focus function. For example, the camera module 1520 may include an auto focus function using an image.

The auto focus device 1510 may include an auto focus function using a laser. The auto focus device 1510 may be mainly used in a condition in which the auto focus function using the image of the camera module 1520 is degraded, for example, a proximity or a dark environment of 10 m or less. The auto focus device 1510 may include a light emitting unit including a vertical cavity surface emitting laser (VCSEL) semiconductor device, and a light receiving unit converting light energy such as a photodiode into electrical energy.

Features, structures, effects, etc. described in the above embodiments are included in at least one embodiment, but are not necessarily limited to one embodiment. Furthermore, the features, structures, effects, and the like illustrated in the embodiments may be combined or modified with respect to other embodiments by those skilled in the art to which the embodiments belong. Therefore, it should be interpreted that the contents related to this combination and modification are included in the scope of the embodiments.

Although the above description has been made with reference to the embodiments, these are merely examples and are not intended to limit the embodiments, and those of ordinary skill in the art to which the embodiments pertain may have various examples that are not illustrated above without departing from the essential characteristics of the embodiments. It will be appreciated that eggplant modifications and applications are possible. For example, each component specifically shown in the embodiment can be modified. And differences relating to these modifications and applications will have to be construed as being included in the scope of the embodiments set out in the appended claims.

The invention claimed is:

1. A surface light emitting laser device comprising:
a first electrode;
a substrate disposed on the first electrode;
a first reflection layer disposed on the substrate;
an active region disposed on the first reflection layer and including a cavity;
an opening region disposed on the active region and including an aperture and an insulating region;
a second reflection layer disposed on the opening region;
a second electrode disposed on the second reflection layer; and
a delta doping layer disposed in the opening region,
wherein a thickness of the insulating region becomes thinner into the aperture direction,
wherein the delta doped layer is disposed in the aperture,
wherein the aperture includes first AlGa-based layers and a second AlGa-based layer, the second AlGa-based layer is disposed between the first AlGa-based layers, and a second Al concentration of the second AlGa-based layer is higher than a first Al concentration of the first AlGa-based layers, and wherein the delta doped layer is disposed directly on the second AlGa-based layer, and is different from the first and second AlGa-based layers.

2. The surface light emitting laser device according to claim 1, wherein a first thickness in an outer region of the insulating region is thicker than a second thickness in an inner region adjacent to the aperture.

3. The surface light emitting laser device according to claim 1, wherein an inner end of the insulating region overlaps with the delta doping layer in a first direction, and
wherein a minimum thickness of the insulating region is in contact with the delta doped layer.

4. The surface light emitting laser device according to claim 1, wherein the insulating region comprises a first insulating layer and a second insulating layer disposed on the first insulating layer.

5. The surface light emitting laser device according to claim 4, wherein the second insulating layer includes a first sublayer disposed in a second upper region of the first insulating layer.

6. The surface light emitting laser device according to claim 5, wherein a second length of the first sublayer is shorter than a first length of the first insulating layer.

7. The surface light emitting laser device according to claim 6, wherein the second insulating layer includes a second sublayer disposed in a second lower region of the first insulating layer.

8. The surface light emitting laser device according to claim 7, wherein a third length of the second sublayer is shorter than the second length of the first sublayer.

9. A light emitting laser device including the surface light emitting laser device according to claim 1.

10. A surface light emitting laser device comprising:
a substrate;
a first reflection layer disposed on the substrate;
an active layer disposed on the first reflection layer;
a second reflection layer disposed on the active layer and including an aperture region; and
an AlGa-based transition layer disposed between the active layer and the second reflection layer and having an Al composition graded,
wherein the aperture region includes a first insulating layer and a second insulating layer disposed on the first insulating layer,
wherein a length of the first insulating layer is longer than a length of the second insulating layer,
wherein the AlGa-based transition layer includes a first AlGa-based transition layer disposed in an upper first region of the first insulating layer and a second AlGa-based transition layer disposed below the first insulating layer,
wherein in the first AlGa-based transition layer, a composition of Al is graded in a first range of 0.12 to 0.80, and
wherein a composition of Al in the second AlGa-based transition layer is graded in a second range of 0.30 to 0.65.

11. The surface light emitting laser device according to claim 10, further comprising a third insulating layer disposed inward from an outside of the second reflection layer by a predetermined distance, and
a length of the second insulating layer is longer than that of the third insulating layer and shorter than a length of the first insulating layer.

12. A surface light emitting laser device comprising:
a first reflection layer;
an active layer on the first reflection layer;

an aperture region having a first insulating layer and an aperture and disposed on the active layer;
a second reflection layer on the aperture region;
an AlGa-based transition layer disposed between the active layer and the second reflection layer and having an Al composition graded; and
a second insulating layer disposed between the active layer and the second reflection layer,
wherein the second insulating layer extends from an end of the first insulating layer in the aperture direction and is disposed on the first insulating layer,
wherein the second insulating layer includes a first sublayer disposed on an upper surface of the first insulating layer, and a second sublayer disposed on a lower surface of the first insulating layer, such that the first insulating layer is positioned between the first sublayer and the second sublayer of the second insulating layer, and
wherein a second length of the first sublayer is shorter than a first length of the first insulating layer, and a third length of the second sublayer is shorter than the second length of the first sublayer.

13. The surface light emitting laser device according to claim 12, wherein the first sublayer is disposed in a second upper region of the first insulating layer.

14. The surface light emitting laser device according to claim 13, wherein the second sublayer is disposed in a second lower region of the first insulating layer.

* * * * *